(12) United States Patent
Takeishi et al.

(10) Patent No.: US 7,288,466 B2
(45) Date of Patent: Oct. 30, 2007

(54) PROCESSING METHOD, MANUFACTURING METHOD OF SEMICONDUCTOR DEVICE, AND PROCESSING APPARATUS

(75) Inventors: Tomoyuki Takeishi, Yokohama (JP); Kenji Kawano, Yokohama (JP); Hiroshi Ikegami, Hiratsuka (JP); Shinichi Ito, Yokohama (JP); Riichiro Takahashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/436,972

(22) Filed: May 14, 2003

(65) Prior Publication Data

US 2004/0043310 A1 Mar. 4, 2004

(30) Foreign Application Priority Data

May 14, 2002 (JP) ............................. 2002-139083
Sep. 20, 2002 (JP) ............................. 2002-275894

(51) Int. Cl.
*H01L 21/46* (2006.01)
(52) U.S. Cl. ...................... 438/463; 438/669; 438/676
(58) Field of Classification Search ................ 438/463, 438/618–681
See application file for complete search history.

(56) References Cited

U.S. PATENT DOCUMENTS

| | | | |
|---|---|---|---|
| 5,281,798 A * | 1/1994 | Hamm et al. ................ | 250/205 |
| 5,405,810 A | 4/1995 | Mizuno et al. | |
| 5,669,979 A * | 9/1997 | Elliott et al. .................... | 134/1 |
| 5,958,268 A | 9/1999 | Engelsberg et al. | |
| 6,113,733 A | 9/2000 | Eriguchi et al. | |
| 6,162,745 A | 12/2000 | Ito et al. | |
| 6,231,917 B1 | 5/2001 | Ito et al. | |
| 6,407,360 B1 * | 6/2002 | Choo et al. ............. | 219/121.67 |
| 6,407,560 B1 * | 6/2002 | Walraven et al. ........... | 324/752 |
| 6,475,285 B2 | 11/2002 | Ikegami et al. | |
| 6,562,698 B2 * | 5/2003 | Manor ......................... | 438/460 |
| 2001/0045690 A1 * | 11/2001 | Brandinger ................. | 264/400 |

FOREIGN PATENT DOCUMENTS

| | | |
|---|---|---|
| JP | 3-62831 | 3/1991 |
| JP | 3-146905 | 6/1991 |
| JP | 3-254111 | 11/1991 |
| JP | 4-354321 | 12/1992 |

(Continued)

OTHER PUBLICATIONS

Ito, S. et al., "Manufacturing System in Electronic Devices", U.S. Appl. No. 10/092,486, filed Mar. 2002.
Ikegami, H. et al., "Apparatus and Method for Laser Beam Machining, and Method for Manufacturing Semiconductor Devices Using Laser Beam Machining", U.S. Appl. No. 09/983,683, filed Oct. 25, 2001.

(Continued)

*Primary Examiner*—H. Jey Tsai
(74) *Attorney, Agent, or Firm*—Finnegan Henderson Farabow Garrett & Dunner LLP

(57) ABSTRACT

A processing method for selectively reducing or removing the region to be exposed with energy ray in a film formed on a substrate, comprising relatively scanning a first exposure light whose shape on the substrate is smaller than the whole first region to be exposed against the whole first region to be exposed to selectively remove or reduce the first region to be exposed, and exposing a whole second region to be exposed inside the whole first region to be exposed with a second exposure light to selectively expose the whole second region to be exposed.

22 Claims, 55 Drawing Sheets

FOREIGN PATENT DOCUMENTS

| | | |
|---|---|---|
| JP | 07-077188 | 3/1995 |
| JP | 8-10970 | 1/1996 |
| JP | 9-141484 | 6/1997 |
| JP | 09-205092 | 8/1997 |
| JP | 10-113779 | 5/1998 |
| JP | 11-260799 | 9/1999 |
| JP | 11-277273 | 10/1999 |
| JP | 2000-301367 | 10/2000 |
| JP | 2000-343261 | 12/2000 |
| JP | 2001-015407 | 1/2001 |
| JP | 2001-196431 | 7/2001 |
| TW | 270984 | 2/1996 |
| TW | 442885 | 6/2001 |
| WO | WO 02/34455 A1 | 5/2002 |

OTHER PUBLICATIONS

Ito, S. et al., "Method for Manufacturing a Semiconductor Device and Apparatus for Manufacturing a Semiconductor Device", U.S. Appl. No. 10/377,597, filed Mar. 4, 2003.

Patent Abstracts of Japan—Abstract for publication No. 62-252136, published Nov. 2, 1987 and corresponding to Japanese application No. 61-095511, filed Apr. 24, 1986.

Taiwanese Patent Office Action, entitled "Notification of Reasons for Rejection in the First Examination," mailed by the Taiwanese Patent Office on Sep. 21, 2005 in a counterpart Taiwanese application.

Japanese Patent Office Action, entitled "Notification of Reasons for Rejection," mailed by the Japanese Patent Office on May 9, 2006 in a counterpart Japanese application.

Japanese Patent Office Action mailed by the Japanese Patent Office Oct. 17, 2006 for counterpart Japanese Application No. 2002-139083.

* cited by examiner

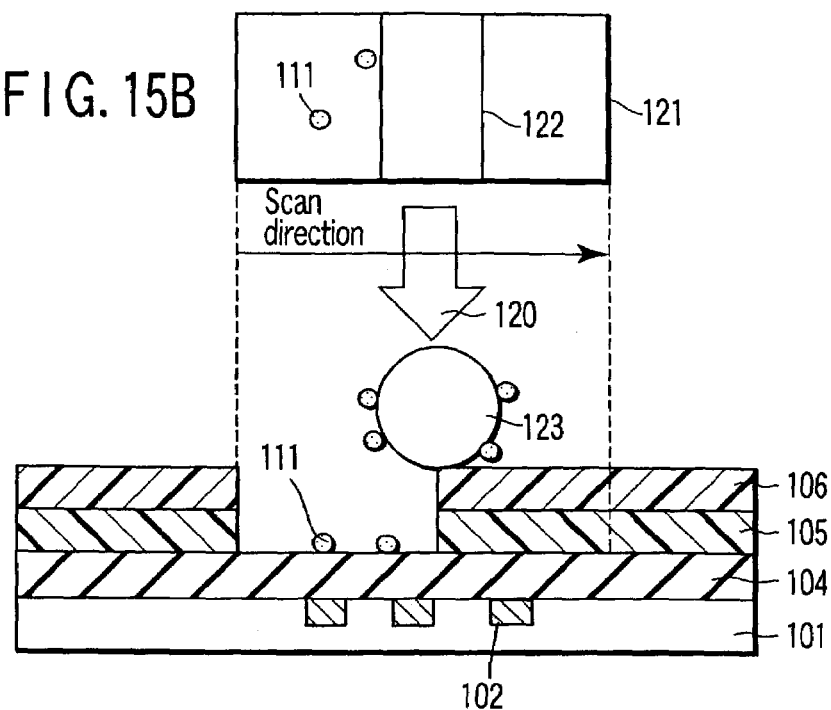
FIG. 15B
FIG. 15A
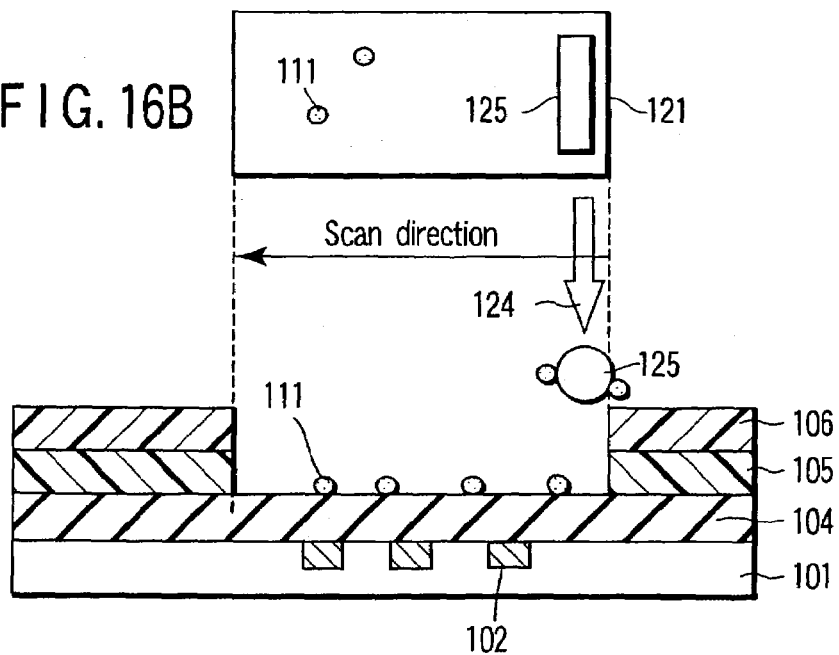
FIG. 16B
FIG. 16A

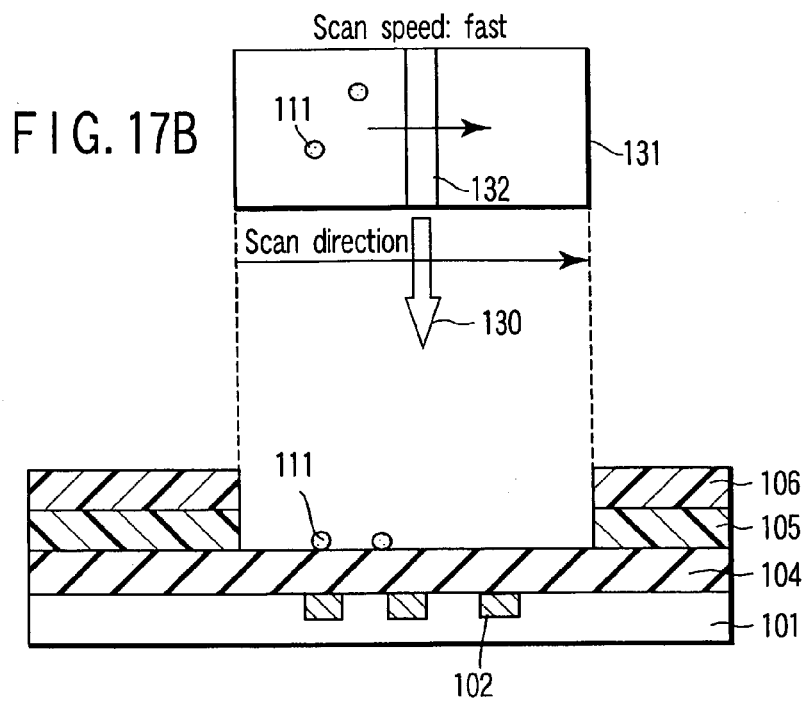
FIG. 17B
FIG. 17A
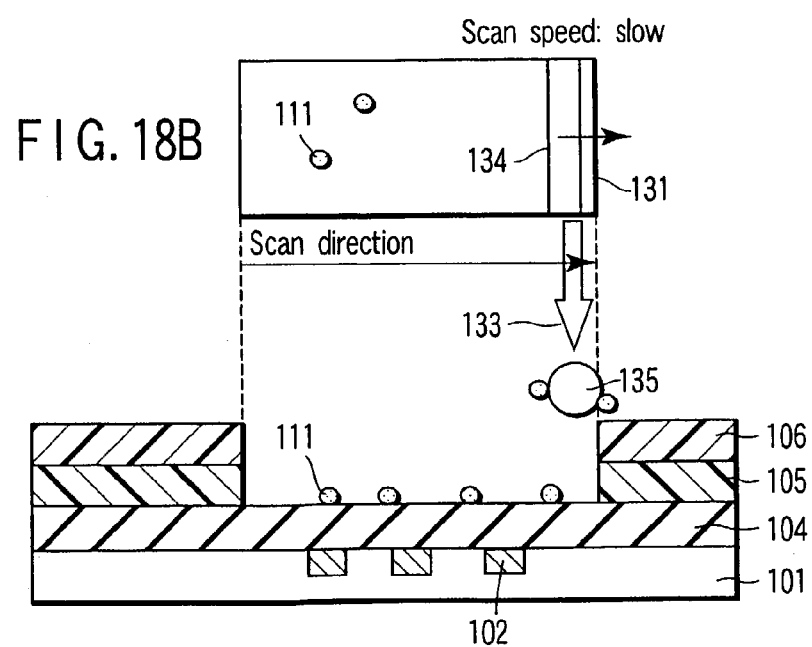
FIG. 18B
FIG. 18A

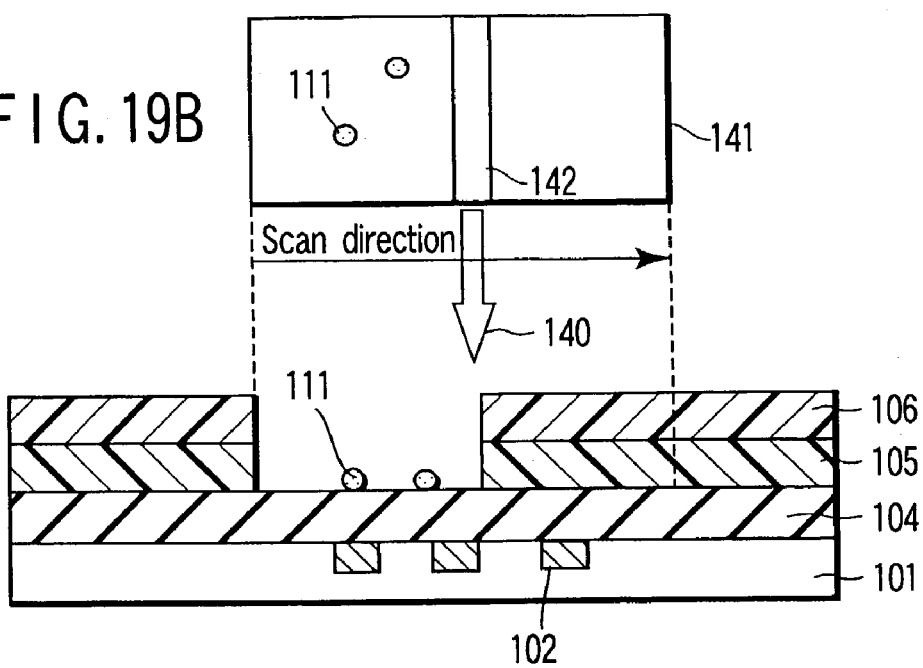
FIG. 19B
FIG. 19A
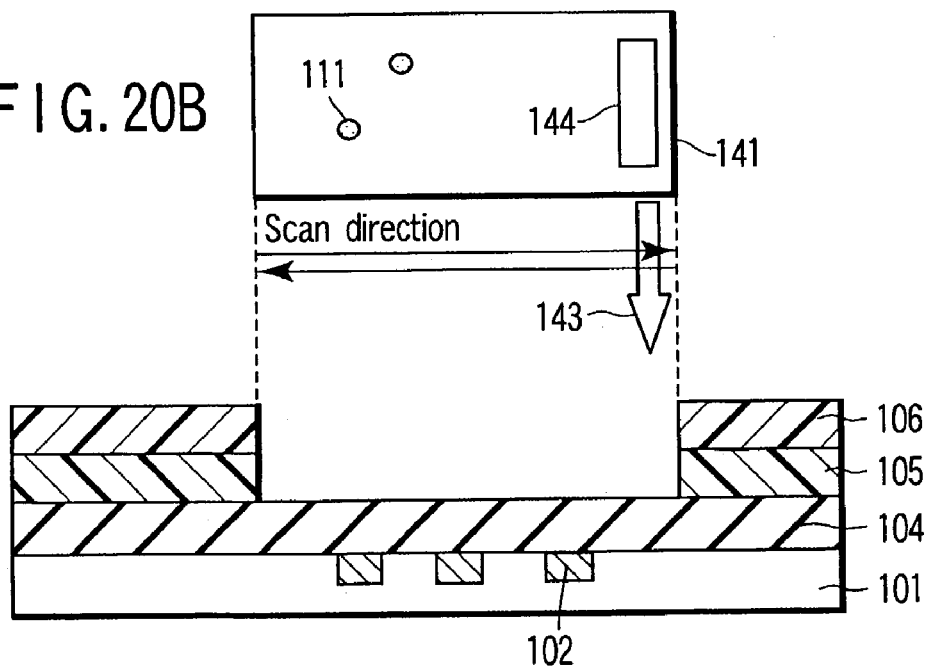
FIG. 20B
FIG. 20A

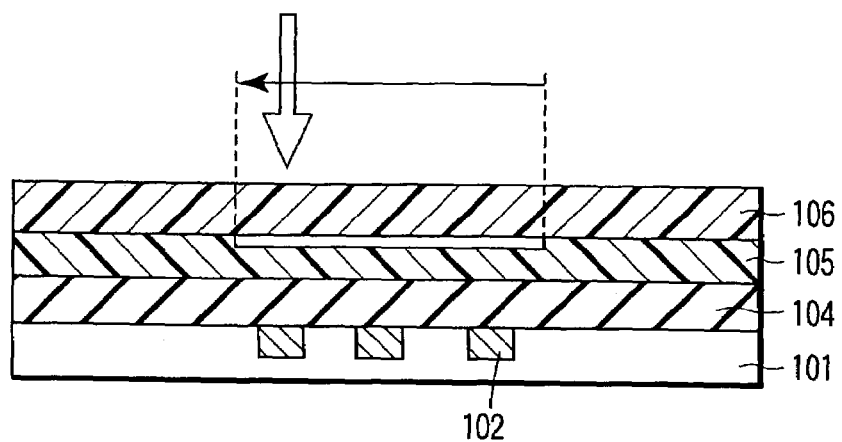
F I G. 32A
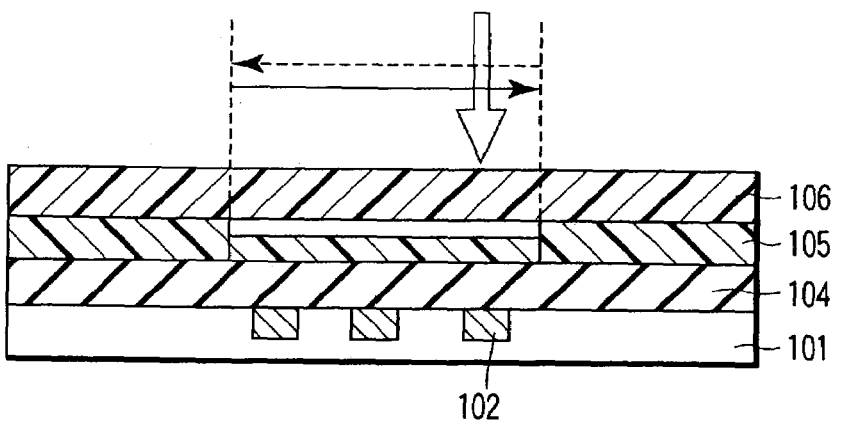
F I G. 32B
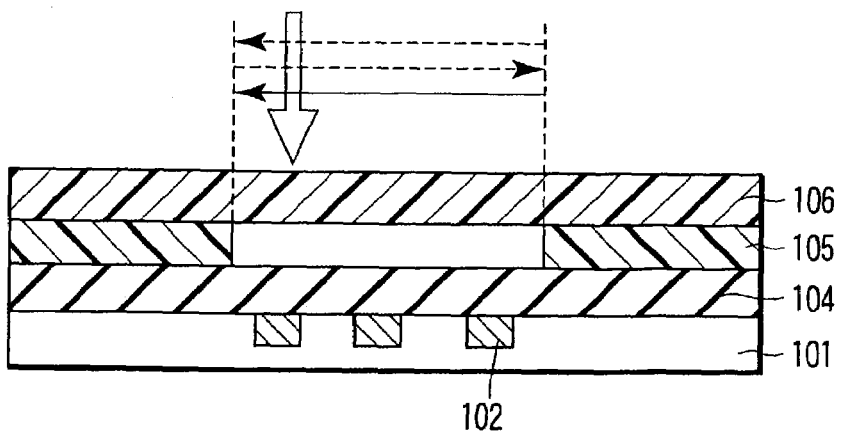
F I G. 32C

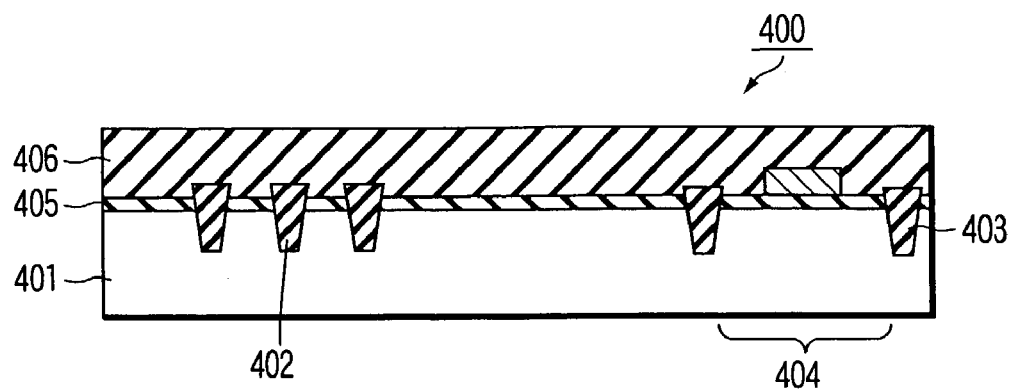
F I G. 34A
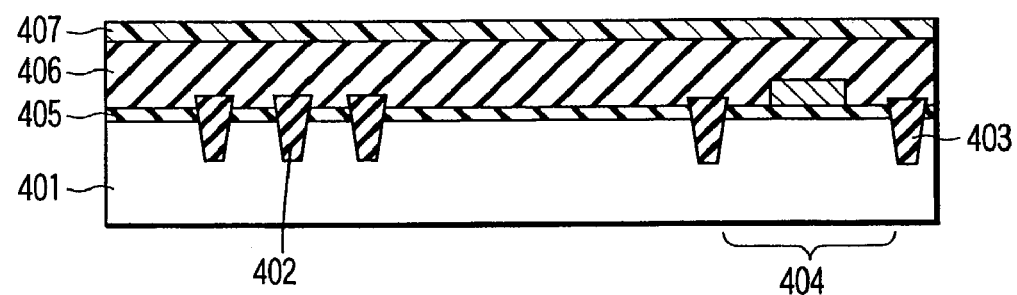
F I G. 34B
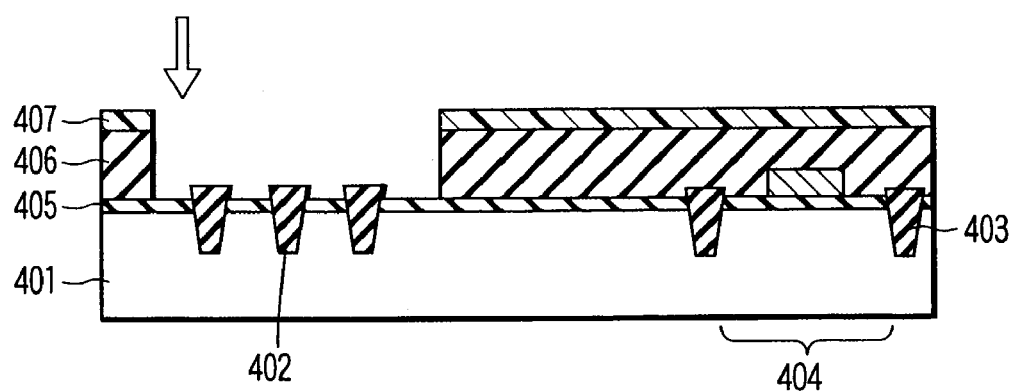
F I G. 34C

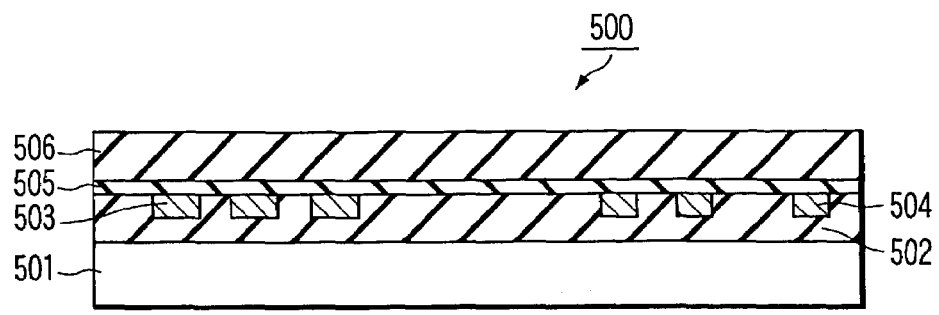
F I G. 35A
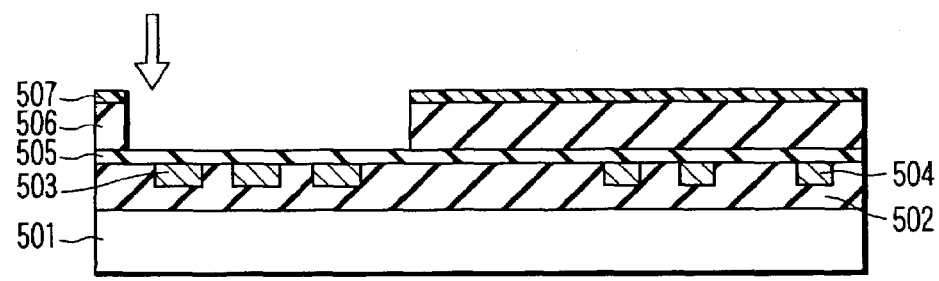
F I G. 35B
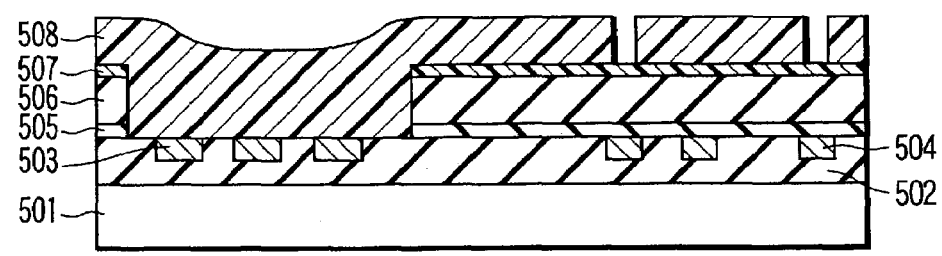
F I G. 35C
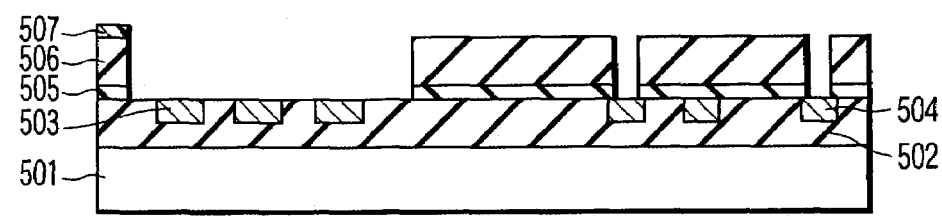
F I G. 35D

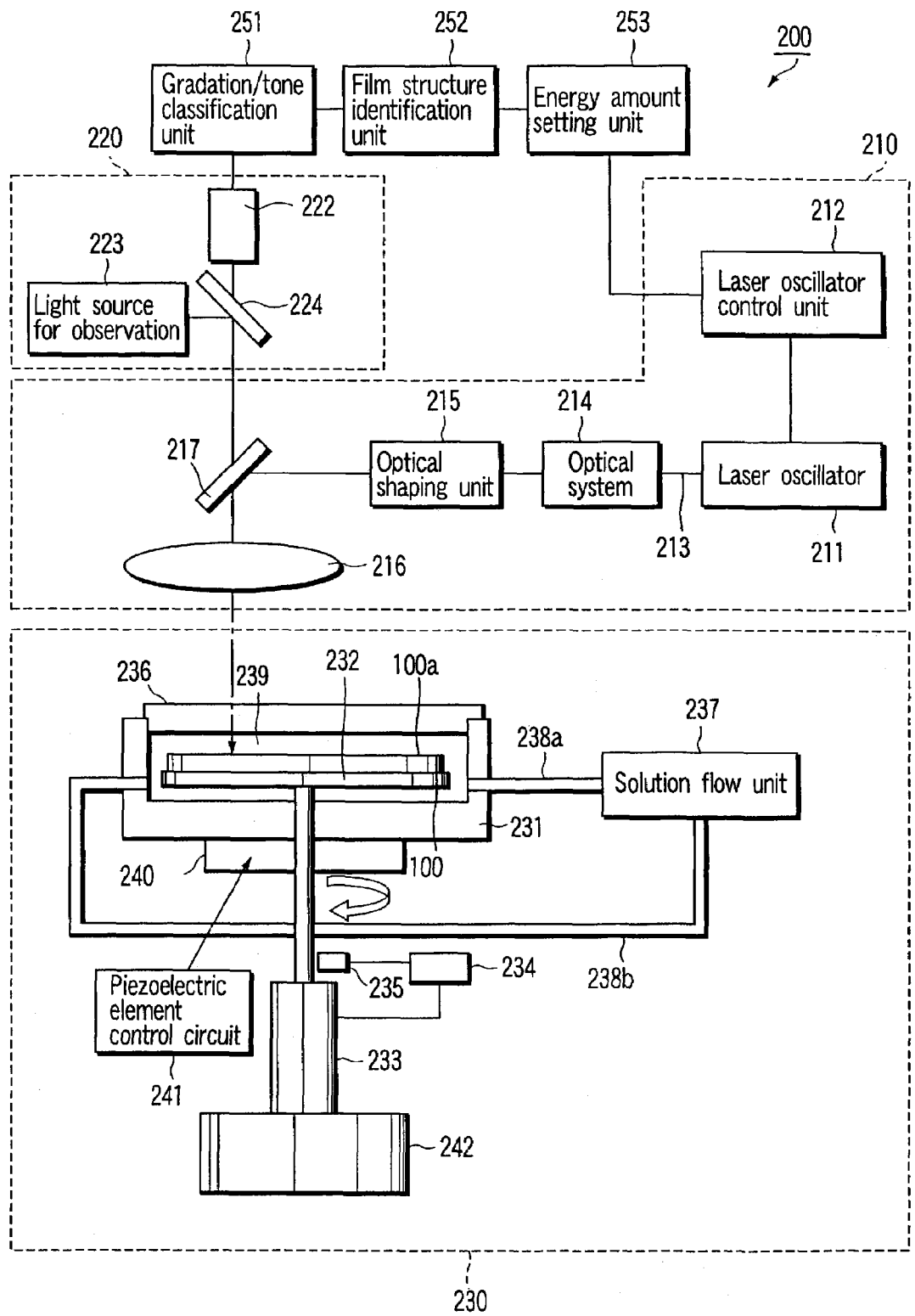
F I G. 47

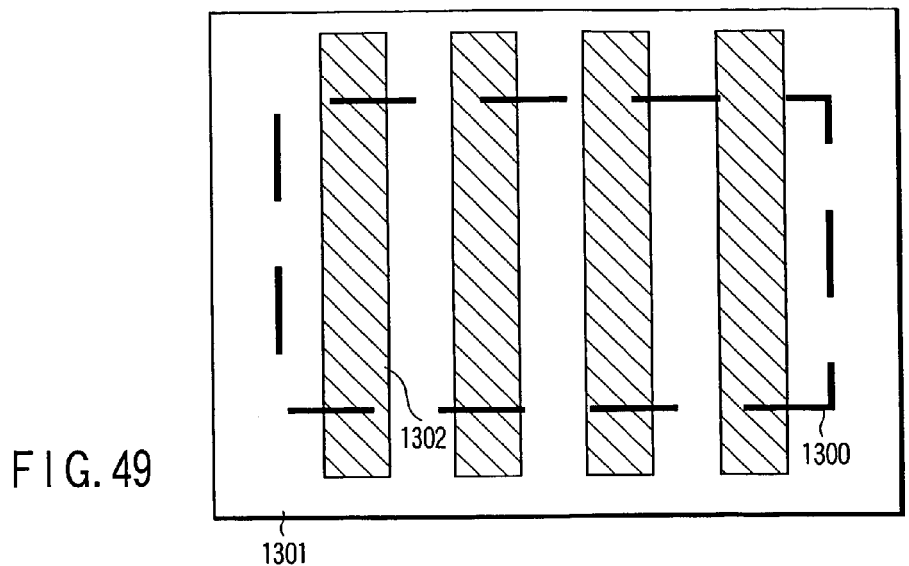
FIG. 49
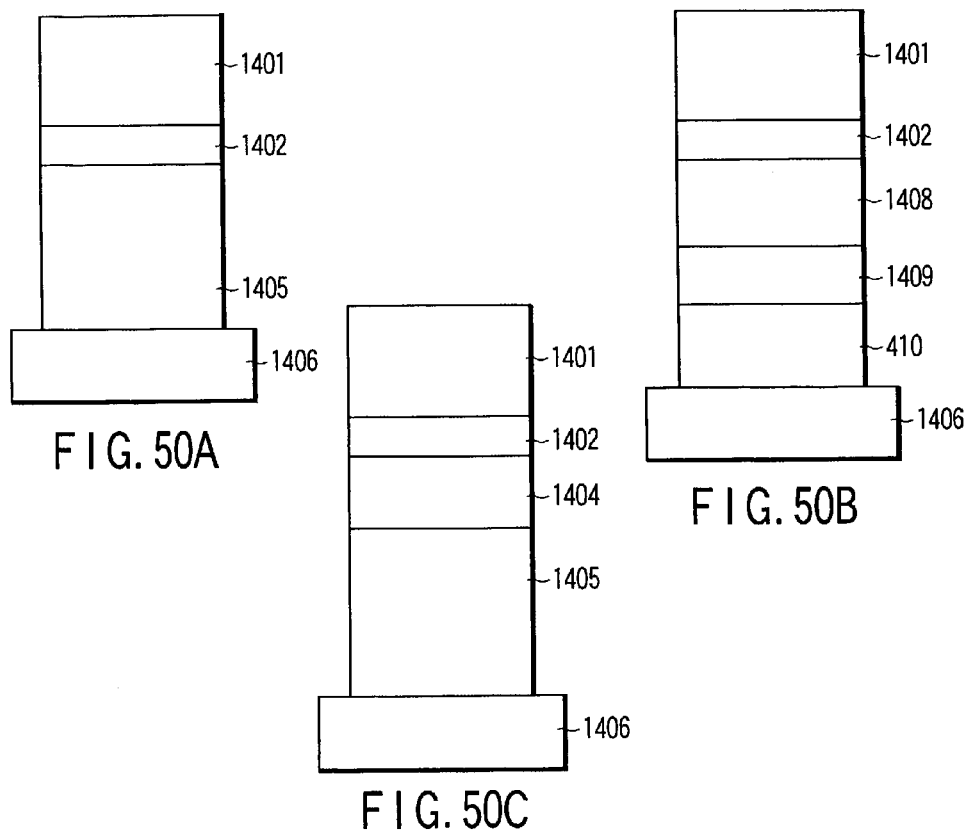
FIG. 50A
FIG. 50B
FIG. 50C

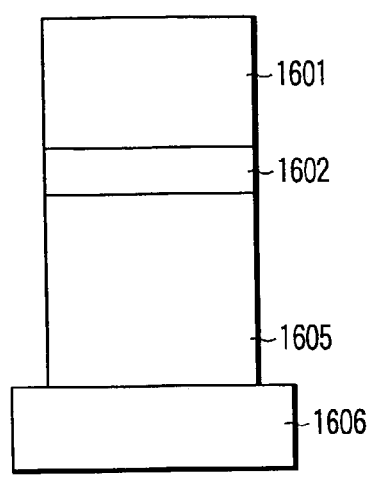
FIG. 57A
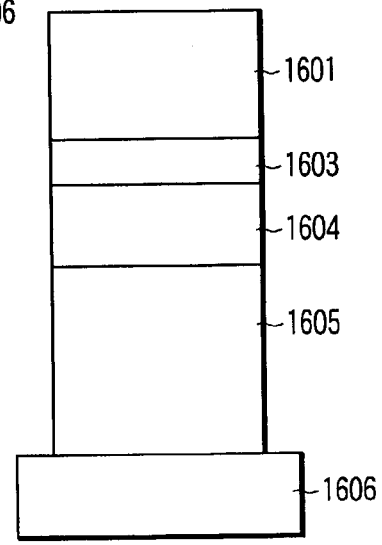
FIG. 57C
FIG. 57B
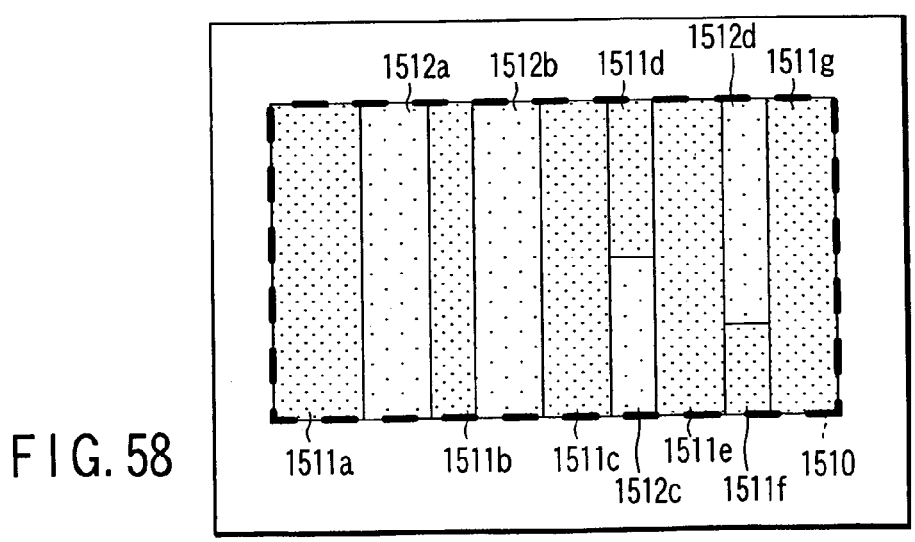
FIG. 58

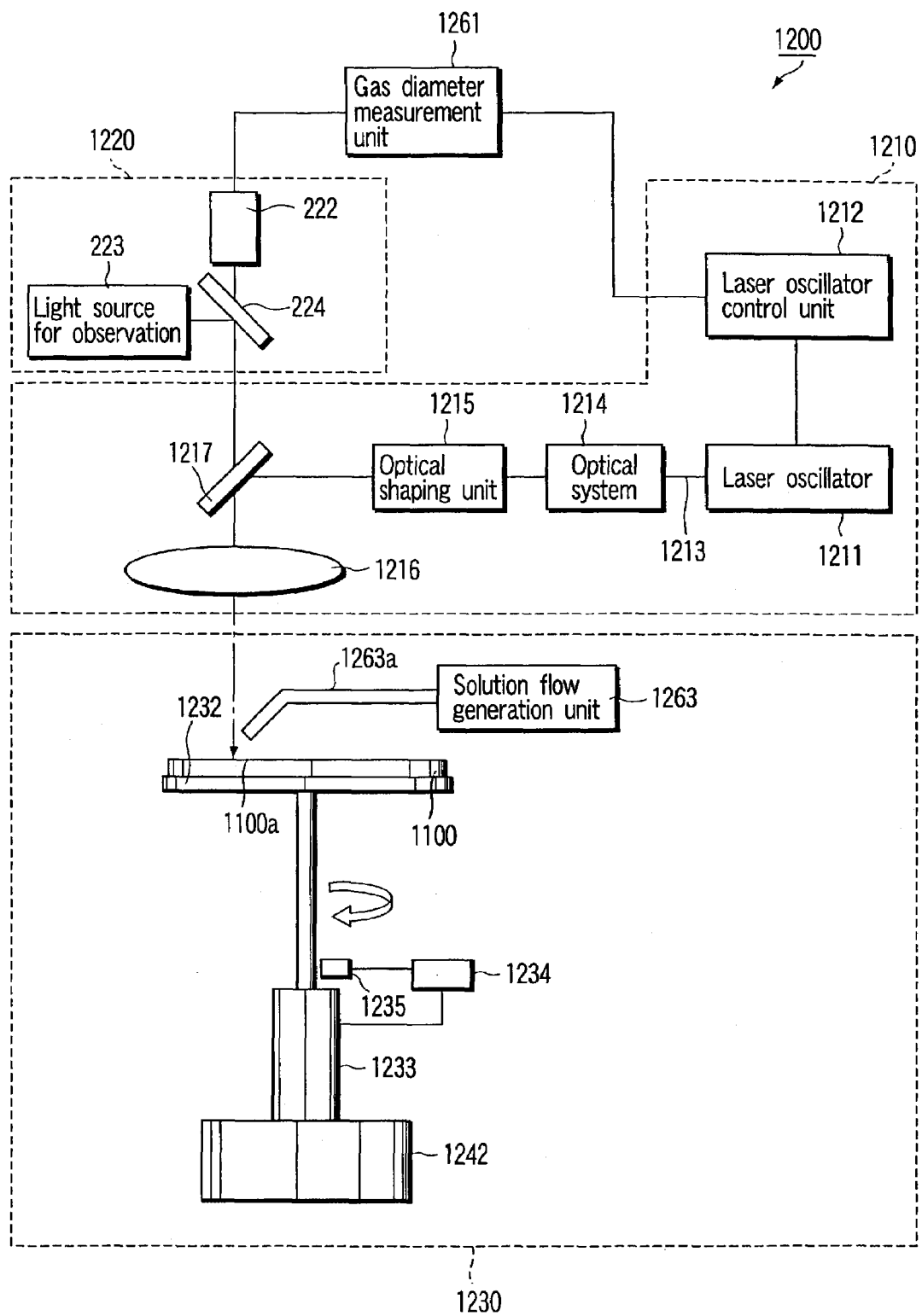
F I G. 59

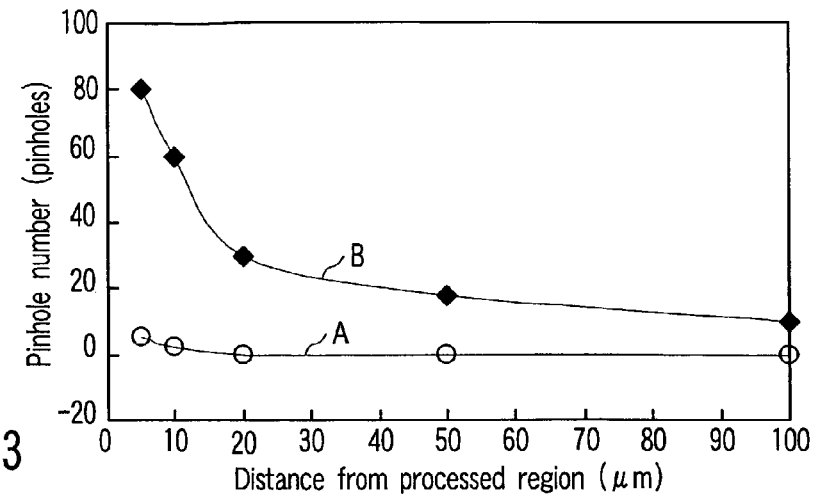
FIG. 63
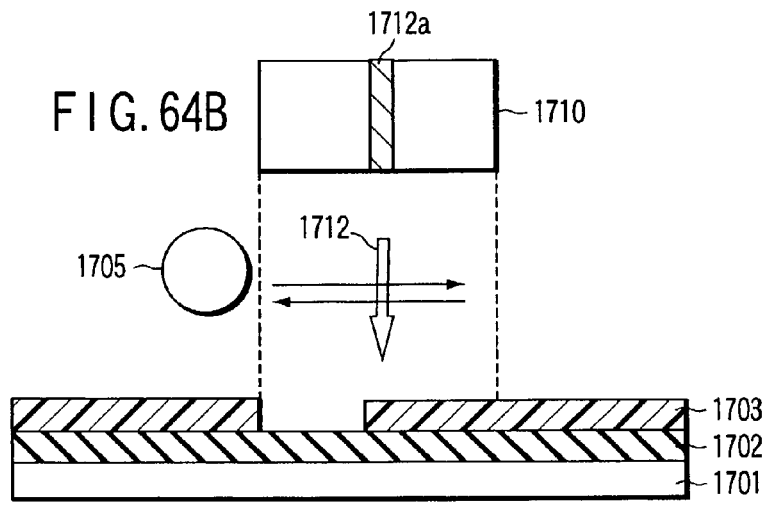
FIG. 64B
FIG. 64A
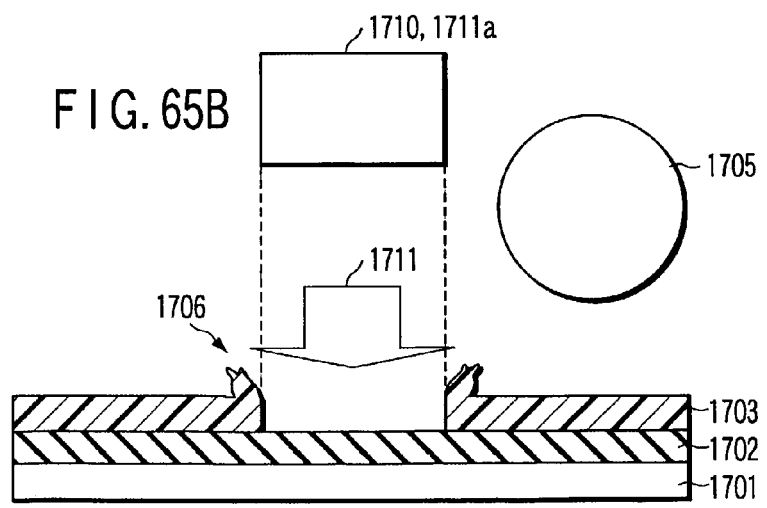
FIG. 65B
FIG. 65A

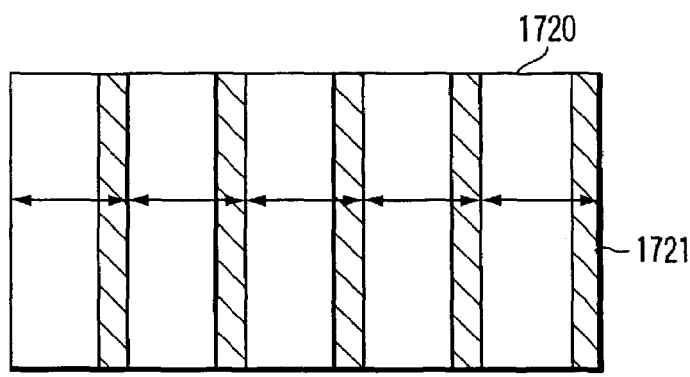
F I G. 66A
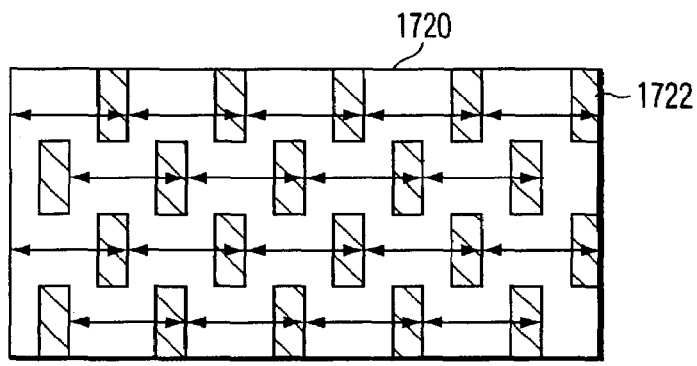
F I G. 66B
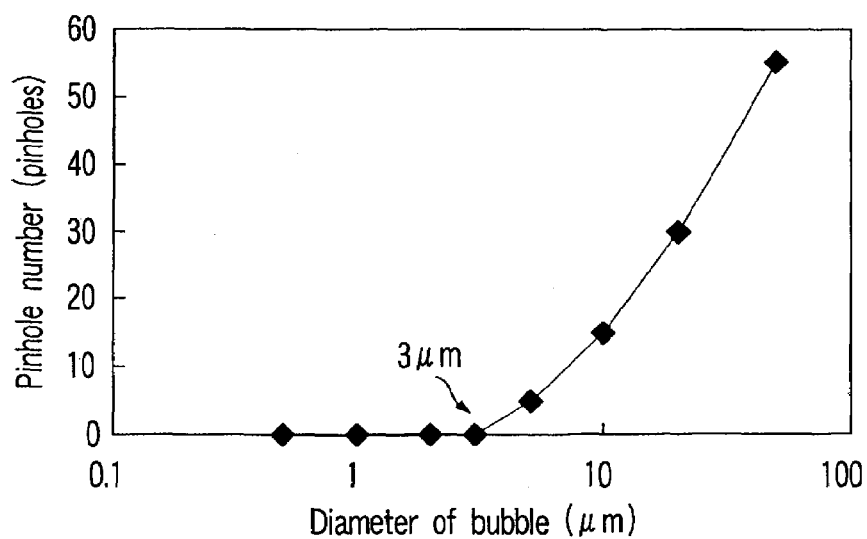
F I G. 67

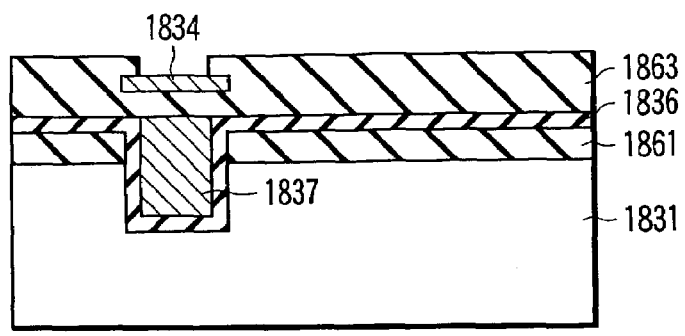
F I G. 79E
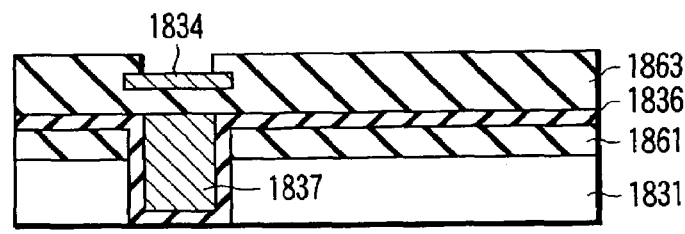
F I G. 79F
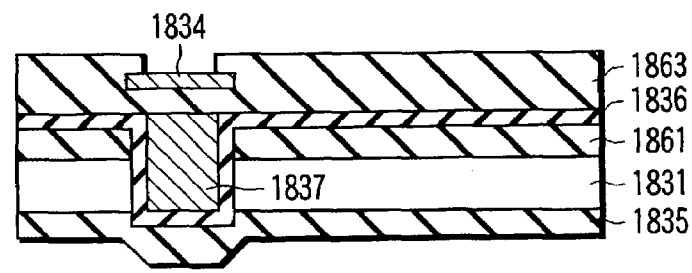
F I G. 79G
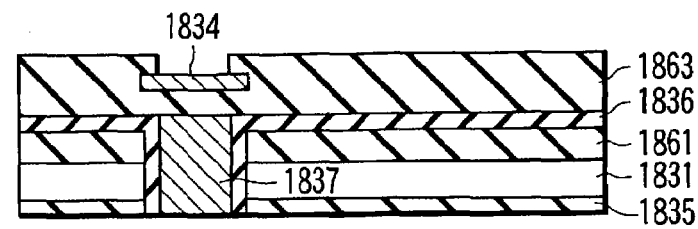
F I G. 79H

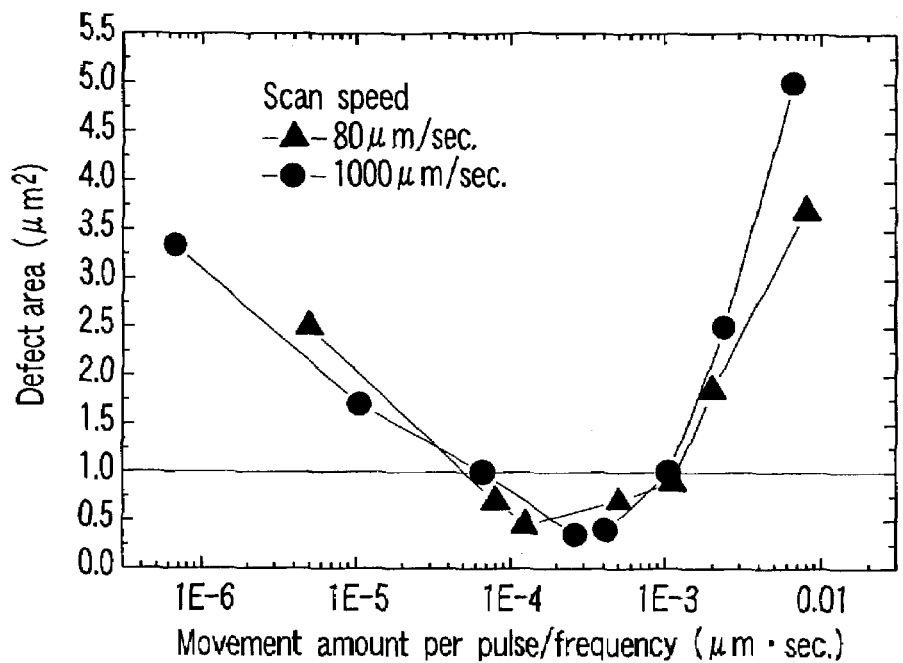
F I G. 81
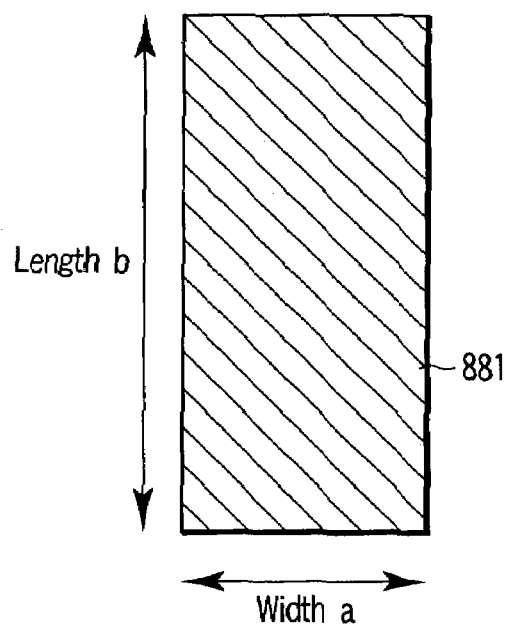
F I G. 82

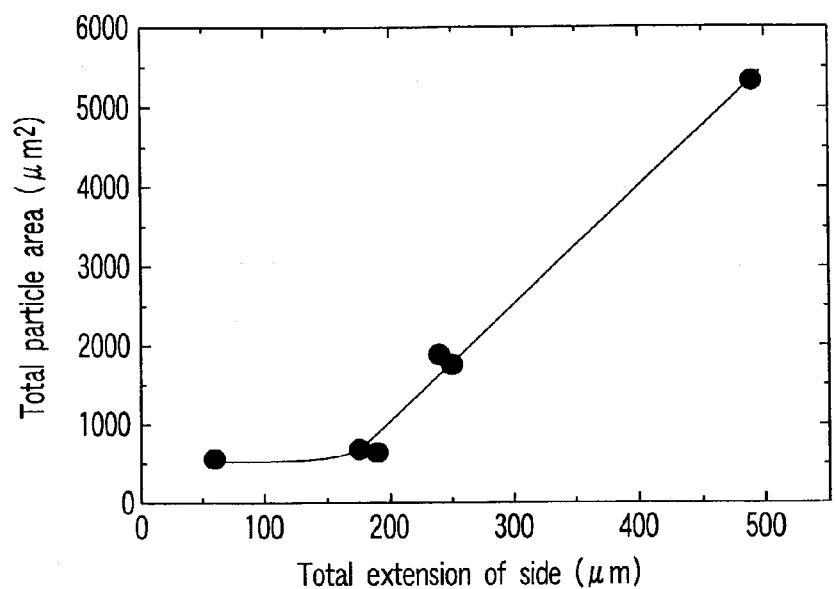
F I G. 83
 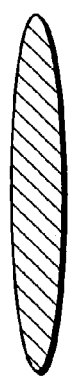 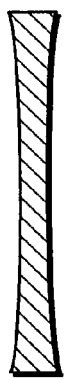 
F I G. 84A    F I G. 84B    F I G. 84C    F I G. 84D

PROCESSING METHOD, MANUFACTURING METHOD OF SEMICONDUCTOR DEVICE, AND PROCESSING APPARATUS

CROSS-REFERENCE TO RELATED APPLICATIONS

This application is based upon and claims the benefit of priority from the prior Japanese Patent Applications No. 2002-139083, filed May 14, 2002; and No. 2002-275894, filed Sep. 20, 2002, the entire contents of both of which are incorporated herein by reference.

BACKGROUND OF THE INVENTION

1. Field of the Invention

The present invention relates to a processing method for selectively processing a film to be exposed formed on a substrate, manufacturing method of a semiconductor device, and processing apparatus.

2. Description of the Related Art

In general, with advance of semiconductor element miniaturization, it has become essential to enhance precision of an alignment technique with a lower layer in a lithography process. To align a pattern already formed on a substrate with a pattern to be exposed at exposing latent image, an exclusive scope for detecting an alignment mark position has heretofore been used. However, since an offset surely exists between the exclusive scope for alignment and exposure axis in this method, a deviation is generated between the alignment scope and exposure axis because of an influence of thermal drift, and an alignment deviation of the alignment mark position is generated. Therefore, with the advance of the miniaturization of a semiconductor, a problem has occurred that magnitude of the alignment deviation of the alignment position largely influences yield of a chip.

To improve this, an exposure-through-the-reticle (ETTR) method of detecting alignment mark and exposing pattern along the same axis is considered as a promising alignment technique of the next generation. In the ETTR method, high-precision alignment can be realized. On the other hand, since light source with same wavelength of a DUV region as that of the exposure is used, light absorption is large in an anti-reflection film formed below a resist layer. A problem occurs that position information cannot be detected from the alignment mark in the anti-reflection film lower layer. Similarly, when the films formed on the alignment mark such as an organic insulating film and interlayer insulating film of SiN or SiC is opaque to an exposure light, position information of the alignment mark cannot be detected. Moreover, even when the alignment by ETTR is not performed, and even when contrast of an alignment light is weak, position information of alignment cannot be detected.

To solve the problem, there has been proposed a method of selectively remove the opaque film formed on the alignment mark with laser ablation before an alignment step. However, this method has a problem that particles generated at a laser ablation sticks to a device pattern region, which forms a critical defect.

BRIEF SUMMARY OF THE INVENTION (1) According to one aspect of the present invention, there is provided a processing method for selectively removing or reducing a region to be processed of a film formed on a substrate, comprising: relatively scanning a first exposing light whose exposure region on the substrate is smaller than the whole first region to be exposed against the substrate to selectively process the whole first region to be processed of the film; and exposing a second region to be exposed inside the first region to be exposed with a second exposing light to selectively process the whole second region to be exposed.

(2) According to one aspect of the present invention, there is provided a manufacturing method of a semiconductor device, comprising:

preparing a substrate material in which an alignment mark is formed in or on a semiconductor substrate;

forming an anti-reflection film and resist film on the substrate material;

relatively scanning a first exposing light against the whole first region to be exposed on the substrate to selectively remove or reduce the anti-reflection film of a first region to be exposed including a region above which the alignment mark is formed;

exposing a second region to be exposed inside the whole first region to be exposed with a second exposing light to selectively remove or reduce the whole second region to be exposed of the anti-reflection film;

processing the anti-reflection film and subsequently transferring the substrate material to an exposure apparatus;

using the alignment mark in the exposure apparatus to perform alignment adjustment;

forming a latent image of a semiconductor circuit on the resist film after the alignment adjustment;

developing the resist film in which the latent image is formed to form a resist pattern; and using the resist pattern to process the substrate material.

(3) According to one aspect of the present invention, there is provided a processing method for exposing each processing unit with an energy ray to selectively remove or reduce a whole region to be exposed of a film formed on a substrate, comprising:

exposing the processing unit of the substrate with the energy ray;

observing a gas member generated by exposure of the energy ray in an optical path of the energy ray;

measuring a size of the gas member; and exposing the film to be exposed with the next energy ray, when the size of the gas member is smaller than a defined value.

(4) According to one aspect of the present invention, there is provided a processing method for exposing a whole region to be exposed of a substrate with an energy ray to selectively remove or reduce the whole region to be exposed, comprising:

passing a solution through the whole region to be exposed at a flow velocity V (μm/sec);

exposing whole the region to be exposed through which the solution flows with the energy ray having an oscillation frequency Z (1/sec) and a width W (μm) of a direction in which the solution flows; and controlling the flow velocity V, width W, and oscillation frequency Z so as to satisfy the following relation:

$$V \geq 6 \times \sqrt{\frac{W}{2}} \times Z.$$

(5) According to one aspect of the present invention, there is provided a processing method for selectively removing or reducing a whole region to be exposed of an organic film formed on a substrate, comprising:

exposing he whole region to be exposed with an energy ray whose the exposure region on the substrate is smaller than the whole region to be exposed on conditions of an oscillation frequency f (1/sec) and energy density per pulse, on which the organic film can be removed; and relatively scanning an exposure region of the energy ray against the whole region to be exposed on the substrate at a speed v (μm/sec), wherein the oscillation frequency f and speed v satisfy the following relation:

$$6.0 \times 10^{-5} \leq \frac{v}{f^2} \leq 1.0 \times 10^{-3}.$$

(6) According to one aspect of the present invention, there is provided a processing apparatus for selectively removing or reducing a whole region to be exposed of a film formed on a substrate, comprising:

a substrate hold portion which holds the substrate;

a ray source which generates an energy ray to selectively reduce or remove a part of the film to be exposed;

a shaping portion which is disposed on an optical axis of the energy ray and which shapes the energy ray generated by the ray source;

a scan portion which relatively scans the energy ray shaped by the shaping against the whole region to be exposed on the substrate; and a solution supply portion which changes a flow direction of a solution in accordance with a scan direction of the energy ray by the scan portion to continuously supply the solution to the surface of the whole region to be exposed on the substrate.

(7) According to one aspect of the present invention, there is provided a processing apparatus for selectively reducing or removing a whole region to be exposed of a film formed on a substrate, comprising:

a substrate hold portion which holds the substrate;

a ray source which generates an energy ray to selectively reduce or remove a part of the film to be processed;

a shaping portion which is disposed on an optical axis of the energy ray and which shapes the energy ray generated by the ray source and which emits energy rays having a irradiation shape on the substrate arranged by designed period; and a scan portion which relatively scans the energy rays against the whole region to be exposed on the substrate in the designed period or less.

(8) According to one aspect of the present invention, there is provided a processing apparatus comprising:

a hold portion which holds a substrate;

an irradiation portion which generates an energy ray to reduce or remove a part of a film to be exposed of the substrate;

an observation/measurement portion which observes a gas member generated by abrasion of the film to be exposed by exposure of the energy ray on an optical path of the energy ray; and a control portion which controls an exposure timing of the energy ray emitted from the exposure portion in accordance with an observation/measurement result of the observation/measurement portion.

(9) According to one aspect of the present invention, there is provided a processing apparatus for selectively reducing or removing a whole region to be exposed of a film formed on a substrate, comprising:

a hold portion which holds the substrate;

an exposure portion which exposures each processing unit set in the region to be exposed with an energy ray having an oscillation frequency Z (1/sec) and width W (μm) of one direction of an exposure region in the film to be exposed;

a supply portion which supplies a solution onto the region to be exposed of the film in one direction at a flow velocity V; and a control portion which controls any one of the oscillation frequency Z, width W, and flow velocity V so as to satisfy the following relation:

$$V \geq 6 \times \sqrt{\frac{W}{2}} \times Z.$$

(10) According to one aspect of the present invention, there is provided a processing apparatus for selectively processing a whole region to be exposed of an organic film formed on a substrate, comprising:

a hold portion which holds the substrate;

an exposure portion which exposures the substrate with an energy ray whose exposure region on the substrate is smaller than the whole region to be exposed at an oscillation frequency f (1/sec) and energy density per pulse so that the organic film can be removed;

a scan portion which relatively scans an exposure region of the energy ray against the whole region to be exposed on the substrate at a speed v (μm/sec); and a control portion to control at least one of the irradiation portion and scan portion so that the oscillation frequency f and speed v satisfy the following relation:

$$6.0 \times 10^{-5} \leq \frac{v}{f^2} \leq 1.0 \times 10^{-3}.$$

(11) According to one aspect of the present invention, there is provided a processing method comprising:

forming a first film on a substrate;

forming a second film on the first film;

selectively exposing the substrate with a first energy ray; and maintaining at least a part of an irradiation of the first energy ray of the second film while reducing or removing the first film, wherein the reducing or removing of the first film comprises: vaporizing the first film; or changing a transmittance.

(12) According to one aspect of the present invention, there is provided a manufacturing method of a semiconductor device, comprising:

preparing a substrate material in which an alignment mark is formed in or on a semiconductor substrate;

forming an anti-reflection film on the substrate material;

forming a resist film on the anti-reflection film;

selectively exposing the resist film of a region to be exposed including a region above which the alignment mark is formed with an energy ray;

maintaining at least a part of the resist film of the region to be exposed while reducing or removing the anti-reflection film;

transferring the substrate material to an exposure apparatus after processing the anti-reflection film;

using the alignment mark to perform alignment adjustment;

forming a latent image of a semiconductor circuit on the resist film after the alignment adjustment; and developing the resist film to form a resist pattern, wherein the processing of the anti-reflection film comprises: vaporizing the anti-reflection film; or changing a transmittance.

(13) According to one aspect of the present invention, there is provided a manufacturing method of a semiconductor device, comprising:

preparing a substrate material in which an alignment mark is formed in or on a semiconductor substrate;

forming an anti-reflection film and intermediate film on the substrate material;

selectively exposing the intermediate film of a whole region to be exposed including a region above which the alignment mark is formed with an energy ray;

maintaining at least a part of the intermediate film of the whole region to be exposed while reducing or removing the anti-reflection film;

forming a resist film on the intermediate film after reducing or removing the anti-reflection film;

transferring the substrate material in which the resist film is formed to an exposure apparatus;

using the alignment mark in the exposure apparatus to perform alignment adjustment;

forming a latent image of a semiconductor circuit on the resist film after the alignment adjustment; and developing the resist film in which the latent image is formed to form a resist pattern; and using the resist pattern to process the substrate material, wherein the processing of the anti-reflection film comprises: vaporizing the anti-reflection film; or changing a transmittance.

(14) According to one aspect of the present invention, there is provided a processing method for exposing each processing unit with an energy ray to selectively reduce or remove a whole region to be exposed of a film formed on a substrate, comprising:

obtaining an intensity distribution of a reflected light from the substrate;

determining an energy amount of the energy ray with which each processing unit is irradiated from the intensity distribution of the reflected light; and successively exposing the respective processing units with the energy ray based on the determined energy amount.

(15) According to one aspect of the present invention, there is provided a processing method for exposing each processing unit with an energy ray to selectively remove or reduce a whole region to be exposed of a film formed on a substrate, comprising:

obtaining an intensity distribution of a reflected light from the substrate;

classifying the intensity distribution of the reflected light for each region having an equal reflected light intensity;

setting the processing unit in accordance with the classified region;

determining an energy amount of the energy ray with which each processing unit is exposed in accordance with the reflected light intensity; and successively exposing each processing unit with the energy ray based on the determined energy amount.

(16) According to one aspect of the present invention, there is provided a processing apparatus for selectively removing or reducing a whole region to be exposed of a film formed on a substrate, comprising:

a hold portion which holds the substrate;

an exposure portion which exposure each processing unit set in the region to be exposed with an energy ray;

a detection portion which exposes each processing unit with an observation light to detect a reflected light intensity from the processing unit;

a setting portion to set an energy amount of the energy ray with which each processing unit is exposed in accordance with the detected reflected light intensity; and a control portion to control the energy amount of the energy ray with which each processing unit is exposed from the exposure portion in accordance with the energy amount set by the setting portion.

BRIEF DESCRIPTION OF THE SEVERAL VIEWS OF THE DRAWING

FIGS. 15A and 15B are diagrams showing the manufacturing steps of the semiconductor device according to a second embodiment;

FIGS. 16A and 16B are diagrams showing the manufacturing steps of the semiconductor device according to the second embodiment;

FIGS. 17A and 17B are diagrams showing the manufacturing steps of the semiconductor device according to a third embodiment;

FIGS. 18A and 18B are diagrams showing the manufacturing steps of the semiconductor device according to the third embodiment;

FIGS. 19A and 19B are diagrams showing the manufacturing steps of the semiconductor device according to a fourth embodiment;

FIGS. 20A and 20B are diagrams showing the manufacturing steps of the semiconductor device according to the fourth embodiment;

FIGS. 32A to 32C are sectional views showing the manufacturing steps of the semiconductor device according to the twelfth embodiment;

FIGS. 34A to 34F are sectional views showing the manufacturing steps of the semiconductor device according to a 14th embodiment;

FIGS. 35A to 35D are sectional views showing the manufacturing steps of the semiconductor device according to a 15th embodiment;

FIG. 47 is a diagram showing a constitution of a laser processing apparatus according to a 23rd embodiment;

FIG. 49 is a diagram showing an example of an image obtained from a CCD camera of a laser processing apparatus;

FIGS. 50A to 50C are sectional views showing an example of a film structure according to the 23rd embodiment;

FIGS. 57A to 57C are sectional views showing an example of the film structure according to the 25th embodiment;

FIG. 58 is a diagram showing the setting of the energy amount in each irradiation region in the processing method according to the 25th embodiment;

FIG. 59 is a diagram showing the constitution of the laser processing apparatus according to a 26th embodiment;

FIG. 63 is a diagram showing a relation between a distance from a processed region and the number of pinholes in a case in which the processing is performed in consideration of the bubbles;

FIGS. 64A and 64B are diagrams showing an irradiation region shape of the laser beam in the optical processing according to the 27th embodiment;

FIGS. 65A and 65B are diagrams showing the irradiation region shape of the laser beam in collective processing;

FIGS. 66A and 66B are diagrams showing the irradiation region shape of the laser beam in the optical processing according to the 27th embodiment;

FIG. 67 is a diagram showing a relation between a diameter of the bubble and the number of pinholes;

FIGS. 79A to 79H are sectional views showing the manufacturing steps of the semiconductor device according to the 36th embodiment;

FIG. 81 is a diagram showing a total defect area in the processed region after formation of the processed region with respect to $v/f^2$;

FIG. 82 is a plan view showing the shape of the irradiation region on the substrate according to a 38th embodiment;

FIG. 83 is a characteristic diagram showing a total particle area with respect to total extension of a side according to the 38th embodiment; and FIGS. 84A to 84D are diagrams showing a modification example of the irradiation region according to the 38th embodiment.

DETAILED DESCRIPTION OF THE INVENTION

Embodiments of the present invention will be described hereinafter with reference to the drawings.

First Embodiment

Figure 1A:
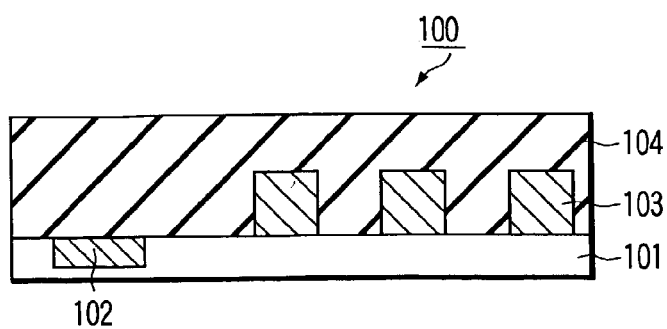
FIGS. 1A to 1G are sectional views showing manufacturing steps of a semiconductor device according to a first embodiment.

FIGS. 1A to 1G are sectional views showing manufacturing steps of a semiconductor device according to a first embodiment of the present invention. As shown in FIG. 1A, a substrate 100 is prepared. For the substrate 100, an alignment mark 102 is buried/formed in a semiconductor substrate 101 of Si. An interlayer insulating film 104 is formed so as to coat wiring patterns 103 formed on the semiconductor substrate 101. The wiring patterns 103 are formed in a device region, and the alignment mark 102 is formed in the periphery of the device region.

Figure 1B:
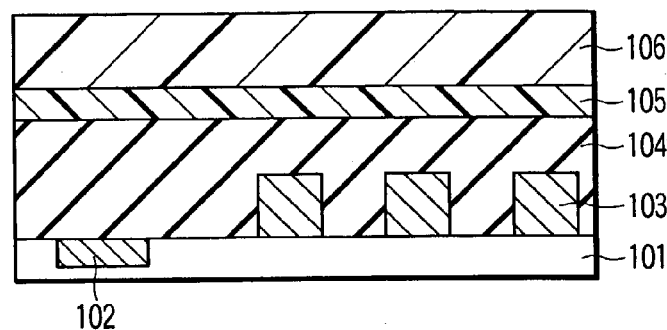

Subsequently, as shown in FIG. 1B, an anti-reflection film 105 having a film thickness of 100 nm, and a chemical amplification positive resist film 106 having a film thickness of 300 nm are successively formed on the interlayer insulating film 104. The anti-reflection film 105 is formed of an organic material in a rotary application method. The chemical amplification positive resist film 106 is a resist for an ArF light (wavelength 193 nm).

It is necessary to selectively remove the anti-reflection film 105 and resist film 106 on the alignment mark 102 which has a low transmittance with respect to an exposure light before performing alignment by an ETTR alignment method.

A region including the alignment mark 102 to be observed by the ETTR alignment method has a size, for example, of 100 μm×200 μm. Therefore, an opaque film of this region of 100 μm×200 μm is removed.

Figure 2:
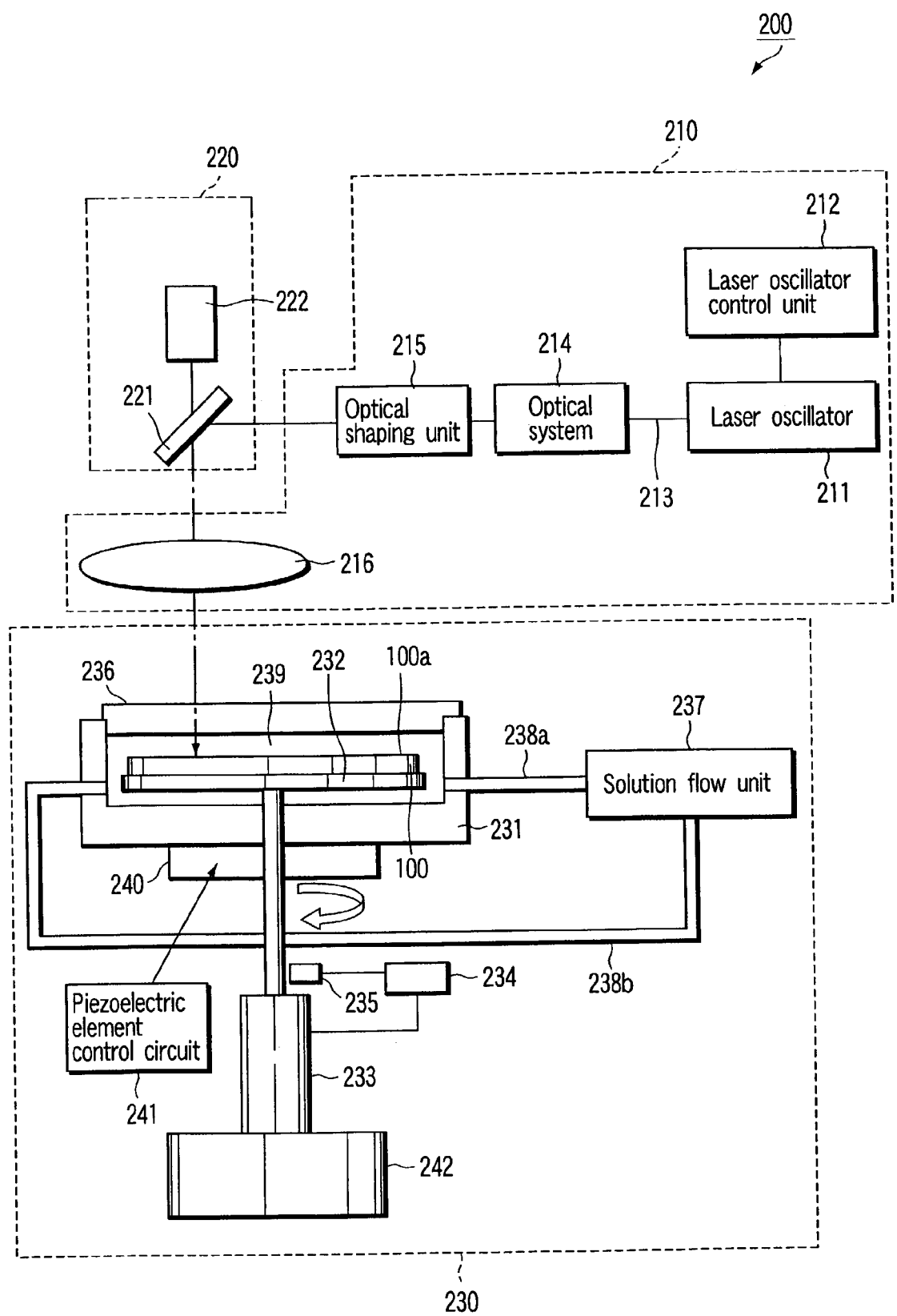
FIG. 2 is a diagram showing a constitution of an optical processing apparatus according to the first embodiment.

Next, a constitution of a laser processing apparatus for selectively removing the anti-reflection film 105 and resist film 106 on the alignment mark 102 will be described. FIG. 2 is a diagram showing the constitution of an optical processing apparatus according to the first embodiment of the present invention.

As shown in FIG. 2, an optical processing apparatus 200 includes a laser optical system 210, observation system 220, and laser processing section 230. First, the constitution of the laser optical system 210 will be described.

The laser optical system 210 includes: a laser oscillator 211; a laser oscillator control unit 212 which controls the laser oscillator 211; an optical system 214 which controls a laser beam 213 oscillated from the laser oscillator 211; an optical shaping unit 215 which controls a shape of the laser beam 213 passed through the optical system 214; and a condenser lens 216.

The laser beam 213 emitted from the laser oscillator 211 is successively transmitted through the optical system 214, optical shaping unit 215, and condenser lens 216, and a processing surface 100a of the substrate 100 disposed in the laser processing section 230 is exposed. The observation system 220 is inserted between the optical shaping unit 215 and condenser lens 216.

For example, a Q-Switch Nd-YAG laser oscillator is used as the laser oscillator 211. The laser beam oscillated from this Q-Switch Nd-YAG laser oscillator includes a basic wave (wavelength 1064 nm), second higher harmonic wave (wavelength 532 nm), third higher harmonic wave (wavelength 355 nm), and fourth higher harmonic wave (wavelength 266 nm). A wavelength which is absorbed by a film to be removed is selected from these wavelengths, and the substrate 100 is exposed with the laser beam having the selected wavelength.

Furthermore, a pulse width of the laser beam 213 emitted from the laser oscillator 211 is set to about 10 nsec. Moreover, it is possible to oscillate the laser beam of the laser oscillator 211 at 10 kHz at maximum. The oscillation of the laser beam 213 of the laser oscillator 211 is controlled by the laser oscillator control unit 212.

The laser beam 213 emitted from the laser oscillator 211 is incident upon the optical shaping unit 215 via the optical system 214.

Figure 3:
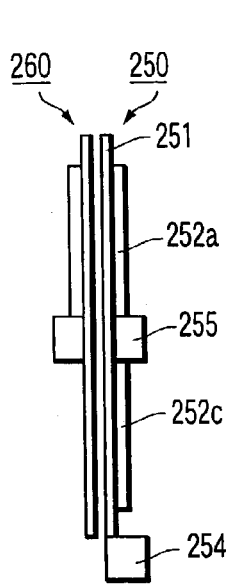
FIG. 3 is a diagram showing a schematic constitution of an optical shaping portion.

As shown in FIG. 3, the optical shaping unit 215 is constituted of two systems: a view field setting system 250 in which an aperture for setting a view field; and a slit/dot setting system 260 in which an aperture for further miniaturizing the view field is formed. The substrate 100 is irradiated with the laser beam transmitted through a portion in which the aperture formed in the view field setting system 250 overlaps with that formed in the slit/dot setting system 260.

The view field setting system 250 forms the shape of the laser beam in a direction crossing at right angles to a scan direction described later. Moreover, the slit/dot setting system 260 forms the shape of the laser beam of the scan direction.

Figure 4:
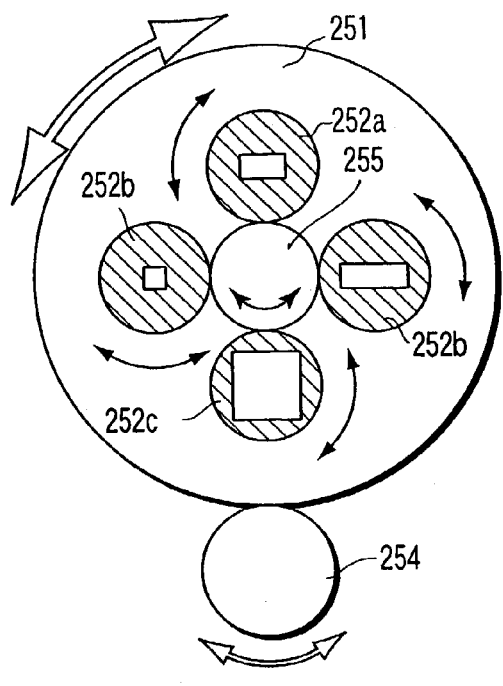
FIG. 4 is a diagram showing a constitution of a view field setting system according to the first embodiment.

The constitution of the view field setting system 250 will be described with reference to FIG. 4. FIG. 4 is a diagram showing the constitution of a view field diaphragm setting system according to the first embodiment. As shown in FIG. 4, a plurality of, for example, four view field diaphragms 252a to 252d are mounted on a view field diaphragm mount plate 251. When the view field diaphragm mount plate 251 is rotated with a view field diaphragm selection mechanism 254, the diaphragm is selected from the view field diaphragms 252a to 252d.

Figure 5A:
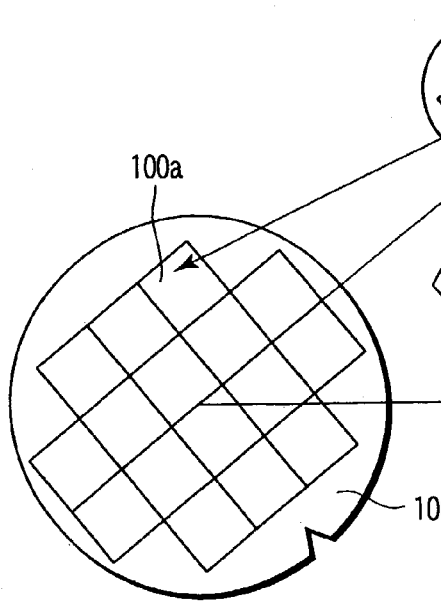
FIGS. 5A and 5B are diagrams showing an operation example of the view field setting system.
Figure 5B:
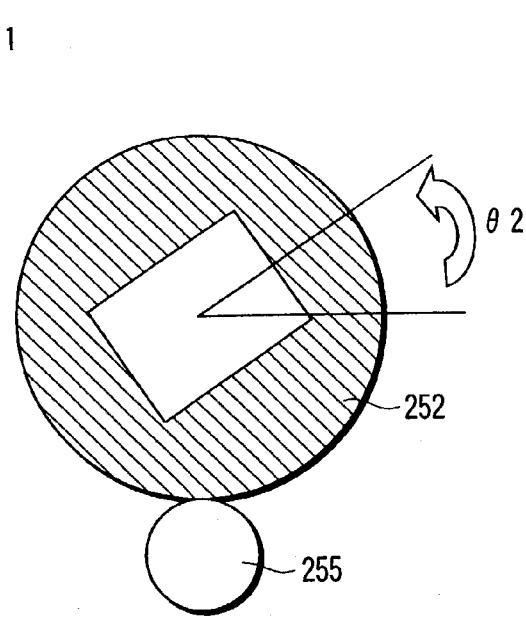

A view field diaphragm rotation mechanism 255 for rotating the view field diaphragms 252a to 252d is disposed on the view field diaphragm mount plate 251. As shown in FIGS. 5A and 5B, the diaphragm rotation mechanism 255 rotates the view field diaphragm 252 by an angle θ2 corresponding to an inclination θ1 of the alignment mark of the substrate 100, which is measured by the observation system 220.

Figure 6:
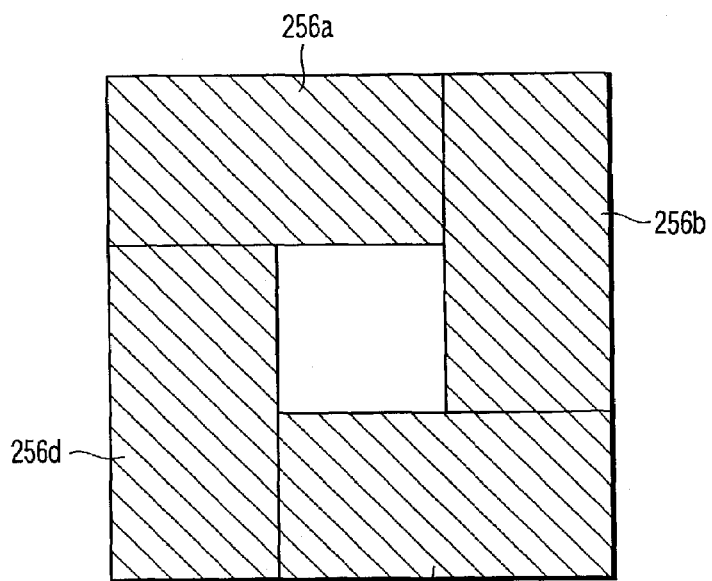
FIG. 6 is a diagram showing the constitution of the view field setting system according to the first embodiment.

Moreover, as another mode of the view field setting system, a view field diaphragm system of a diaphragm blade type shown in FIG. 6 may also be used. This view field diaphragm system is shielded by four diaphragm blades 256a to 256d, and the laser beam is transmitted and shaped through a region surrounded by the diaphragm blades 256a to 256d. With the diaphragm type, it is possible to vary the shaping system shape of the laser beam.

Figure 7:
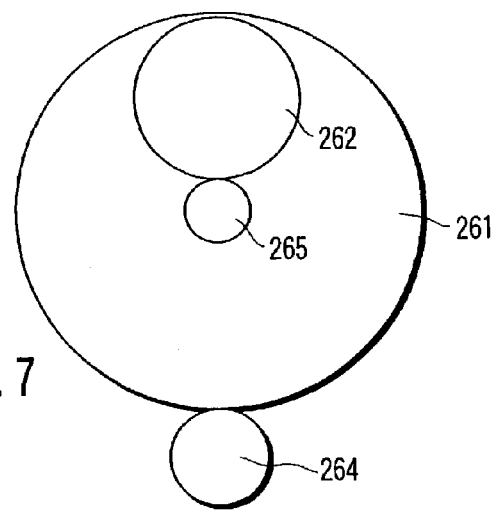
FIG. 7 is a diagram showing a constitution of a slit/dot setting system according to the first embodiment.
Figure 8:
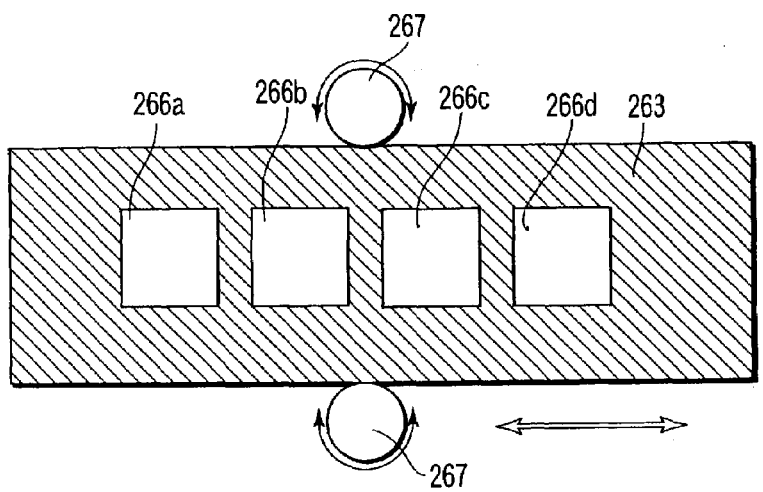
FIG. 8 is a diagram showing the constitution of the slit/dot setting system according to the first embodiment.
Figure 9A:
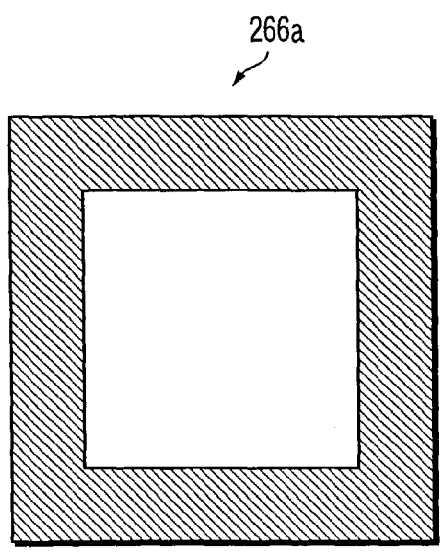
FIGS. 9A to 9D are plan views showing an example of a diaphragm of the slit/dot setting system according to the first embodiment.
Figure 9B:
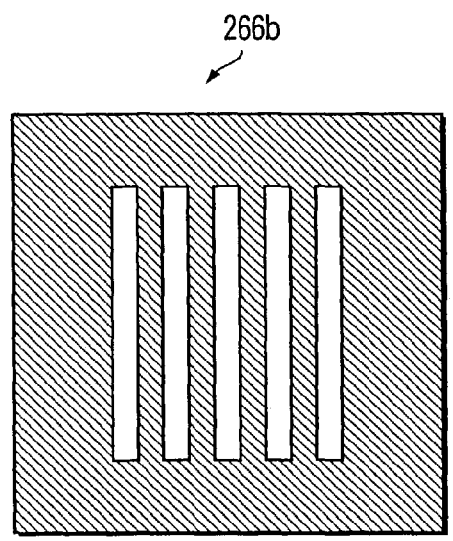
Figure 9C:
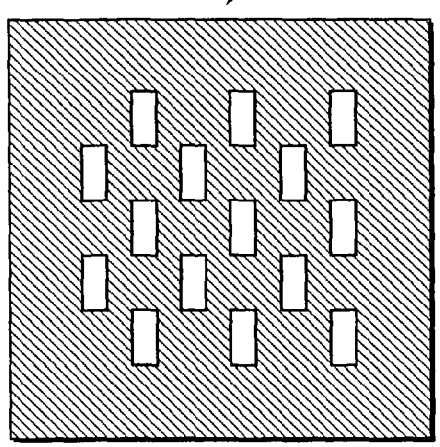
Figure 9D:
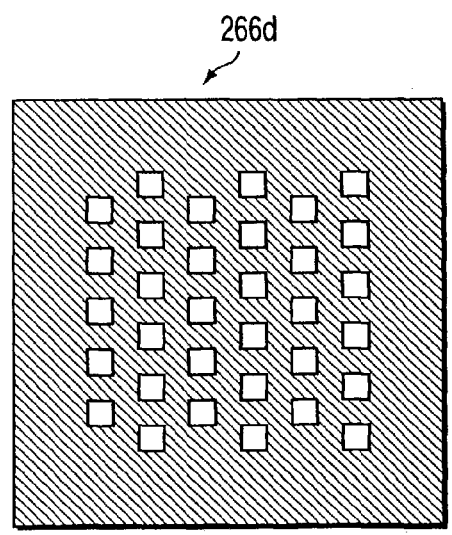

The constitution of the slit/dot setting system 260 will be described with reference to FIGS. 7 and 8. FIGS. 7 and 8 are diagrams showing the constitution of the slit/dot setting system according to the first embodiment of the present invention.

As shown in FIG. 7, a second rotary plate 262 is disposed on a first rotary plate 261. A slit/dot diaphragm mount plate 263 (FIG. 8) on which the diaphragms are mounted is disposed on the second rotary plate 262. First and second rotation mechanisms 264, 265 are disposed to rotate the first and second rotary plates 261 and 262, respectively.

As shown in FIG. 8, for example, four diaphragms 266a to 266d are mounted on the slit/dot diaphragm mount plate 263. A translatory movement mechanism 267 translates/moves the slit/dot diaphragm mount plate 263 to select any one from the slit/dot diaphragms 266a to 266d.

Examples of four slit/dot diaphragms 266a to 266d are shown in FIGS. 9A to 9D. The diaphragm 266a shown in FIG. 9A transmits the laser beam shaped by the view field setting system 250 substantially as such. The diaphragm 266b shown in FIG. 9B shapes the beam in a slit shape. The diaphragms 266c, 266d shown in FIGS. 9C and 9D form the laser beams in dot shapes.

When the amount of a gas generated by laser exposure is high, the laser beam is scattered by the generated gas, and the processing is influenced in this manner, the slit shape may be used. Furthermore, when this tendency is remarkable, divided slit shapes may be used. When the above-described influence is little, a checkered lattice may be used. It is to be noted that a processing situation of a processed film is observed beforehand, and only one of these diaphragms can be mounted.

It is to be noted that the slit shape described herein indicates a shape in which a longitudinal direction of the irradiation shape is substantially equal to one side of the processed region, and a width, in the direction crossing at right angles to the longitudinal direction, is shorter than the other side of the processed region. Moreover, the irradiation shape of the dot shape indicates that both widths of the direction crossing at right angles to the irradiation shape are shorter than the width of the direction crossing at right angles to the processed region.

In this slit/dot diaphragm setting system, while the substrate stands still, the translatory movement mechanism 267 can translate/move the diaphragm mount plate 263 to scan the region to be exposed on the substrate. Since the plate is moved slightly by about several micrometers, a piezoelectric device may also be used to vibrate the plate in a translatory direction. It is to be noted that the slit may be fixed in the same method as that for use in a related-art exposure apparatus and the substrate and may also be relatively scanned against laser beam.

The first and second rotation mechanisms 264, 265 rotate the diaphragm mount plate 263 by an angle θ3 corresponding to the inclination θ1 of the alignment mark of the substrate 100, measured by the observation system 220, and adjust an irradiation position of the laser beam shaped by the view field setting system 250.

The aperture of the view field diaphragm for use herein has a shape substantially analogous to that of the processed region. The aperture is prepared in accordance with the processed region in a range of 10 μm to 500 μm (10 μm×10 μm to 500 μm×500 μm) of one side of the exposure region on the substrate. Moreover, the slit/dot diaphragm for use has a slit or dot width W of 2 to 10 μm. A plurality of slit/dot diaphragms are prepared in a range of a pitch P=2 W to 100 W. A throughput or particle generated amount is obtained beforehand, and the diaphragms are selectively used.

Figure 10:
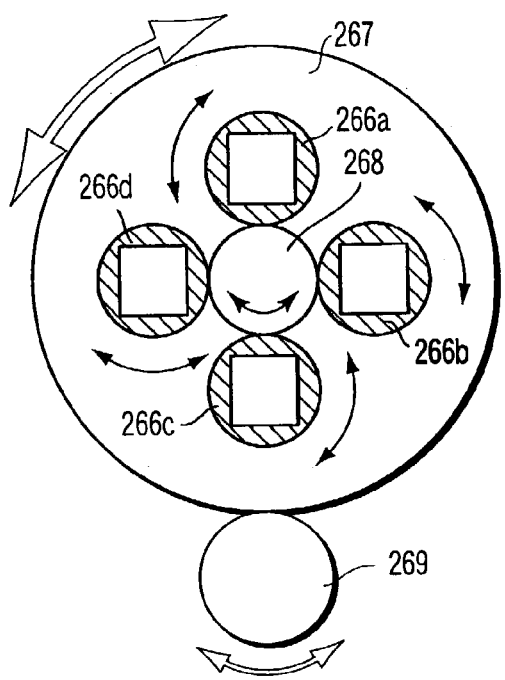
FIG. 10 is a plan view showing the example of the diaphragm of the slit/dot setting system according to the first embodiment.

It is to be noted that as shown in FIG. 10, a mechanism similar to the view field setting system 250 may also be used to select a diaphragm plate in which the slits or dots are formed.

Another constitution of the slit/dot setting system 260 will be described with reference to FIG. 10. FIG. 10 is a diagram showing the constitution of the slit/dot setting system according to the first embodiment. As shown in FIG. 10, a plurality of, for example, four slit/dot diaphragms 266a to 266d shown in FIGS. 9A to 9D are mounted on the S/D diaphragm mount plate 267. An S/D diaphragm selection mechanism 269 rotates the S/D diaphragm mount plate 267 to select any one from the slit/dot diaphragms 266a to 266d.

An slit/dot diaphragm rotation mechanism 268 for rotating the S/D diaphragms 266a to 266d is disposed on the slit/dot diaphragm mount plate 267. The slit/dot diaphragm rotation mechanism 268 rotates the slit/dot diaphragm 252 by the angle θ3 corresponding to the inclination θ1 of the alignment mark of the substrate 100, measured by the observation system 220.

When the S/D setting system shown in FIG. 10 is used, a driving mechanism 242 moves the substrate 100 in parallel to change the irradiation position of the substrate. It is to be noted that a reflective plate such as a mirror is disposed between the substrate and view field setting system to change the angle of the reflective plate, and the irradiation position in the substrate can also be changed.

In this manner, an optical image shaped by the optical shaping unit 215 is transmitted through the observation system 220 and condenser lens 216 to irradiate the processing surface 100a of the substrate 100. The observation system 220 includes a half mirror 221 for taking the laser beam 213 from a light axis, and a camera for observation 222 for observing the laser beam taken out by the half mirror 221. For the observation system 220, a position to be processed on the substrate 100, exposing position, and processing situation are recognized as image information via the CCD camera 222.

This observation system 220 can be used to perform alignment adjustment of the laser beam irradiation position. Moreover, the process of the laser beam irradiation comprises: successively recognizing the image for the processed state; extracting the region to be processed from the image; and judging progress of the processing to adjust an exposure amount. For example, the exposure amount is reduced in the portion that the progress of processing is fast, and the exposure amount is increased in the portion that the progress of processing is fast. Moreover, it is recognized whether the processing ends. A difference of the image is obtained to recognize end of the processing. In a stage in which the difference of the image of the whole region to be exposed is substantially 0, the processing is ended. The processing can be controlled in this manner.

The observation system 220 also serves as a particle detection mechanism for observing the whole region to be exposed of the substrate 100 to count particles. The particles can be detected by calculating the number of pixels of a specific gradation range in a reflected light received by a CCD pixel. Furthermore, by an algorithm of:
1) regarding pixels disposed adjacent to each other longitudinally and laterally as one cluster to determine the number of defects; and
2) also regarding pixels disposed adjacent to each other longitudinally, laterally, and obliquely as one cluster to determine the number of defects, the defects can also be extracted. The particle detection mechanism compares the number of calculated defects with the minimum number of defects registered beforehand. When the number of detected defects is more than the minimum number of defects, a command is issued so as to successively perform treatment in a desired region. When the number is not more than the minimum number of defects, control can be executed to issue a command for shifting to the next processed region.

Moreover, the image is stored before/after laser exposure. When the difference is taken and is substantially 0, the processing in the portion is stopped. In another case, the control is executed to continue the processing.

Next, the laser processing section 230 will be described. A holder 231 is constituted in a tray-like shape in which a dam for storing a solution 239 is disposed in a peripheral portion. For example, pure water is used as the solution 239.

A stage 232 in which the substrate 100 can be laid/held is disposed in a middle portion in the holder 231. The substrate 100 is rotated by a rotation mechanism 233 connected to the stage 232. For the rotation of the substrate 100, a rotary angle is controlled by a sensor 235 and rotation control mechanism 234. It is to be noted that in the present embodiment the rotation mechanism 233 is connected to a driving mechanism 242. The holder 231 is moved in horizontal and vertical directions to change the exposure position of the laser beam. The condenser lens 216 can be miniaturized by the rotation mechanism 233 and driving mechanism 242. It is possible to miniaturize a laser processing system in this manner.

The holder 231 further includes a window 236 for covering the solution in which the processing surface of the substrate 100 is submerged. The window is transparent to the laser beam. The laser beam 213 oscillated from the laser oscillator 211 is transmitted through the window 236 and solution 239 so that the processing surface 100a of the substrate 100 is exposed.

Furthermore, a solution flow unit 237 is disposed to allow the solution 239 pooled in the holder 231 to flow. The solution flow unit 237, which is basically a pump, is connected to the holder 231 through pipes 238a, 238b, and solution 239 is circulated. Moreover, a flow direction can be controlled with respect to the direction of relative movement of the substrate 100 and laser beam.

Additionally, the present apparatus includes a piezoelectric device 240 disposed in the back surface of the holder 231, and a piezoelectric device driving control circuit 241 which controls the driving of the piezoelectric device 240. The piezoelectric device 240 gives an ultrasonic vibration to the solution 239 of the irradiation region of the laser beam of at least the processing surface 100a of the substrate 100, and bubbles generated by the irradiation with the laser beam can be removed.

Moreover, a laser beam source is used as a light source for the processing in the present apparatus, but the present invention is not limited to this. Any light may be used, as long as a wavelength is absorbed by the film to be processed and desired processing can be performed, that is, the film thickness can be reduced, or the film can be removed. For example, when the wavelength is absorbed by a visible or ultraviolet region in an organic or inorganic film, the light of a tungsten or Xe flash lamp is condensed and used. In this case, film thickness reduction is confirmed.

The present apparatus relates to the processing in water, but can also be applied to a treatment in the atmosphere, pressurizing treatment, and reduced pressure treatment, and the holder structure can be used in accordance with the respective treatments.

Next, the removing of the resist film 106 and antireflection film 105 using the optical processing apparatus 200 will be described.

The substrate is transferred to the optical processing apparatus 200 shown in FIG. 2. A notch and wafer edge of the substrate are detected to adjust alignment of a laser beam axis and substrate. Moreover, the inclination of the view field diaphragm and Slit/dot diaphragm is adjusted in accordance with the inclination of the alignment mark 102.

Next, for the shape of the light to be emitted, a predetermined region to be removed is determined to have a longitudinal size 100 μm×lateral size 200 μm, and the optical shaping unit is used to shape the laser beam in a desired shape. Moreover, in the present embodiment, the Slit/dot diaphragm for shaping the laser beam in one slit shape with a longitudinal size 100 μm×lateral 5 μm is used.

Figure 1C:
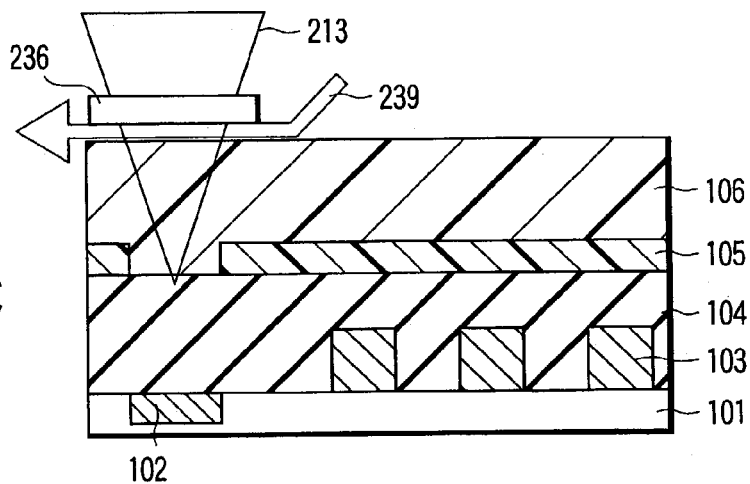

Next, as shown in FIG. 1C, the solution flow unit 237 is operated to allow the solution 239 to flow between the window 236 and substrate 100. In this state, the laser beam is relatively scanned against the substrate to remove the region to be processed of the film.

A method of relatively scanning the substrate against light may comprise: fixing the light axis of the laser beam to use the driving mechanism 242; or using the optical shaping unit and translating/moving, for example, the Slit/dot mount plate 263 to scan the substrate.

The wavelength of the laser beam is absorbed by the anti-reflection film for use in a lithography process. An energy density per pulse is appropriately adjusted so that the whole region to be ablated can satisfactorily be removed without damaging a region other than the whole region to be ablated. The energy density per pulse is usually in a range of 0.1 J/cm$^2$·pulse to 0.5 J/cm$^2$·pulse.

Since the solution 239 exists on the exposure portion at a laser beam exposure, heat generated by the exposure with the laser beam can be removed in the processing surface 100a of the substrate 100. Furthermore, an energy of evaporant generated by the irradiation with the laser beam can be decreased.

The window 236 prevents the solution 239 pooled in the holder 231 from being scattered at a laser processing time. Moreover, the window prevents dust from sticking to the surface of the semiconductor substrate 101 from above.

Figure 11:
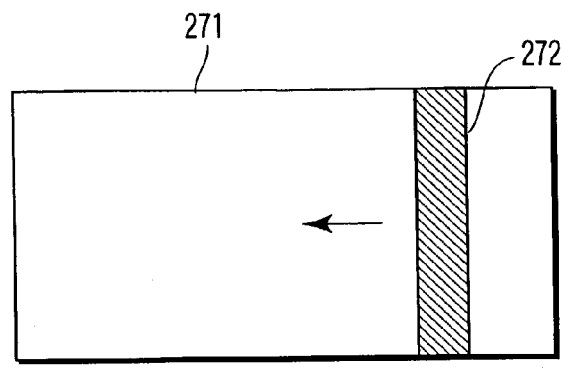
FIG. 11 is a plan view showing a manufacturing step of the semiconductor device according to the first embodiment.

The substrate 100 is exposed with the laser beam, and the Slit/dot diaphragm mount plate 263 is translated/moved. When the Slit/dot diaphragm mount plate 263 is translated/moved, as shown in FIG. 11, an exposure region 272 with the laser beam relatively scans against the whole region to be exposed 271 on the substrate, and the anti-reflection film 105 and resist film 106 of the whole region to be exposed are removed.

It is to be noted that the particles generated at exposure by the exposure are removed in the liquid flow. It has been confirmed by experiments that the particles stick onto a downstream side. Then, for a scan direction of the exposure region, the generated particles can be removed in the same direction as that of the liquid flow during the processing. Therefore, the generation of the particles is reduced. The solution flow unit 237 allows the solution 239 pooled in the holder 231 to flow so that bubbles generated in the irradiation position of the laser beam by the irradiation with the laser beam can continuously be removed. Furthermore, the solution is circulated in a constant direction in a constant flow rate so as to prevent irregular disturbance from being generated in the laser beam. The solution flow unit 237 may be driven, when the laser processing is actually performed.

Next, after the solution 239 pooled in the holder 231 is discharged, the processing substrate 100 is rotated at a high speed, and a liquid in the surface is roughly removed. Thereafter, the processing substrate 100 is further transferred to a second solvent removing apparatus and heated. A heating temperature of the substrate 100 was set to 200° C. The substrate 100 is heated here in order to remove an adsorbed liquid in the surface of a resist film 306 and to obtain the same exposure environment in the whole resist film surface. When the treatment is not performed, acid generated in the exposure moves by a slight amount of liquid left in the film in a portion in contact with the liquid, and a pattern defect is caused.

Figure 1D:
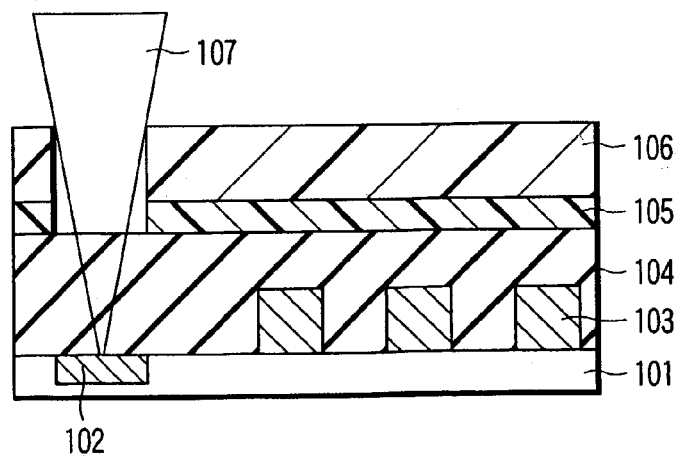

Subsequently, the substrate 100 is transferred to an exposure apparatus. As shown in FIG. 1D, the alignment mark 102 of the substrate 100 is detected by an alignment detector using an alignment light (first energy line) 107 which has the same wavelength as an exposure wavelength. At this time, since the anti-reflection film 105 on the alignment mark 102 is removed, satisfactory detection sensitivity is obtained. It is to be noted that the alignment mark 102 cannot be detected, when the anti-reflection film 105 on the alignment mark 102 is not removed as in the related art.

Figure 1E:
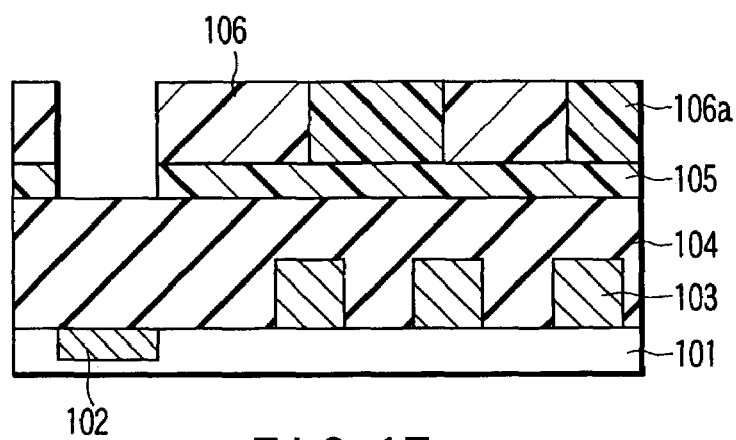

As shown in FIG. 1E, an exposure portion 106a of the resist film 106 is irradiated with an exposure light (second energy line) to form a latent image of a circuit pattern in the resist film 106. After the latent image forming step, the substrate 100 is transferred to a heating apparatus for a PEB step to perform a heating treatment (PEB) of the processing substrate. The heating treatment is performed to cause catalyst reaction of acid of a used resist (chemical amplification type resist).

Figure 1F:
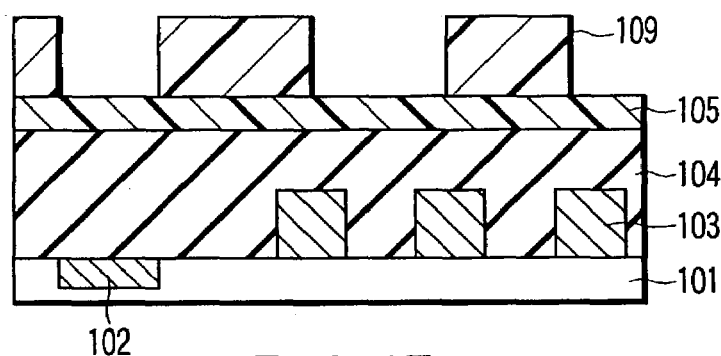

After this heating treatment, as shown in FIG. 1F, the substrate 100 is transferred to develop the image of the resist film 106 and to form resist patterns 109. Alignment precision of the formed resist patterns 109 is not more than ±5 nm.

Figure 1G:
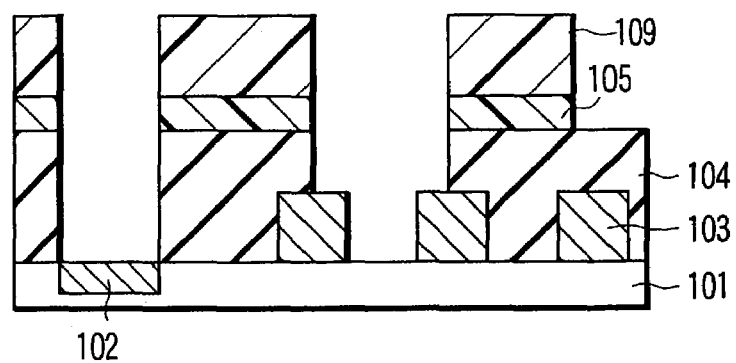

Subsequently, as shown in FIG. 1G, the resist patterns 109 are used as masks to etch the anti-reflection film 105 and interlayer insulating film 104 by RIE.

Figure 12:
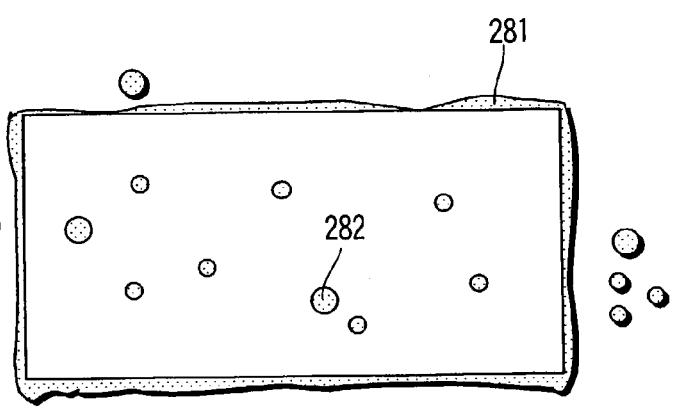
FIG. 12 is a diagram showing a surface state of a substrate from which a film has been removed in a method according to the first embodiment.

FIG. 12 shows a substrate surface state from which the anti-reflection film 105 and resist film 106 are removed in the above-described method. Moreover, FIG. 13 shows the substrate surface state as a reference example in a case in which the laser is collectively exposed the whole region to be ablated the films are removed.

Figure 13:
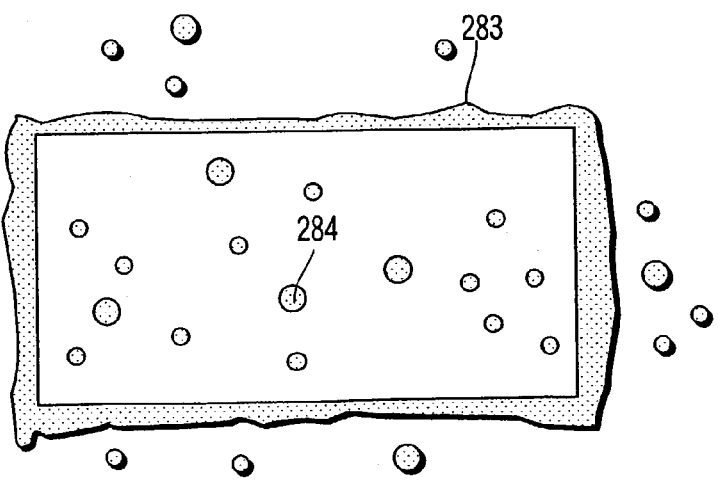
FIG. 13 is a diagram showing the surface state of the substrate from which the film has been removed in a related-art method.

As seen from FIG. 13, when the films are removed by the collective exposure, a large number of particles 284 exist and cannot completely be removed in the periphery and inside of the whole region to be ablated. Furthermore, peels 283 of the resist film formed on the anti-reflection film are generated around the whole region to be ablated.

When the films are removed in the method of the present embodiment, as compared with the related-art method shown in FIG. 13, peels 281 of the upper-layer resist are reduced. It is seen that the number of particles 282 sticking to the periphery and inside of the whole region to be ablated decreases.

A reason of the decrease of the number of particles will be described hereinafter. When a exposure region once is broad, the bubble generated by the exposure becomes larger than the whole region to be ablated. Therefore, a large number of particles adsorbed in bubble surfaces stick to the inside/outside of the whole region to be ablated.

On the other hand, when the exposure region is thinned into the slit shape, and the exposure region is relatively scanned against the whole region to be ablated on the substrate, the bubble generated once becomes small, and the bubble does not easily contact the substrate. Therefore, the number of particles sticking to the inside/outside of the whole region to be ablated is reduced.

As a result of measurement of the generated bubble, in a case in which a whole region to be ablated of the film is collectively removed, a radius of the generated bubble was R=120 µm. On the other hand, in the exposure with the laser beam having the slit shape with a width of 5 µm, the bubble radius was R=25 µm. In the exposure with the laser beam having the slit shape, the size of the bubble is reduced as compared with the collective exposure. It has been seen from this result that the diameter of the bubble generated with one ablation is controlled to be reduced, and the sticking particles can be reduced.

However, even the above-described method is incomplete for removing the particles in the processed region. The sticking particles in the alignment mark cause problems of an increase of read inaccuracy in reading the alignment mark, or read error. Moreover, when the particles stick to the outside of the alignment mark, particularly to a device region, a pattern forming defect is caused, and yield disadvantageously drops.

A method in which the number of particles sticking to the inside/outside of the whole region to be ablated can further be reduced will be described hereinafter.

First, a processing method for preventing the particles from sticking to the inside of the whole region to be ablated will be described. An apparatus for use in removing the film is similar to that described in the first embodiment.

Figure 14A:
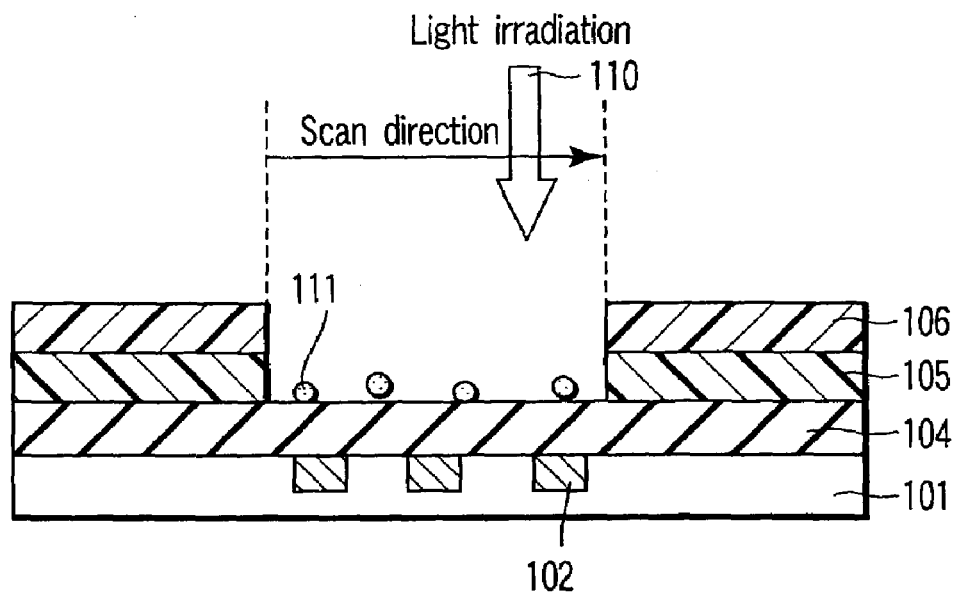
FIGS. 14A and 14B are sectional views showing the manufacturing steps of the semiconductor device according to the first embodiment.
Figure 14B:
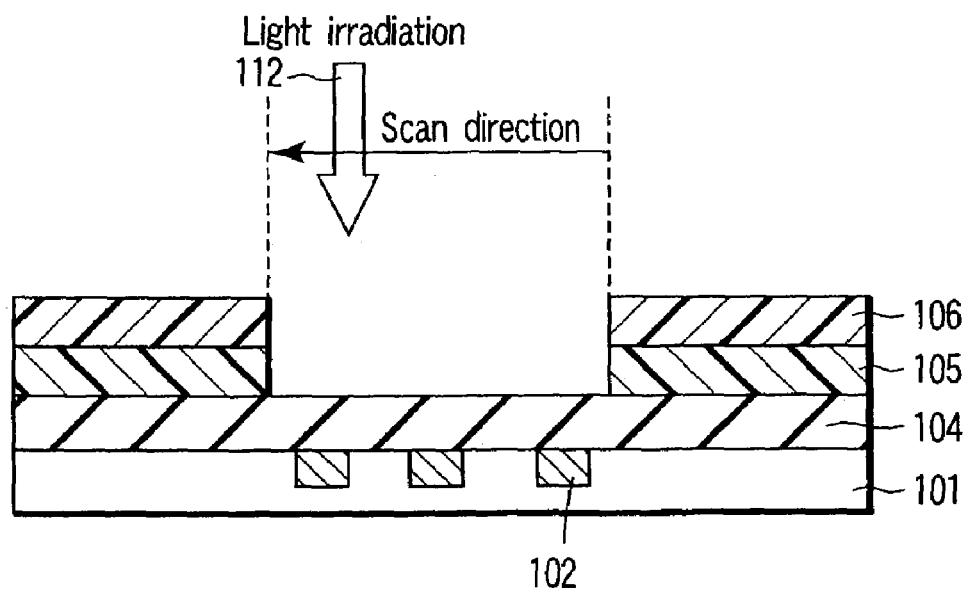

FIGS. 14A and 14B are sectional views showing the manufacturing steps of the semiconductor device according to the first embodiment of the present invention.

As shown in FIG. 14A, for the resist film and anti-reflection film on a predetermined the whole region to be ablated (longitudinal 100 µm×lateral 200 µm), a laser beam 110 is shaped in the slit shape (longitudinal 100 µm×lateral 3 μm) having a width smaller than that of the alignment mark, and is exposed with the resist film and anti-reflection film. While the laser beam (first processing light) 110 is scanned to the other end from one end of the processed region, the ablation is performed. At this time, a small amount of particles 111 stick to the substrate surface.

Here, assuming that an oscillation frequency is f, scan speed is v, and a slit having a width t is scanned, the number n of overlap exposures performed in one scan is represented by:

$$n=tf/v \qquad (1).$$

That is, when the oscillation frequency f=250 Hz, and scan speed v=30 μm/sec, the number n of overlap exposures=25 irradiations in the slit width t=3 μm.

When the number n of overlap exposure increases, damages by exposure are easily caused in various regions formed in the lower layer of the anti-reflection film, such as a substrate Si, mark, and interlayer insulating film. That is, the number of overlap exposures is appropriately selected by the thickness and material of the anti-reflection film or the film type or thickness of the anti-reflection film lower layer. Usually n is selected between 1 and 50.

In equation (1), when the number n of overlap exposures is less than one, the overlap of the exposure regions is removed. A film which cannot completely be removed exists in the whole region to be ablated. This residual film in the whole region to be ablated is peeled, when the adjacent exposure region is exposed. Critical particles are generated. That is, n needs to be set to at least 1 or more.

Subsequently, as shown in FIG. 13B, a laser beam (second processing light) 112 is scanned to the other end from one end. Furthermore, when the laser beam 112 is similarly repeatedly reciprocated/scanned, it is possible to remove the particles remaining above the alignment mark. Here, the scanning was performed in the solution 239 pooled in the holder 231 in order to alleviate an influence onto the resist film by the heat generated by the abrasion. Moreover, the solution 239 was circulated in the constant direction at the constant flow rate so that the bubbles generated in the region irradiated with the laser beam by the irradiation with the laser beam can continuously be removed and to such an extent that disturbance is not generated in the laser beam in the solution flow unit 237.

In this process, the observation system 220 constituted of the CCD camera is used to count the particles inside/outside the whole region to be ablated. Subsequently, the image is stored before/after the exposure, and the difference of the number of particles is obtained. When the difference is substantially 0, the processing in the portion is stopped; otherwise, the processing is controlled to be continuously performed.

It has been confirmed that the alignment precision of the substrate pattern with the exposure pattern is improved by the above-described step.

In the present embodiment the processed film on the alignment mark is completely removed, but the present invention is not limited to this embodiment. For example, when the alignment mark can be detected by the optical system for use in the alignment measurement, the processing may be ended even with a slight amount of the processed film remaining in the whole region to be ablated. For example, even when the film thickness of the processed film is halved, and contrast is bad, the alignment can be performed.

Second Embodiment

In the first embodiment, the method of forming the exposure region of the laser beam in the slit shape and reciprocating/scanning the laser beam against the whole region to be ablated to remove the particles sticking to the whole region to be ablated has been described.

However, at the processing by the exposure in this method, the exposure region on the substrate is constantly fixed in the slit shape having a constant area, and the light is reciprocated/scanned in the whole region to be ablated. Therefore, when the alignment precision is not sufficient with respect to the exposure position and the whole region to be ablated, and every time the reciprocating scan is repeated, the processed position deviates. This causes a problem that the particles are newly generated from a edge of the whole region to be ablated.

To solve the problem, in the present embodiment, a method will be described which comprises: reducing the exposure region of the laser beam on the substrate in consideration of the alignment precision in the vicinity of the edge of the whole region to be ablated and reducing the number of the particles generated in the vicinity of the edge of the whole region to be ablated to prevent the particles from sticking to the processed region.

FIGS. 15A, 15B, 16A and 16B are diagrams showing the manufacturing steps of the semiconductor device according to a second embodiment of the present invention. It is to be noted that in FIGS. 15A, 15B, 16A and 16B, the same parts as those of FIG. 1B are denoted with the same reference numerals, and the description thereof is omitted. FIGS. 15A and 16A are sectional views, and FIGS. 15B and 16B are plan views of the processed region.

In a first scan, as shown in FIG. 15, exposure region 120 is relatively scanned against the substrate 100 in a middle portion of a whole region to be ablated 121, and scanned to the other end from one end of the whole region to be ablated to remove the anti-reflection film 105 and resist film 106 of the whole region to be ablated 121. It is to be noted that reference numeral 122 denotes the exposure region of the laser beam 120.

As described above, when the alignment precision of the exposure region with the hole region to be ablated is not sufficient in the reciprocating scan in this state in the first embodiment, the edge of the whole first region to be ablated is exposed, and processed, and the particles stick into the region 121.

Then, In a second and subsequent state, as shown in FIGS. 16A and 16B, when an exposure region 124 approaches the edge of the whole region to be ablated 121, in consideration of the alignment precision, an exposure region 125 is set to be smaller than the an exposure region 122 in the middle portion of the processed region 121 by the view field setting system 250.

Thereby, new particles can be prevented from being generated from a region other than the whole region to be ablated 121 by the influence of the alignment error in the vicinity of the edge of the whole region to be ablated 121. Moreover, when an exposure region is reduced, the bubble 125 generated in the edge of the whole region to be ablated becomes smaller than a bubble 123 generated in the middle portion of the whole region to be ablated. Moreover, the amount of particles 111 decreases. Therefore, the particles 111 adsorbed in the surfaces of the bubbles 125 are also prevented from sticking to the substrate surface.

In this process, the observation system 220 constituted of the CCD camera is used to count the particles inside/outside the whole region to be ablated. Subsequently, the image is stored before/after the exposure, and the difference of the number of particles is obtained. When the difference is substantially 0, the processing in the portion is stopped; otherwise, the processing is controlled to be continuously performed.

By this method, it is further possible to prevent the particles from sticking into the processed region as compared with the method described in the first embodiment.

In the present embodiment the processed film on the alignment mark is completely removed, but the present invention is not limited to this. For example, when the alignment mark can be detected by the optical system for use in the alignment measurement, the processing may be ended with a slight amount of the processed film remaining in the processed region.

Third Embodiment

In the second embodiment, the method has been described which comprises: relatively scanning the exposure region against the whole region to be ablated substrate; and reducing the area of the exposure region in consideration of the alignment precision in the vicinity of the edge of the whole region to be ablated. Thereby, the new particles are inhibited from being generated from the region other than the whole region to be ablated, the diameter of the generated bubble is reduced, and the particles adsorbed in the bubble surface are prevented from sticking to the substrate surface.

In a third embodiment, for a purpose similar to that of the second embodiment, the exposure region is relatively scanned against the whole region to be ablated, and scanned to the other end from one end of the whole region to be ablated. When the position of exposure region comes close to the edge of the whole region to be ablated, a scan speed is reduced, and the alignment precision in the vicinity of the edge of the whole region to be ablated is further improved. Moreover, when the diameter of the bubble generated per unit time is reduced, the particles are prevented from sticking into the whole region to be ablated. This method will be described.

FIGS. 17A, 17B, 18A and 18B are diagrams showing the manufacturing steps of the semiconductor device according to the third embodiment of the present invention. It is to be noted that in FIGS. 17A, 17B, 18A and 18B, the same parts as those of FIG. 1B are denoted with the same reference numerals, and the description thereof is omitted. FIGS. 17A and 18A are sectional views, and FIGS. 17B and 18B are plan views of the processed region.

In second and subsequent scans, when the exposure region approaches the edge of the whole region to be ablated, a scan speed of a laser beam 133 is reduced (FIGS. 18A and 18B) as compared with a time when a exposure region 130 is scanned in the middle portion of a whole region to be ablated 131 (FIGS. 17A and 17B). The scan speed of the exposure region is adjusted by adjusting a translation rate of the diaphragm mount plate. Reference numerals 131, 134 denote the exposure region 130, 133 on the substrate.

Since the scan speed of the exposure region becomes slow in the edge of the whole region to be ablated 131, the exposed area per time decreases in the vicinity of the edge of the whole region to be ablated 131. Therefore, the diameter of a bubble 135 generated in the unit time also decreases, the particles 111 adsorbed in the surfaces of the bubbles 135 do not easily contact the substrate surface, and the particles are prevented from sticking to the inside/outside of the whole region to be ablated 131.

In this process, the observation system 220 constituted of the CCD camera is used to count the particles inside/outside the whole region to be ablated. Subsequently, the image is stored before/after the exposure, and the difference of the number of particles is obtained. When the difference is substantially 0, the processing in the portion is stopped; otherwise, the processing is controlled to be continuously performed.

Even when the laser processing is performed in the atmosphere, high-pressure air or low-pressure air the effect of the present embodiment can be confirmed.

In the present embodiment the processed film on the alignment mark is completely removed, but the present invention is not limited to this. For example, when the alignment mark can be detected by the optical system for use in the alignment measurement, the processing may be ended with the slight amount of the processed film remaining in the processed region.

Fourth Embodiment

In the first embodiment, the method of scanning the thinned laser beam constantly having the constant exposure region in the whole region to be ablated to remove the anti-reflection film or resist film has been described. However, when the exposure region is reciprocated/scanned, there is an error in the alignment precision between the laser beam and whole region to be ablated against the scan direction. In this case, when the exposure region having the same shape is repeatedly reciprocated/scanned, an influence of the alignment error is exerted, and the region other than the whole region to be ablated is exposed. As a result, every time exposure region is reciprocated/scanned in the whole region to be ablated, new particles are generated, and it is difficult to completely remove the particles.

To solve the problem, in a fourth embodiment, the alignment precision of the exposure region against the processed region is considered, and a long side of the exposure region formed in the slit shape is gradually reduced.

This embodiment will be described in more detail with reference to FIGS. 19A, 19B, 20A and 20B. FIGS. 19A, 19B, 20A and 20B are diagrams showing the manufacturing steps of the semiconductor device according to the fourth embodiment of the present invention. It is to be noted that in FIGS. 19A, 19B, 20A and 20B, the same parts as those of FIG. 1B are denoted with the same reference numerals, and the description thereof is omitted. FIGS. 19A and 20A are sectional views, and FIGS. 19B and 20B are plan views of the processed region.

FIGS. 19A and 19B show a first scan state. Moreover, FIGS. 20A and 20B show a second and subsequent scan state. As shown in FIGS. 19A, 19B, 20A and 20B, a length of an exposure region 144 in the longitudinal direction in the second scan of a laser beam 143 is set to be shorter than that of an exposure region 142 of a laser beam 140 in the first scan.

In this case, even when the reciprocating scan is repeated, the region other than the whole region to be ablated is not exposed with the light. As a result, it is possible to reduce the particles generated outside the whole region to be ablated and to prevent the particles from sticking to the film.

In this process, the observation system 220 constituted of the CCD camera is used to count the particles inside/outside the whole region to be ablated. Subsequently, the image is stored before/after the exposure, and the difference of the number of particles is obtained. When the difference is substantially 0, the processing in the portion is stopped; otherwise, the processing is controlled to be continuously performed.

Even when the laser processing is performed in the atmosphere, high-pressure air or low-pressure air the effect of the present embodiment can be confirmed.

In the present embodiment the processed film on the alignment mark is completely removed, but the present invention is not limited to this. For example, when the alignment mark can be detected by the optical system for use in the alignment measurement, the processing may be ended with the slight amount of the processed film remaining in the processed region.

Fifth Embodiment

In the first embodiment, the thinned light is scanned in the whole region to be ablated to remove the anti-reflection film or resist film. However, in this method, when there is the alignment error of the scan direction between the exposure region and the whole region to be ablated, and when the exposure region is constantly reciprocated/scanned in the whole region to be ablated, the edge of the whole region to be ablated by the previous exposure is exposed for every repeated reciprocating scan. A large amount of new particles are generated from the portion other than the whole region to be ablated.

To solve the problem, in a fifth embodiment, the alignment precision of the position of exposure region is considered with respect to the scan direction, and a scan range of the exposure region in the whole region to be ablated is gradually reduced every increase of the number of scans.

Figure 21:
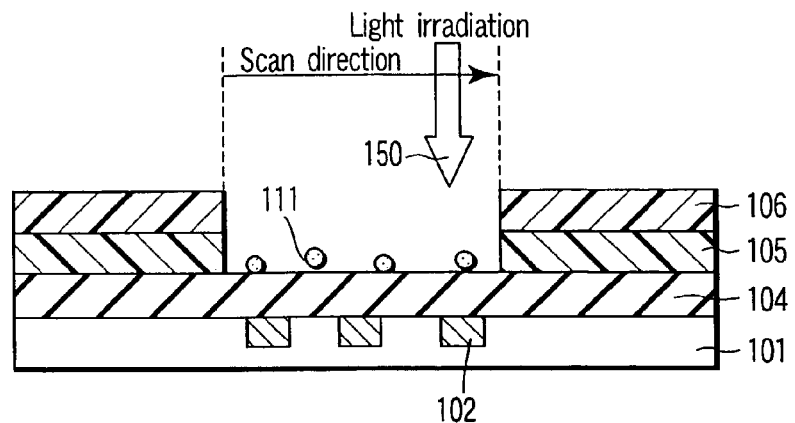
FIG. 21 is a diagram showing the manufacturing step of the semiconductor device according to a fifth embodiment.
Figure 22:
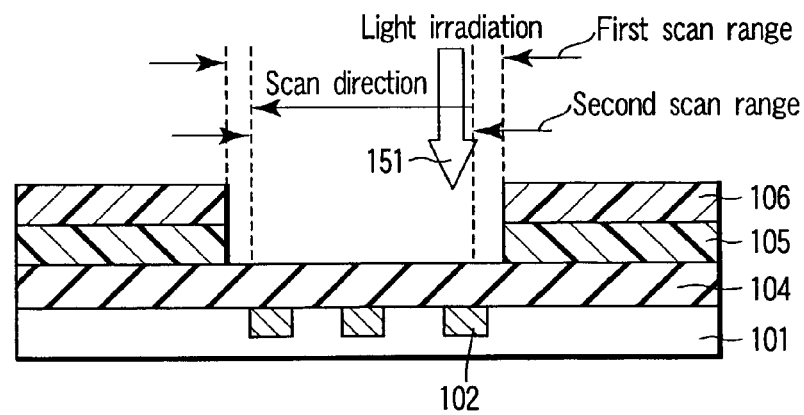
FIG. 22 is a diagram showing the manufacturing step of the semiconductor device according to the fifth embodiment.

This embodiment will be described in more detail with reference to FIGS. 21 and 22. FIGS. 21 and 22 are diagrams showing the manufacturing steps of the semiconductor device according to the fifth embodiment of the present invention. It is to be noted that in FIGS. 21 and 22, the same parts as those of FIG. 1B are denoted with the same reference numerals, and the description thereof is omitted.

FIG. 21 shows the first scan state. Moreover, FIG. 22 shows the second scan state. As shown in FIGS. 21 and 22, the scan range of an exposure region 151 in the second scan is set to be smaller than that of an exposure region 150 in the first scan.

For this reciprocating scan, even when the reciprocating scan is repeated, the region other than the whole region to be ablated is not exposed with the light. As a result, it is possible to reduce the particles generated outside the whole region to be ablated and to prevent the particles from sticking to the film.

In this process, the observation system 220 constituted of the CCD camera is used to count the particles inside/outside the whole region to be ablated. Subsequently, the image is stored before/after the exposure, and the difference of the number of particles is obtained. When the difference is substantially 0, the processing in the portion is stopped; otherwise, the processing is controlled to be continuously performed.

As described above, in the first to fifth embodiments, the shape of exposure region is set to a long slit shape, and the exposure region is relatively against the whole region to be ablated to remove the anti-reflection film or resist film. However, the shape of exposure region is not limited to the long slit shape. The exposure region may be exposed with a light divided in dot shapes, and the inside of the predetermined processed region may also be scanned.

Even when the laser processing is performed in the atmosphere, high-pressure air or low-pressure air the effect of the present embodiment can be confirmed.

In the present embodiment the processed film on the alignment mark is completely removed, but the present invention is not limited to this. For example, when the alignment mark can be detected by the optical system for use in the alignment measurement, the processing may also be ended with the slight amount of the processed film remaining in the processed region.

Sixth Embodiment

In the first to fifth embodiments, the method has been described comprising: reciprocating/scanning the light whose exposure region is smaller than the whole region to be ablated to remove the particles sticking into the processed region.

However, this method has a problem that time is consumed in the reciprocating scan and throughput drops. Furthermore, because of the exposure with the light having the long slit shape, problems occur that an influence of heat strain increases in the alignment mark formed in the anti-reflection film lower layer and that the lower layer is easily damaged.

In a sixth embodiment, a method of shortening a treatment time while inhibiting the lower layer from being damaged by the alignment mark will be described.

Figure 23A:
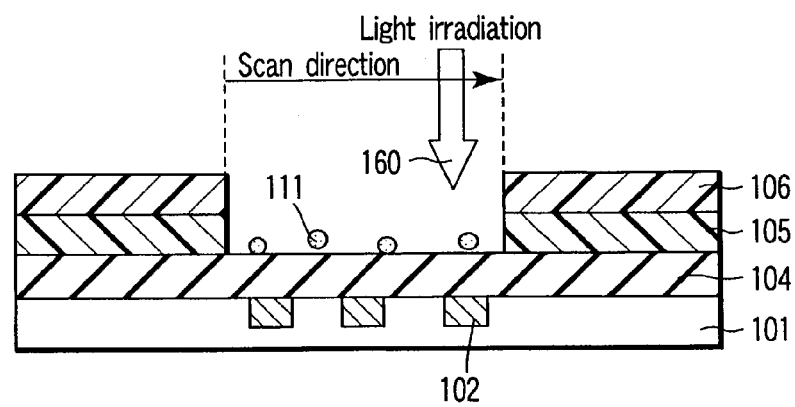
FIGS. 23A and 23B are sectional views showing the manufacturing steps of the semiconductor device according to a sixth embodiment.
Figure 23B:
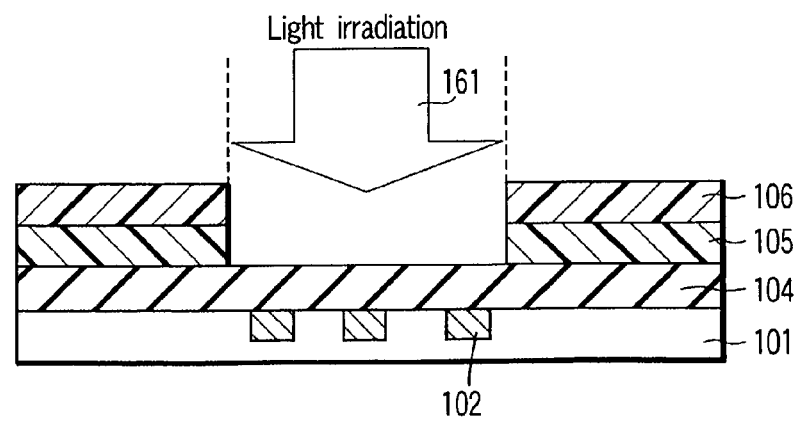

FIGS. 23A and 23B are sectional views showing the manufacturing steps of the semiconductor device according to the sixth embodiment. It is to be noted that in FIGS. 23A and 23B, the same parts as those of FIG. 1B are denoted with the same reference numerals and the description thereof is omitted.

As shown in FIG. 23, the method first comprises: scanning an exposure region 160 of the slit shape against the whole region to be ablated to remove the anti-reflection film 105 and resist film 106 of the processed region. In this state, the particles 111 exist in the whole region to be ablated.

Subsequently, in second and subsequent exposure, as shown in FIG. 23B, the exposure region 161 is shaped only by the view field setting system and has substantially the same size as that of the whole region to be ablated to remove the particles. At this time, in consideration of the alignment precision, an actual exposure region may also be smaller than the whole region to be ablated so as to prevent a portion other than a the whole region to be ablated from being generated particles.

Even in this method, in the same manner as in the second to fifth embodiments, it is possible to prevent the particles from sticking into the whole region to be ablated.

Moreover, here, first the exposure region is the long slit shape and is relatively scanned against whole region to be ablated to remove the anti-reflection film or resist film. However, the shape of the exposure region is not limited to a thin rectangular shape. The processed region may also be exposed with the light divided in dots, and the dotted light may also be scanned in the whole region to be ablated.

As described above, in at least the first processing, the exposure region having the long slit shape is scanned to ablate the region, so that the particles are inhibited from being generated. Thereafter, when the processed region is exposed with the light, it is possible to remove the particles in the whole region to be ablated.

In this process, the observation system 220 constituted of the CCD camera is used to count the particles inside/outside the whole region to be ablated. Subsequently, the image is stored before/after the exposure, and the difference of the number of particles is obtained. When the difference is substantially 0, the processing in the portion is stopped; otherwise, the processing is controlled to be continuously performed.

Even when the laser processing is performed in the atmosphere, high-pressure air or low-pressure air the effect of the present embodiment can be confirmed.

In the present embodiment the processed film on the alignment mark is completely removed, but the present invention is not limited to this. For example, when the alignment mark can be detected by the optical system for use in the alignment measurement, the processing may also be ended with the slight amount of the processed film remaining in the processed region.

Seventh Embodiment

Next, a method of removing the particles scattered to the inside/outside of the whole region to be ablated will be described.

Figure 24A:
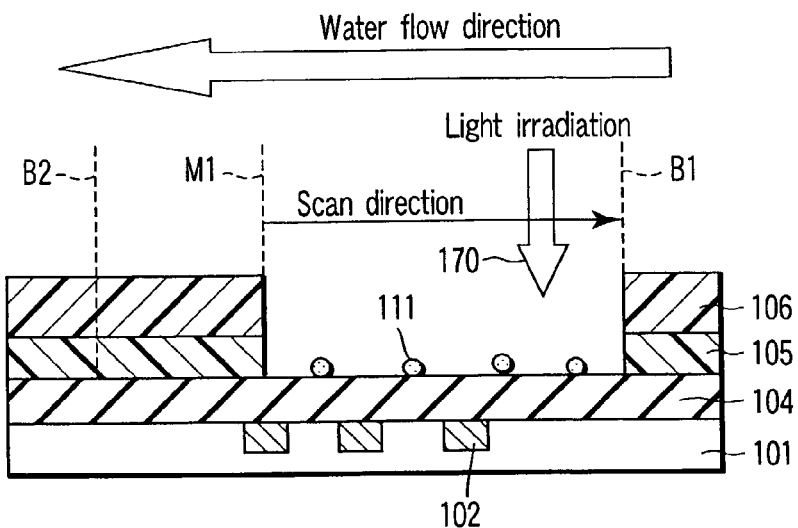
FIGS. 24A to 24C are sectional views showing the manufacturing steps of the semiconductor device according to a seventh embodiment.
Figure 24B:
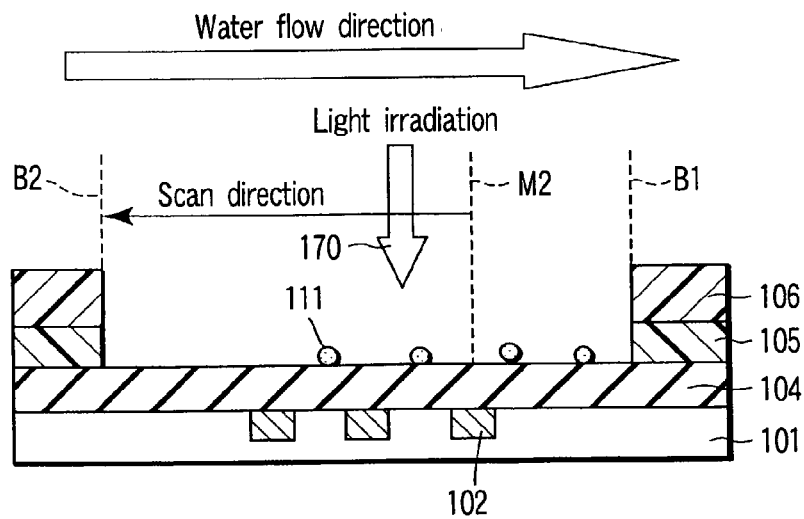
Figure 24C:
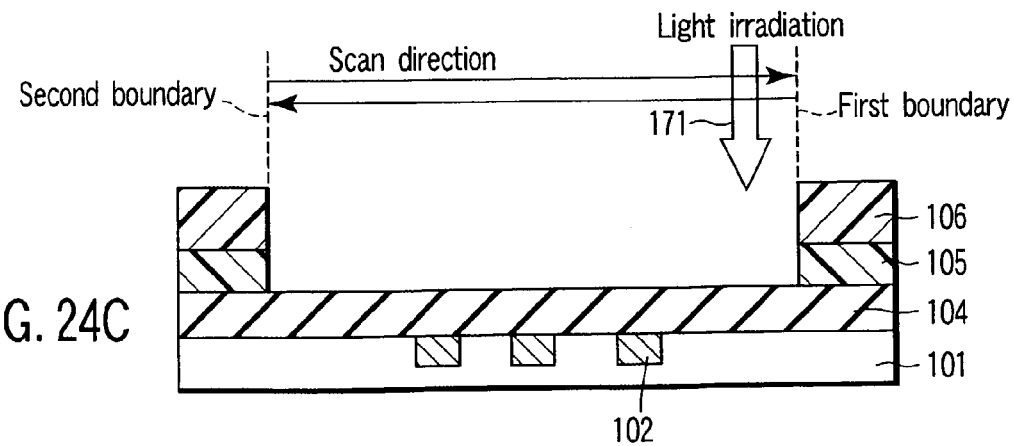

FIGS. 24A to 24C are sectional views showing the manufacturing steps of the semiconductor device according to a seventh embodiment of the present invention. It is to be noted that in FIGS. 24A to 24C, the same parts as those of FIG. 1B are denoted with the same reference numerals and the description thereof is omitted.

In the present embodiment, the substrate submerged in a flowing liquid is exposed with the light.

As shown in FIG. 24A, an exposure region 170 shaped in the slit shape is scanned to a first edge B1 from a first start point M1 in the whole region to be ablated. At this time, the direction of the flow of the solution by the solution flow unit is a substantially antiparallel direction against the scan direction. That is, the an exposure region 170 moves toward an upstream side of the solution flow. Since the particles flow with the liquid flow, the particles 111 stick in the whole region to be ablated and on the downstream side of the liquid flow.

Next, as shown in FIG. 24B, the exposure region 170 is scanned to a second edge B2 from a second start point M2 between the first start point M1 and first edge B1. At this time, the flow of the solution 239 by the solution flow unit 237 at a first scanning is reversed.

When the exposure region is relatively scanned against the whole region to be ablated in this manner, the whole region to be ablated is processed. Even in this state, by the flow of the solution 239 by the solution flow unit 237, the particles do not exist outside the whole region to be ablated, and all remain in the whole region to be ablated.

Subsequently, as shown in FIG. 24C, an exposure region 171 is repeatedly reciprocated/scanned in the whole region to be ablated, and the particles remaining in the whole region to be ablated are removed.

Moreover, by the repeated reciprocating scan, the new particles can be prevented from being generated from the edge of the whole region to be ablated. Therefore, as described above in the embodiments, the view field setting system is varied in the vicinity of the edge of the whole region to be ablated. Thereby, the exposure region is reduced, the scan speed is reduced, and an optimum method is appropriately selected without any sticking particle.

Furthermore, instead of the exposure with the slit shaped light, as described in the sixth embodiment, the shape of exposure region is changed to the shape substantially having the size of the whole region to be ablated, and the collective exposure may also be performed.

In this process, the observation system 220 constituted of the CCD camera is used to count the particles inside/outside the whole region to be ablated. Subsequently, the image is stored before/after the laser irradiation, and the difference of the number of particles is obtained. When the difference is substantially 0, the processing in the portion is stopped; otherwise, the processing is controlled to be continuously performed.

When the above-described method is used, it is possible to ablate the region without any sticking particle inside/outside the whole region to be ablated.

When the exposure region is scanned from the vicinity of the processed region middle as in the present embodiment, the laser beam is preferably scanned in a direction opposite to that of the flow of the solution 239 by the solution flow unit 237 to further inhibit the particles from sticking.

In the present embodiment, the processed film on the alignment mark is completely removed, but the present invention is not limited to this. For example, when the alignment mark can be detected by the optical system for use in the alignment measurement, the processing may also be ended with the slight amount of the processed film remaining in the processed region.

Eighth Embodiment

In the method described in the second to seventh embodiments, the generated amount of particles can be reduced. However, an area which can be ablated once is small, a scan time for the whole region to be ablated is consumed, and this causes a problem that the throughput largely drops.

Figure 25A:
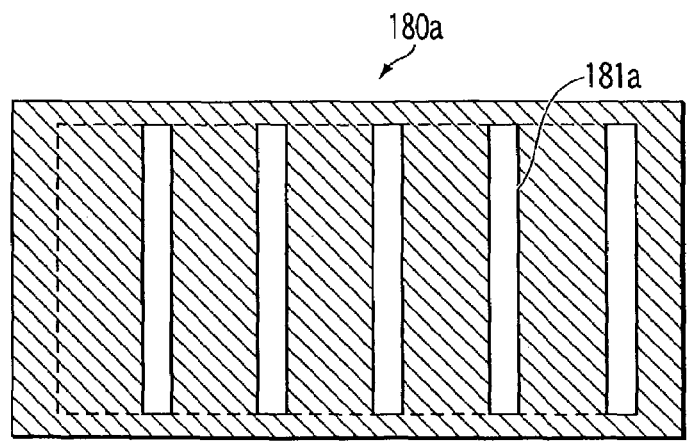
FIGS. 25A to 25C are plan views showing diaphragms mounted in an S/D diaphragm system according to an eighth embodiment.
Figure 25B:
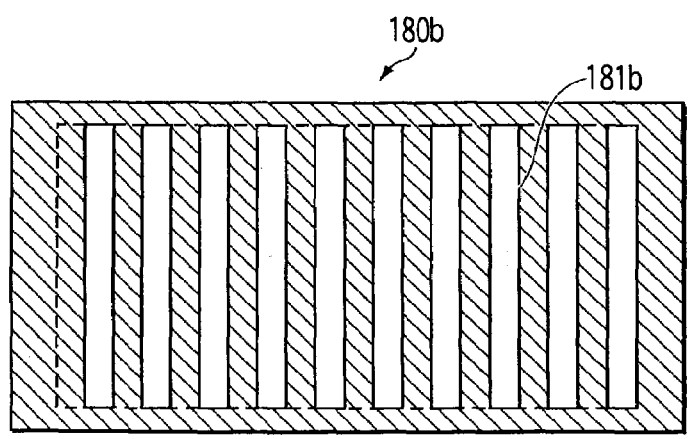
Figure 25C:
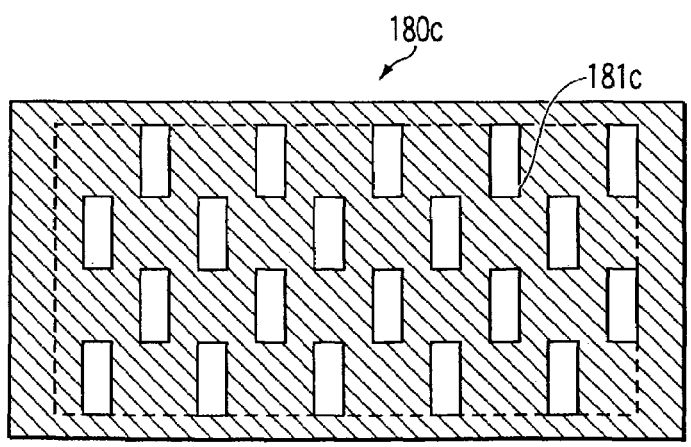

To solve the problem, in the present embodiment, on order to largely shorten the treatment time, a mask in which a plurality of slit-shaped or dot-shaped apertures of the slit/dot diaphragm system are disposed is used to shape the laser beam. Examples of the mask are shown in FIGS. 25A to 25C. FIGS. 25A to 25C are plan views showing the masks mounted in the Slit/dot diaphragm system according to an eighth embodiment of the present invention. In masks 180a, 180b shown in FIGS. 25A and 25B, a plurality of slit-shaped apertures 181a, 181b are formed. Moreover, a plurality of dot-shaped apertures 181c are formed in a mask 180c shown in FIG. 25C.

When a pitch of a plurality of apertures disposed in the mask is less than twice the length of the aperture of a pitch direction, the lights passed through the adjacent apertures diffract each other. As a result, since the substrate is exposed with an interference light, abnormality is caused in the processed shape.

Therefore, the pitch of the plurality of apertures disposed in the mask is preferably not less than twice the length W of the aperture of the pitch direction. The light having the shape analogous to that of the aperture formed in the mask is incident upon the substrate.

The pitch of the plurality of apertures disposed in the mask which are adjacent to each other in the scan direction is set to be ½ or less of the length of the whole region to be ablated of the scan direction. Thereby, the treatment time can be shortened.

It is to be noted that the lights interfere with each other even with the pitch of 2 W or more and the irradiation shape cannot be kept to be rectangular. In this case, the pitch may set to be large.

Furthermore, it is preferable to adjust the pitch of the apertures disposed adjacent to each other in the scan direction in the mask so that the pitch of the processing lights emitted adjacent to each other in the scan direction on the substrate is larger than a diameter of the bubble generated by the irradiation with the processing light. The pitch of the processing lights which is disposed adjacent to each other in the scan direction and with which the substrate is irradiated is not more than the diameter of the bubble generated by the irradiation with the processing light. Then, the bubbles generated adjacent to each other contact each other. As a result, irregular disturbance is further caused in the laser beam, and it becomes difficult to accurately process the region.

Figure 26A:
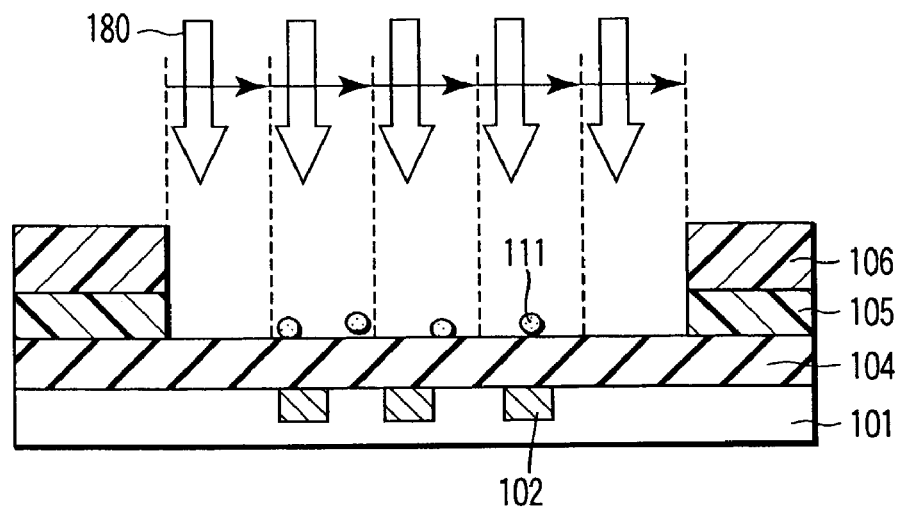
FIGS. 26A and 26B are sectional views showing the manufacturing steps of the semiconductor device according to the eighth embodiment.
Figure 26B:
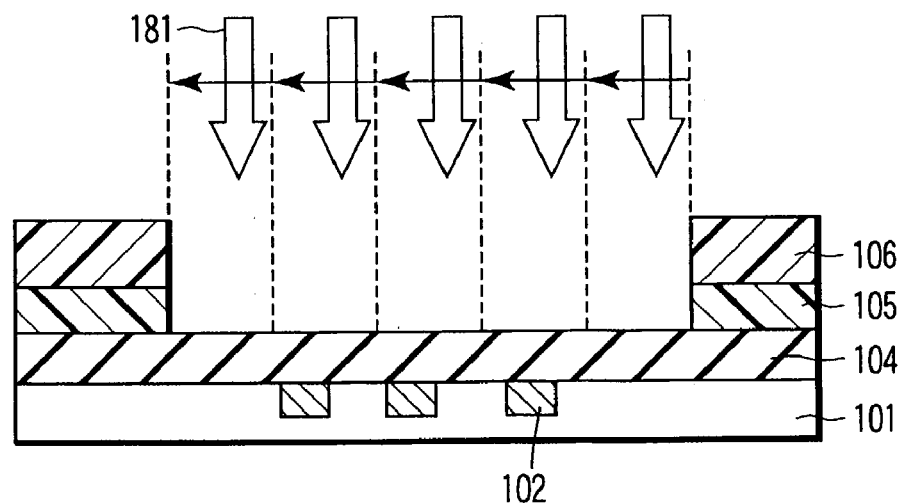

FIGS. 26A and 26B are sectional views showing the manufacturing steps of the semiconductor device according to the eighth embodiment of the present invention. In FIGS. 26A and 26B, the same parts as those of FIG. 1B are denoted with the same reference numerals and the description thereof is omitted.

As shown in FIGS. 26A and 26B, a plurality of slit-shaped laser beams 180, 181 are reciprocated/scanned in the whole region to be ablated to remove the anti-reflection film 105, resist film 106, and particles 111.

For the processing, the slit/dot diaphragm may be fixed and the substrate may be moved to process the whole region to be ablated by the relative scan. Here, the substrate is fixed and the slit/dot diaphragm is moved to remove the whole region to be ablated.

Since the distance to scan the each exposure region is reduced, a time required for processing the whole region to be ablated is reduced in inverse proportion to the number of disposed slits.

Moreover, by the repeated reciprocating exposure, the particles sticking to the whole region to be ablated are removed. Thereby, the particles can be prevented from sticking into the processed region, and additionally the treatment time can largely be shortened.

In this process, the observation system 220 constituted of the CCD camera is used to count the particles inside/outside the whole region to be ablated. Moreover, the image is stored before/after the, and the difference is obtained. When the difference is substantially 0, the processing in the portion is stopped; otherwise, the processing is controlled to be continuously performed.

Moreover, here, a plurality of slit-shaped exposure regions are relatively scanned against the whole region to be ablated to remove the anti-reflection film or resist film. However, the shape of the exposure region is not limited to the slit shape. As shown in FIG. 25C, a plurality of dot-shaped divided regions may be disposed and reciprocated/scanned within the processed region.

Additionally, with the arrangement of the dot shapes, light intensity weakens in the edge of the multi-slit exposure region, the multi-slit exposure region is scanned, and an unprocessed region is formed in a long-side direction in the whole region to be ablated. At this time, the dots are arranged so that the long sides of the dots overlap with each other at scanning. When the plurality of dots are arranged in this manner, the processing is possible without any unprocessed region or without any particle sticking onto the treated substrate.

In the present embodiment, as shown in FIGS. 26A and 26B, the exposure region is reciprocated/scanned to remove the whole region to be ablated, but the present invention is not limited to this. Even when the exposure region 180, 181 are scanned in any one direction for periods twice the number of reciprocations performed in FIGS. 26A and 26B, the processed surface is exposed with the same amount of beams. At this time, the length of the scan direction of the region in which a plurality of slits are formed in the slit/dot diaphragms is preferably not less than the predetermined number of scans of the whole region to be ablated multiplied by the length of the scan direction of the aperture of the view field diaphragm. The length of the region in which the slits are formed is set by multiplying the length of the aperture analogous to the whole region to be ablated by the number of scans. Then, the necessary number of scans of the laser beam can be performed without stopping the slit/dot diaphragm. When the processing is performed without stopping the slit/dot diaphragm, the reciprocating movement of the slit/dot diaphragm and the adjustment of the laser beam can be omitted, and the processing time can be shortened.

Therefore, the pitch of the plurality of apertures arranged in the mask is preferably twice or more times the length W of the aperture of the pitch direction. The light having the shape analogous to that of the aperture formed in the mask is incident upon the substrate.

At this time, in consideration of the alignment precision, the scan speed of the multi-slits in the vicinity of the boundary or the predetermined processed region, and irradiation energy or area in the irradiation region are controlled to prevent the particles from being generated. For the method, in consideration of the generated situation of the particles and arrangement of the slits, an optimum method may appropriately be selected.

Even when the laser processing is performed in the atmosphere, high-pressure air or low-pressure air the effect of the present embodiment can be confirmed.

In the present embodiment, the processed film on the alignment mark is completely removed, but the present invention is not limited to this. For example, when the alignment mark can be detected by the optical system for use in the alignment measurement, the processing may also be ended with the slight amount of the processed film remaining in the processed region.

Ninth Embodiment

In a ninth embodiment, a method of shortening the treatment time and additionally removing the particles flied/scatted inside/outside the whole region to be ablated will be described.

Figure 27A:
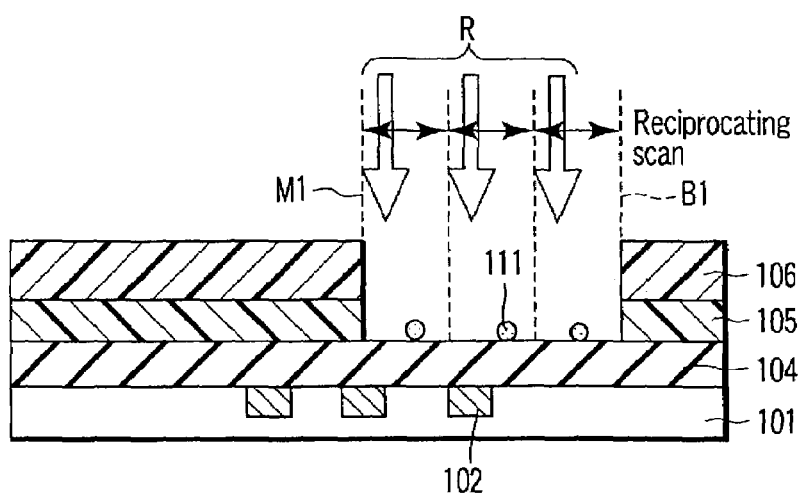
FIGS. 27A and 27B are sectional views showing the manufacturing steps of the semiconductor device according to a ninth embodiment.
Figure 27B:
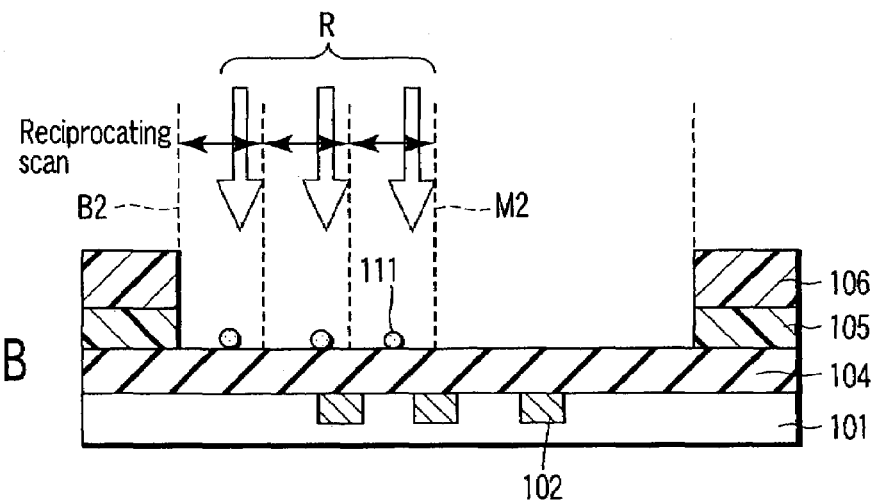
Figure 28:
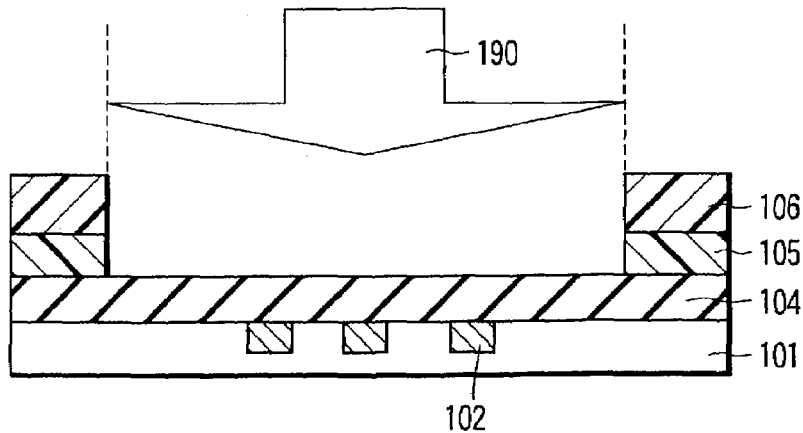
FIG. 28 is a sectional view showing the manufacturing step of the semiconductor device according to the ninth embodiment.

FIGS. 27A, 27B and 28 are sectional views showing the manufacturing steps of the semiconductor device according to the ninth embodiment of the present invention. In the present embodiment, the substrate submerged in the flowing liquid is irradiated with the light.

As shown in FIG. 27A, a multi-slit exposure region R is reciprocated/scanned between the first start point in the whole region to be ablated and first end (edge 1). At this time the direction of the liquid flow is changed in accordance with the scan direction so that the scan direction is antiparallel the direction of the liquid flow. In this state, since the particles flow in the liquid flow, the particles stick in the whole region to be ablated and on the downstream side of the liquid flow.

The start point is set so that an interval between the start point and the end of whole region to be ablated on a first scan direction side is not less than the width of the multi-slit exposure region R. If the interval is not more than the width of the multi-slit exposure region R, the outside of the processed region is processed.

Subsequently, as shown in FIG. 27B, the multi-slit exposure region R is reciprocated/scanned to the other end (edge 2) disposed opposite to a edge 1 of the whole region to be ablated from the second start point. The direction of the liquid flow is changed in accordance with the direction of the scan so that the direction of the scan is antiparallel that of the liquid flow (the direction of the liquid flow is reverse to the direction to the first boundary from the first start point). Even in this state, since the particles flow in the liquid flow, the particles do not stick to the outside of the processed region, and all remain in the whole region to be ablated.

Subsequently, as shown in FIG. 28, a laser beam 190 having substantially the same size as that of the processed region is emitted. By the irradiation with the laser beam 190, the particles which cannot completely be removed by the reciprocating scan of the multi-slit irradiation region R and which remain in the processed region are removed.

In the processing process, the observation system 220 constituted of the CCD camera is used to count the particles inside/outside the processed region. Moreover, the image is stored before/after the exposure, and the difference is obtained. When the difference is substantially 0, the processing in the portion is stopped; otherwise, the processing is controlled to be continuously performed.

In the present embodiment, the exposure region in the second and subsequent exposure is changed/reduced by focus shift, but the present invention is not limited to this. For example, a zoom function is imparted to the image forming optical system 216 of FIG. 2, and magnification in the second and subsequent exposure may be slightly reduced for the exposures.

With the use of the above-described method, the multi-slits are used to remarkably shorten the treatment time, and the processed shape can be obtained without any sticking particle inside/outside the whole region to be ablated.

Even when the laser processing is performed in the atmosphere, high-pressure air or low-pressure air the effect of the present embodiment can be confirmed.

In the present embodiment, the processed film on the alignment mark is completely removed, but the present invention is not limited to this. For example, when the alignment mark can be detected by the optical system for use in the alignment measurement, the processing may also be ended with the slight amount of the processed film remaining in the processed region.

Tenth Embodiment

Figure 29A:
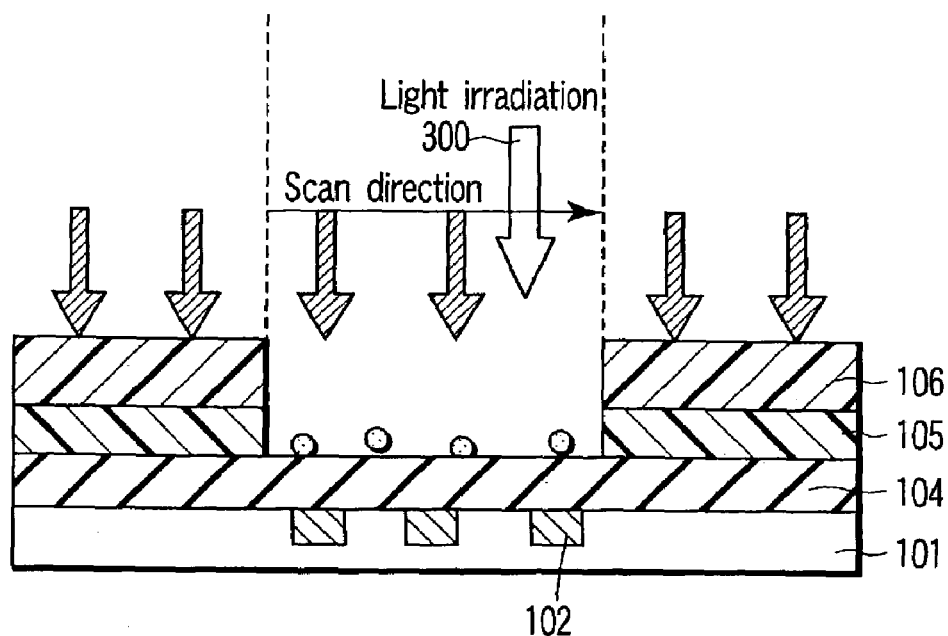
FIGS. 29A and 29B are sectional views showing the manufacturing steps of the semiconductor device according to a tenth embodiment.
Figure 29B:
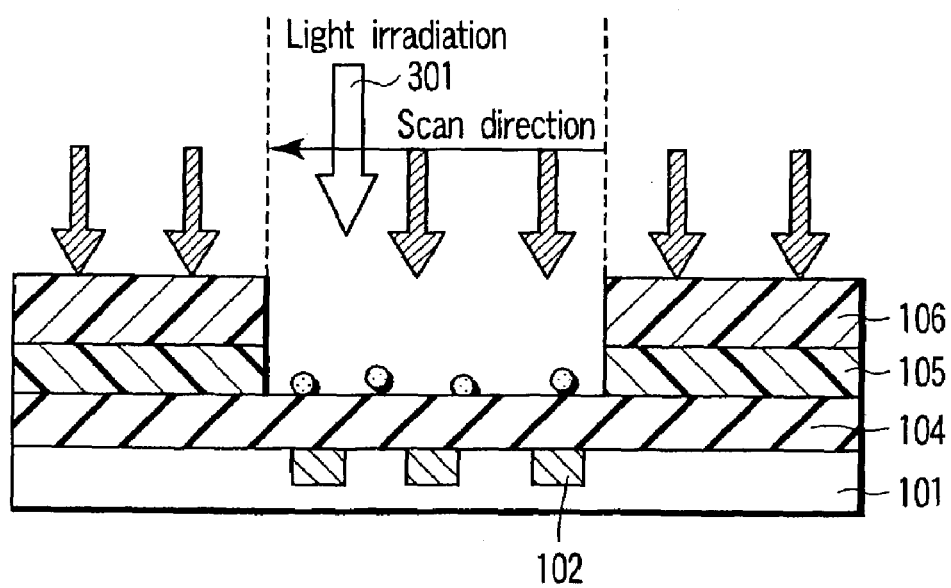

FIGS. 29A and 29B are sectional views showing the manufacturing steps of the semiconductor device according to a tenth embodiment of the present invention. It is to be noted that in FIGS. 29A and 29B, the same parts as those of FIG. 1B are denoted with the same reference numerals and the description thereof is omitted. Concretely, a pressure control unit is added to the air current unit shown in FIG. 2, and the processed region of the circulated solution is controlled.

As shown in FIGS. 29A and 29B, in a state in which a pressure of 10 atm is added to the substrate, exposure region 300, 301 shaped in the slit shapes are reciprocated/scanned against the substrate to remove the whole region to be ablated of the anti-reflection film 105 and resist film 106.

As a result, as compared with the processing in the similar method at atmospheric pressure, the bubble diameter generated at the exposing can be reduced, and the number of particles sticking to the inside/outside of the whole region to be ablated can be remarkably reduced.

In the processing process, the observation system 220 constituted of the CCD camera is used to count the particles inside/outside the processed region. Moreover, the image is stored before/after the exposure, and the difference is obtained. When the difference is substantially 0, the processing in the portion is stopped; otherwise, the processing is controlled to be continuously performed.

Moreover, also in the present embodiment, in the same manner as in the above-described other embodiments, in consideration of the alignment precision of the whole region to be ablated against the position of exposure region, in order to prevent the edge of the whole region to be ablated from being exposed and to prevent new particles from being generated, the area of the exposure region can be reduced in the edge of the whole region to be ablated. Alternatively, the scan speed of the exposure region against the whole region to be ablated is reduced. For the method, an optimum method is appropriately selected in which only a small amount of particles stick.

In the present embodiment, the processed film on the alignment mark is completely removed, but the present invention is not limited to this. For example, when the alignment mark can be detected by the optical system for use in the alignment measurement, the processing may also be ended with the slight amount of the processed film remaining in the processed region.

Eleventh Embodiment

In an eleventh embodiment, a method will be described comprising: considering the alignment precision of the poison of exposure region against the whole region to be ablated; and reducing the area of the exposure region at the second and subsequent scans.

In the present embodiment, the method will be described comprising: changing a focal position in which the image is formed in the whole region to be ablated on the substrate to control the area of the exposure region and to prevent the particles generated from the edge of the whole region to be ablated from sticking into the whole region to be ablated.

Figure 30A:
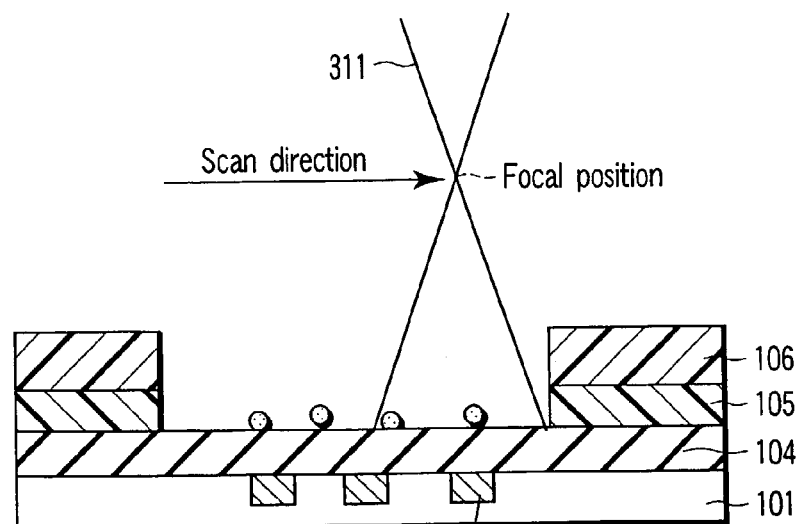
FIGS. 30A and 30B are sectional views showing the manufacturing steps of the semiconductor device according to an eleventh embodiment.

First, as shown in FIG. 30A, in the same manner as in the above-described embodiments, a first processing light 311 whose exposure region on the substrate is thinned to be smaller than the whole region to be ablated is relatively scanned against the whole region to be ablated to remove the anti-reflection film 105 and resist film 106 of the processed region.

Additionally, at this time, instead of forming the image on the anti-reflection film 105 which is a processing object, a distance between the optical system and substrate 100 is intentionally set so that a light distribution can spread on the anti-reflection film 105.

Therefore, the region actually exposed with the light on the anti-reflection film becomes larger than the region restricted by the view field setting system. On the other hand, an energy density per pulse weakens as the light distribution spreads. Therefore, the energy density per pulse is appropriately controlled so as to prevent the region having a light intensity necessary for the processing in the spread light from having a size which is not more than a desired size.

Instead of forming the image on the anti-reflection film 105 which is the processing object, the distance between the optical system and substrate 100 intentionally set so that the light distribution spreads on the anti-reflection film. At this time, conditions of a distance D between the image forming position and treatment substrate are as follows:

(1) the distance D is different from at least a best focus; and (2) it is assumed that a deviation amount between the exposure position of the laser beam and the substrate by the alignment error, or processing allowance is Δ, and the distance D is set so as to satisfy the following equation:

$$D > \{\Delta \times \{(1-NA^2)^{1/2}\}/NA,$$

wherein NA denotes a numerical aperture of the optical system such as the condenser lens.

In consideration of the alignment precision of the irradiation position with the laser beam and the substrate to be treated and the error including the influence of the fluctuation of the solution film on the substrate to be treated, an optimum D which satisfies the above-described conditions is appropriately selected so that the edge of the processed region is not exposed with the light.

Figure 30B:
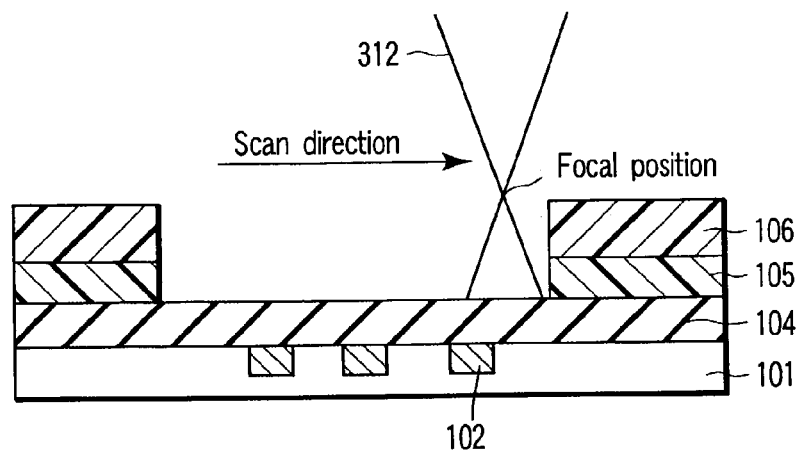

Subsequently, as shown in FIG. 30B, a second exposing light 312 is relatively scanned against the whole region to be ablated. Before the second and subsequent scans, the distance between the optical system and previously treated substrate is set in the image forming position. By this setting, the region of the second or subsequent scan can be set to be substantially narrower than that of the first scan. This can prevent the particles from being generated in the processed region edge.

In the processing process, the observation system 220 constituted of the CCD camera is used to count the particles inside/outside the processed region. Moreover, the image is stored before/after the exposure, and the difference is obtained. When the difference is substantially 0, the processing in the portion is stopped; otherwise, the processing is controlled to be continuously performed.

In the present embodiment, the processed film on the alignment mark is completely removed, but the present invention is not limited to this. For example, when the alignment mark can be detected by the optical system for use in the alignment measurement, the processing may also be ended with the slight amount of the processed film remaining in the processed region.

Twelfth Embodiment

In a twelfth embodiment, a method of removing the anti-reflection film of the lower layer or reducing the film thickness without removing the resist film of the upper layer will be described.

For the light source for the irradiation, a pulse laser of a third higher harmonic wave (wavelength 355 nm) of Q-Switch Nd-YAG laser was used. An energy density per pulse is usually 0.03 J/cm²·pulse to 0.15 J/cm²·pulse. This energy density per pulse is smaller than that for ablating/removing both the resist film and anti-reflection film. The energy density per pulse is appropriately set such that the resist film of the upper layer is not destroyed by the abrasion of the anti-reflection film.

Figure 31:
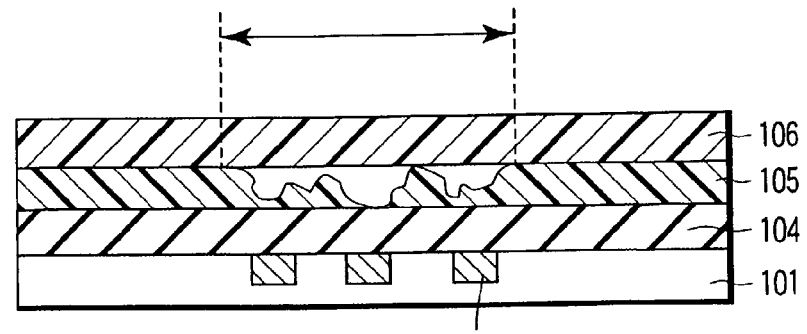
FIG. 31 is a sectional view showing the manufacturing step of the semiconductor device according to a twelfth embodiment.

FIG. 31 shows a section at exposing of the whole region to be exposed with the size of exposure region having substantially the same size as that of the whole region to be exposed. FIG. 31 is a sectional view showing the manufacturing step of the semiconductor device according to the twelfth embodiment of the present invention. In FIG. 31, the same parts as those of FIG. 1B are denoted with the same reference numerals and the description thereof is omitted.

As seen from FIG. 31, without destroying the resist film 106, the anti-reflection film 105 is removed. Moreover, any sticking particle was not observed on the resist film 106.

In the related-art removing by laser abrasion, the exposure light is transmitted through the resist film, ablation (explosion) occurs in the anti-reflection film, and scattered materials of the resist film and anti-reflection film stick to the vicinity of the removed region. On the other hand, when an irradiation amount is reduced to 0.03 J/cm²·pulse, momentary explosion does not occur. As a result, it is considered that a gas generated from the anti-reflection film by the exposure is exhausted from a porous resist film.

When the region is exposed with the energy density per pulse smaller than that for the removing by the related-art ablation, only the anti-reflection film 105 is vaporized, and the particle generation around the removed portion can be eliminated.

However, under the influence of an optical profile, a removed region and incompletely removed region exist in a mixed manner in the whole region to be exposed of the anti-reflection film 105. This result indicates that the anti-reflection film is gradually vaporized and removed so as not to destroy the resist film and this is remarkably influenced by the optical profile.

To solve the problem, the exposure region of laser beam having the slit shape is relatively scanned against the whole region to be exposed to remove the anti-reflection film of the processed region.

Results are shown in FIGS. 32A to 32C. FIGS. 32A to 32C are sectional views showing the manufacturing steps of the semiconductor device according to the twelfth embodiment of the present invention. In FIGS. 32A to 32C, the same parts as those of FIG. 1B are denoted with the same reference numerals and the detailed description thereof is omitted.

A state obtained after scanning the exposure region once is shown in FIG. 32A. Moreover, a state obtained after scanning the exposure region twice is shown in FIG. 32B. Furthermore, a state obtained after scanning exposure region three times is shown in FIG. 32C.

As seen from FIG. 32C, when the number of scans of exposure region is increased, the anti-reflection film is more uniformly removed.

With the use of the above-described method, it is concluded that without destroying the resist film, the anti-reflection film can be uniformly removed.

In the present embodiment, the laser beam is used as the exposure light, but it is also possible to emit the light having the wavelength absorbed by the anti-reflection film, such as the light of a KrF excimer lamp. Moreover, as the exposure method, the method described in the first embodiment is used, but any method of the above-described embodiments may appropriately be selected as a method in which any particle sticks.

For the light source for the exposure in the present embodiment, the pulse laser of the third higher harmonic wave of Q-Switch Nd-YAG laser was used, but the present invention is not limited to this. An absorption coefficient of the anti-reflection film is larger than, preferably twice or more that of the resist film formed in the upper layer. When the wavelength satisfies this condition, a fourth higher harmonic wave (wavelength 266 nm) of the Q-Switch Nd-YAG laser and pulse laser such as a KrF excimer laser may also be used.

Moreover, the energy density per pulse in the present embodiment is set to 0.03 J/cm²·pulse to 0.15 J/cm²·pulse, but this is not limited. It is important to optimize parameters so as to prevent the resist film, which is the upper-layer film, from bumping.

Furthermore, the exposure shape is not limited to the long slit shape, and the dot shape or the arrangement of a plurality of the shapes may appropriately be selected.

Additionally, in the present embodiment, the energy density per pulse irradiation amount in removing the anti-reflection film is set to 0.03 J/cm$^2$·pulse, but the present invention is not limited to this. Any irradiation amount may be used, as long as the anti-reflection film can be removed to form a hollow region. Moreover, instead of removing all the anti-reflection films, the energy density per pulse is further reduced, and the film thickness is thinned to such an extent that the alignment light can be detected. Even in this case, a similar effect is obtained.

13th Embodiment

A method of selectively removing only the anti-reflection film formed on the alignment mark will be described hereinafter with reference to the drawings. In a 13th embodiment, the present invention is applied, when a pattern transfer film (intermediate film) is disposed between the resist and anti-reflection film. Since details of the treated substrate are the same as those of the first embodiment, they are omitted here. First a method of forming a resist pattern on the substrate to be treated will be described.

Figure 33A:
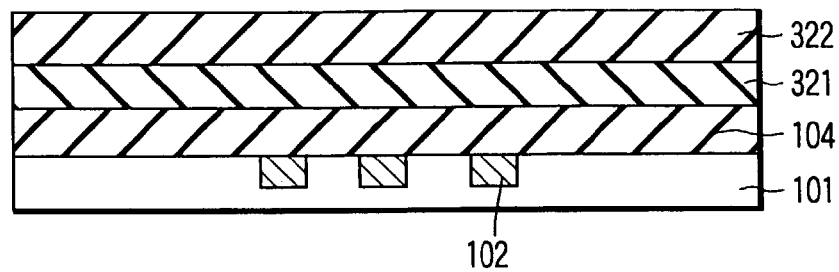
FIGS. 33A to 33C are sectional views showing the manufacturing steps of the semiconductor device according to a 13th embodiment.
Figure 33B:
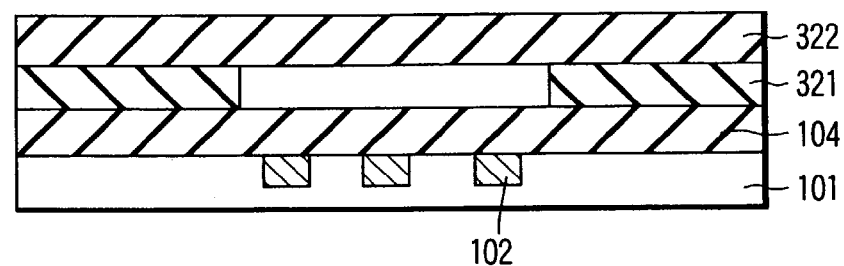
Figure 33C:
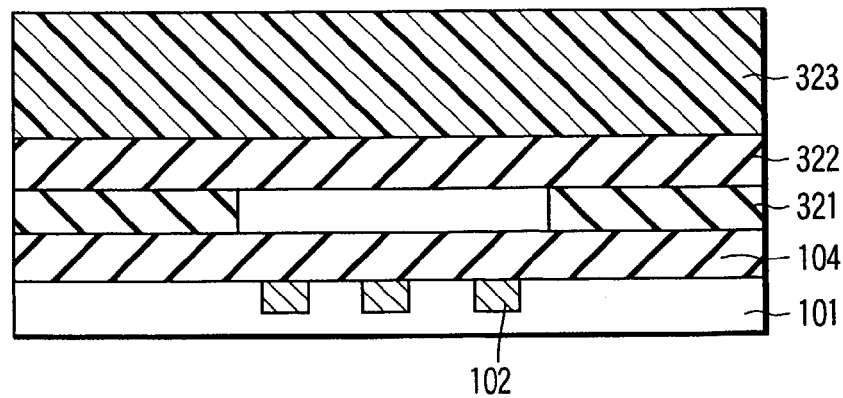

FIGS. 33A to 33C are sectional views showing the manufacturing steps of the semiconductor device according to the 13th embodiment of the present invention. It is to be noted that in FIGS. 33A to 33C, the same parts as those of FIG. 1B are denoted with the same reference numerals and the detailed description thereof is omitted.

First, as shown in FIG. 33A, an anti-reflection film 321 having a film thickness of 300 nm is formed on the interlayer insulating film 101 in a rotary application method. Here, as the anti-reflection film 321, an inorganic base material containing fine carbon particles was used. Next, a silicon oxide film 322 which is the pattern transfer film is formed in a film thickness of 80 nm on the anti-reflection film 321 in the rotary application method.

This substrate is transferred to the laser exposure apparatus shown in FIG. 2. Subsequently, by the method described in the above-described embodiment, only the anti-reflection film including the alignment mark 102 and bar in bar mark (not shown) on the region is removed. Details of this method will be described hereinafter (FIG. 33B). In the present embodiment, the fourth higher harmonic wave of the Nd-YAG laser (wavelength 266 nm) was used as the exposure light, and the energy density per pulse was set to 0.025 J/cm$^2$·pulse. Here, energy density per pulse was set in the same manner as in the twelfth embodiment to obtain the hollow state in which only the anti-reflection film is removed. In this case, in the vicinity of the removed region, no sticking particles were observed.

Here, when the energy density per pulse is reduced to 0.025 J/cm$^2$·pulse, different from the related-art laser ablation, no momentary explosions occurred. It is considered that the gas generated by the exposure is exhausted from the intermediate film to prevent the intermediate layer from being flied/scattered.

With the exposure in the energy density per pulse which is smaller than that of the removing by the related-art ablation, only the anti-reflection film is evaporated, and the particle generation around the removed portion can be eliminated.

Thereafter, as shown in FIG. 33C, a chemical amplification type positive resist film 323 having a film thickness of 300 nm for an ArF light (wavelength 193 nm) is formed in the rotary application method.

Furthermore, the method comprises: transferring the substrate to be treated to a step and repeat type reduction projecting exposure apparatus in which the ArF excimer laser is used as the light source; aligning the pattern to be exposed with the substrate to be treated in an ETTR process; and thereafter exposing the desired pattern in the substrate to be treated. Thereafter, the method comprises: performing heating treatment referred to as post exposure bake (PEB); and developing the image with an alkali developing solution to form the desired resist pattern.

When only the anti-reflection film is removed in a state free of particles, high-precision alignment can be realized without deteriorating the yield.

In the present embodiment, the fourth higher harmonic wave of the Nd-YAG laser was used as the light source in removing the anti-reflection film, but the present invention is not limited to this. It is preferable to select the light source in accordance with an optical constant of the film to be removed.

Moreover, in the present embodiment, the energy density per pulse in removing the anti-reflection film is set to 0.025 J/cm$^2$·pulse, but the present invention is not limited to this. As long as the anti-reflection film can be removed to form the hollow region, any irradiation amount may be used. Moreover, instead of removing all the anti-reflection films, the energy density per pulse is further reduced, and the film thickness is thinned to such an extent that the alignment light can be detected. In this case also, a similar effect is obtained.

Moreover, it can be confirmed that the alignment with respect to the bar in bar mark results in good-precision superposition. In the related art, since the anti-reflection film is also formed on the bar in bar mark, the precision of the check has heretofore been bad.

14th Embodiment

In the above-described embodiment, the method of removing at least the anti-reflection film for use in the lithography process by the irradiation in ETTR alignment has been described.

On the other hand, in the semiconductor device, films opaque to the exposure wavelength for use in the lithography process are formed such as a polyimide film, Si polycrystalline film, organic interlayer insulating film, silicon nitride film, and silicon carbide film. When these opaque films are formed on the alignment mark, a problem occurs that aliment mark can not be detected by the ETTR alignment.

In the present embodiment, a method of removing these opaque films will be described.

FIGS. 34A to 34F are sectional views showing the manufacturing steps of the semiconductor device according to a 14th embodiment of the present invention.

As shown in FIG. 34A, a semiconductor device 400 being manufactured is prepared. Alignment marks 402 and element separation insulating films 403 formed of SiO$_2$ are formed on an Si substrate 401. An interlayer insulating film 406 formed of an organic material is formed on the Si substrate 401 and alignment marks 402. Semiconductor elements 404 such as a large number of transistors and capacitances are formed in a device pattern region of the Si substrate 401. In this device, the interlayer insulating film 406 formed of the organic material absorbs the exposure wavelength. Therefore, when only the anti-reflection film is removed, aliment mark cannot be detected by the ETTR alignment. It is to be noted that reference numeral 405 denotes a gate insulating film.

In the present embodiment, as shown in FIG. 34B, an anti-reflection film 407 is formed on the interlayer insulating film 406. Next, as shown in FIG. 34C, the anti-reflection film 407 and interlayer insulating film 406 are removed. As the irradiation method, any method described in the above embodiments without any sticking particle is appropriately selected.

Figure 34D:
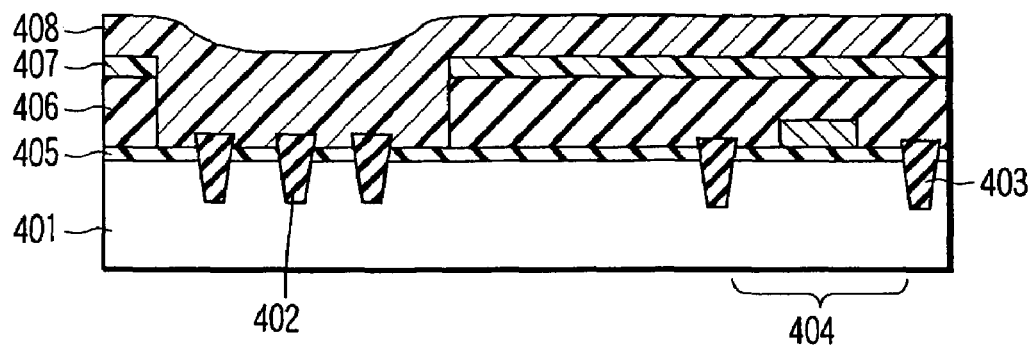

Thereafter, as shown in FIG. 34D, the surface on the anti-reflection film 407 is coated with a resist film 408. In a state shown in FIG. 34D, since a film completely absorbing the exposure light is not formed on the alignment marks 402, it is possible to observe the alignment mark with the exposure wavelength.

Figure 34E:
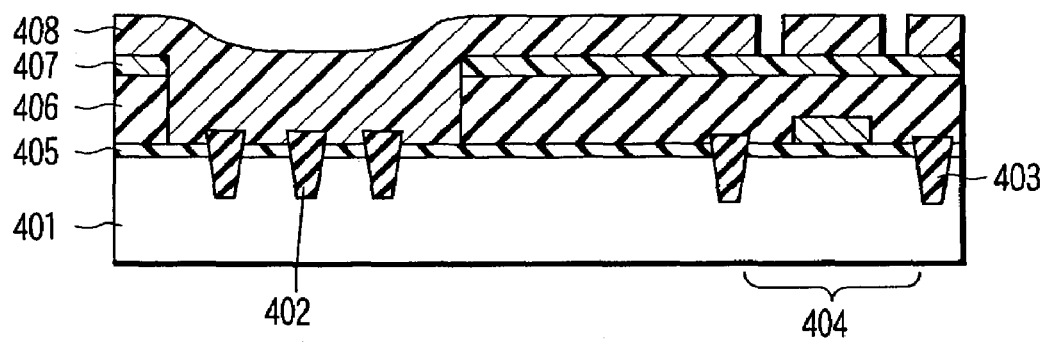

That is, it is possible to detect aliment mark by the ETTR alignment, the alignment is performed with a high precision, and as shown in FIG. 34E, it is possible to pattern the resist.

Figure 34F:
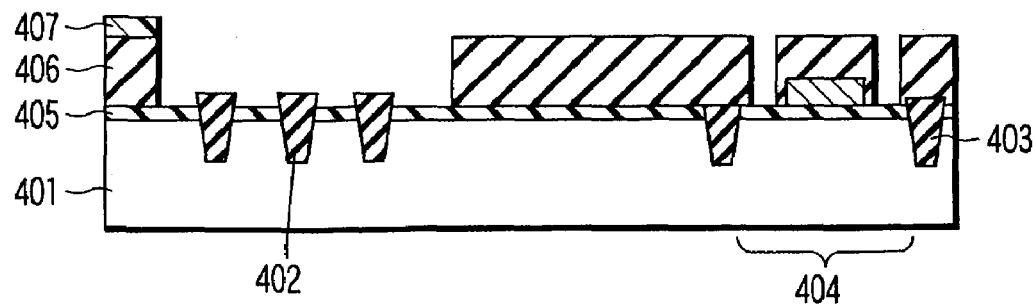

Subsequently, as shown in FIG. 34F, the patterned resist film 408 is used as the mask to pattern the interlayer insulating film 406, and a via-hole can be formed with high precision. Thereafter, the resist film 408 and anti-reflection film 407 are removed.

In the present embodiment, the processed film on the alignment mark is completely removed, but the present invention is not limited to this. For example, when the alignment mark can be detected by the optical system for use in the alignment measurement, the processing may be ended with a slight amount of the processed film remaining in the processed region.

15th Embodiment

The silicon nitride film or silicon carbide film are formed on a Cu wire pattern formed on the semiconductor device in order to inhibit Cu from being diffused into the interlayer insulating film. These films absorb the light having the exposure wavelength. This causes a problem that aliment mark cannot be detected by the ETTR alignment.

FIGS. 35A to 35D are sectional views showing the manufacturing steps of the semiconductor device according to a 15th embodiment of the present invention.

First, as shown in FIG. 35A, a semiconductor device 500 being manufactured is prepared. A first interlayer insulating film 502 formed of SiC is formed on an Si substrate 501. In the first interlayer insulating film 502, alignment marks 503 and Cu wires 504 are buried/formed. A silicon nitride film 505 is formed on the alignment marks 503 and Cu wires 504. A second interlayer insulating film 506 is formed on the silicon nitride film.

Subsequently, as shown in FIG. 35B, the second interlayer insulating film 506 is coated with an anti-reflection film 507 formed of the organic material. Moreover, the anti-reflection film 507, second interlayer insulating film 506, and silicon nitride film 505 are removed by the exposure of the laser beam.

Subsequently, as shown in FIG. 35C, after forming a resist film 508, the high-precision alignment is performed by the ETTR alignment, and resist pattern 508 is formed the pattern for wire trenches.

Subsequently, as shown in FIG. 35D, the wire trenches are formed in the second interlayer insulating film 506 by the RIE process. Thereafter, the resist film 508 and anti-reflection film 507 are removed.

As described above, with the use of the optical processing method of the present invention, in the lithography process, it is possible to detect the alignment mark by the ETTR alignment, and it is possible to form the pattern with high precision.

In the present embodiment, the processed film on the alignment mark is completely removed, but the present invention is not limited to this. For example, when the alignment mark can be detected by the optical system for use in the alignment measurement, the processing may be ended with the slight amount of the processed film remaining in the processed region.

16th Embodiment

Even when a photosensitive polyimide film is formed on the semiconductor device, and the film is patterned by the lithography process, it is possible to apply the optical processing method of the present invention.

Particularly, photosensitive polyimide absorbs not only the exposure wavelength but also visible light, and has a problem that it is difficult to observe the alignment mark formed in the lower layer. Moreover, when the mark formed in the lower layer is a stepped pattern, non-uniformity of the film thickness of the polyimide film on the alignment mark deteriorates the alignment precision, and a large number of alignment defects are generated.

Figure 36A:
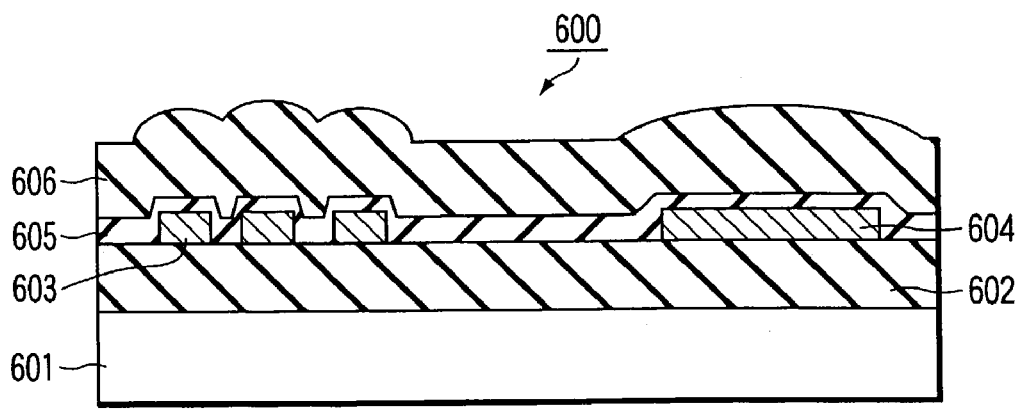
FIGS. 36A to 36C are sectional views showing the manufacturing steps of the semiconductor device according to a 16th embodiment.
Figure 36B:
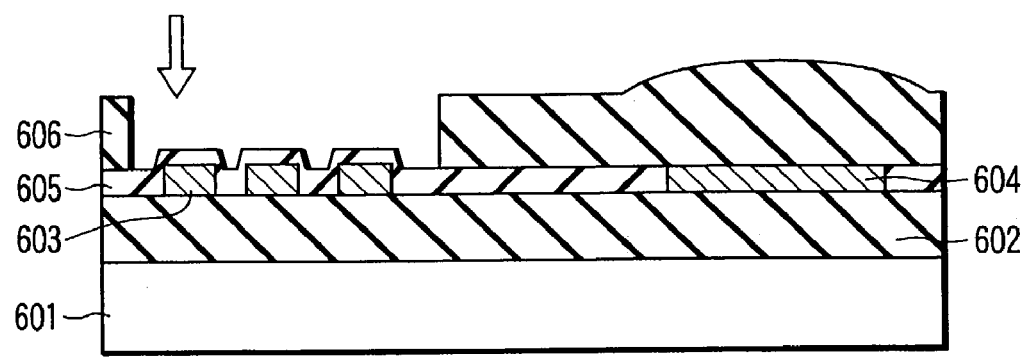
Figure 36C:
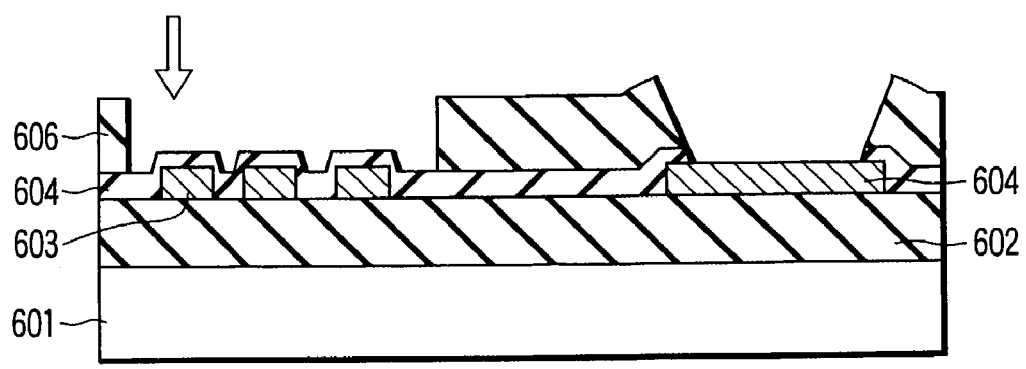

FIGS. 36A to 36C are sectional views showing the manufacturing steps of the semiconductor device according to a 16th embodiment of the present invention.

First, as shown in FIG. 36A, a semiconductor device 600 being manufactured is prepared. In the semiconductor device 600, a first interlayer insulating film 602 is formed on an Si substrate 601. On the first interlayer insulating film 602, alignment marks 603 and Al pad 604 are formed. On the first interlayer insulating film 602, the alignment marks 603 and Al pad 604 are coated with a photosensitive polyimide film 606 via a second interlayer insulating film 605.

As shown in FIG. 36B, the photosensitive polyimide film 606 on the alignment marks 603 is removed by the optical processing method.

Subsequently, when the alignment is performed as shown in FIG. 36C, the mark can be observed with high precision, and alignment defects drastically decrease. FIG. 36C shows a shape obtained after photosensitive polyimide is patterned in the lithography process and thereafter the insulating film on the Al pad is processed by the RIE process.

In the present embodiment, the processed film on the alignment mark is completely removed, but the present invention is not limited to this. For example, when the alignment mark can be detected by the optical system for use in the alignment measurement, the processing may be ended with a slight amount of the processed film remaining in the processed region.

17th Embodiment

The present embodiment shows another example of the optical shaping portion of the optical processing apparatus shown in FIG. 2.

For example, instead of the aperture mask, an optical device (e.g., Digital Micromirror Device (registered trademark of Texas Instruments Co., Ltd.)) may also be used in which a plurality of micro mirrors are two-dimensionally arranged. The mirrors are very small as compared with diameters of the laser beams, and the directions of the respective mirrors can be changed. In the optical device, the directions of the respective micro mirrors are controlled, and it is thereby possible to form an optical image which has an arbitrary size and shape. Therefore, when the directions of the respective micro mirrors constituting this optical device are controlled, the laser beam of the optical image can be emitted in accordance with the size and direction of the mark.

That is, assuming that the laser beams are transmitted through the view field diaphragm system and slit/dot diaphragm system, bright portion+bright portion→bright portion, and other than the above→dark portion, bright/dark portion grid information on a mask surface is generated.

A grid is preferably fine. For example, in a system for reduction to $\frac{1}{20}$ in the projecting optical system, miniaturization of about 5 µm is achieved on the aperture mask (the micro mirrors each having this size are two-dimensionally arranged). The bright/dark portion grid information is imparted to the optical device, angles of the respective micro mirrors are controlled so that only the bright portion is exposed with the light on the substrate, and the substrate is exposed with the laser beam.

Moreover, with the use of this optical system, while the substrate remains stationary, the laser beam can be scanned. When the scanning of the laser beam is assumed, the bright/dark portion grid information is calculated for each process time, and the information may be imparted to the optical device with respect to the corresponding process time and controlled. In this case, only the optical device can be used to process the film.

18th Embodiment

In an 18th embodiment, in the optical processing apparatus shown in FIG. 2, another example of a processing unit having a mechanism for supplying the flowing liquid to the processed region is shown.

Figure 37:
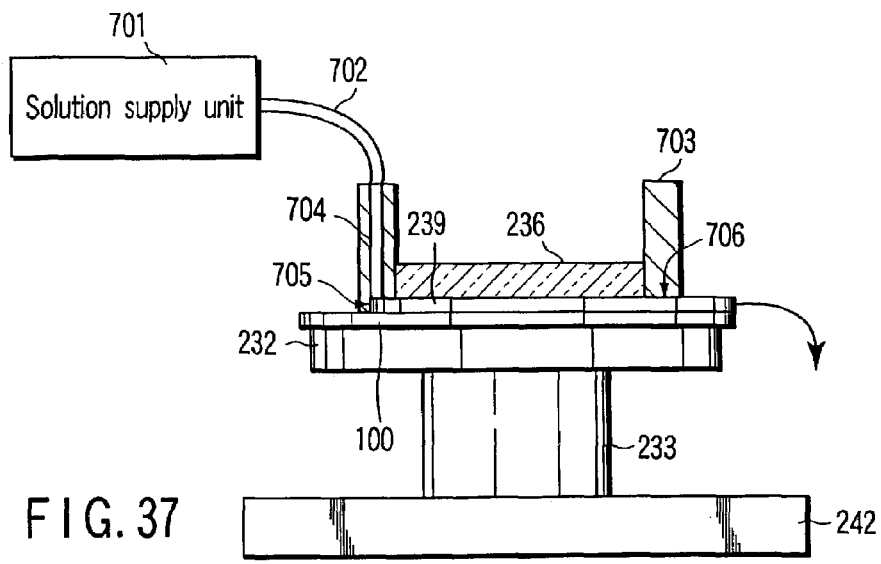
FIG. 37 is a diagram showing a schematic constitution of a processing unit according to an 18th embodiment.

FIG. 37 is a diagram showing a schematic constitution of a processing unit according to the 18th embodiment of the present invention. It is to be noted that in FIG. 37 the same parts as those of FIG. 2 are denoted with the same reference numerals, and the detailed description is omitted.

In this case, a flowing liquid system does not use a circulation system, and the solution 239 is supplied to a flow direction change unit 703 from a solution supply unit 701 via a solution supply pipe 702. The flow direction change unit 703 can rotate with respect to a vertical axis of a main surface on the substrate main surface. In one end of the flow direction change unit 703, a solution guide pipe 704 connected to the solution supply pipe 702 is disposed, and the solution is supplied to the substrate 100 main surface from a spout port 705 in the tip of the pipe. The solution 239 flows between the substrate 100 and window 236, and is discharged via a discharge port 706 disposed in a position opposite to the spout port 705. The discharge port 706 is broadened to such an extent that a turbulent flow is not generated in the solution 239 supplied onto the substrate 100 from the spout port 705. The flow direction change unit 703 is controlled to change the directions of the spout port 705 and discharge port 706 so that the solution has the direction of the flow preset with respect to the relative scan direction of the substrate 100 and laser beam.

Figure 38A:
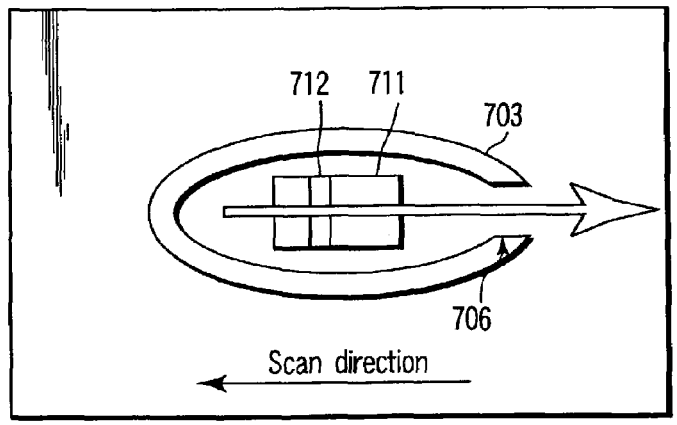
FIGS. 38A and 38B are plan views showing a processing state using the processing unit shown in FIG. 37.
Figure 38B:
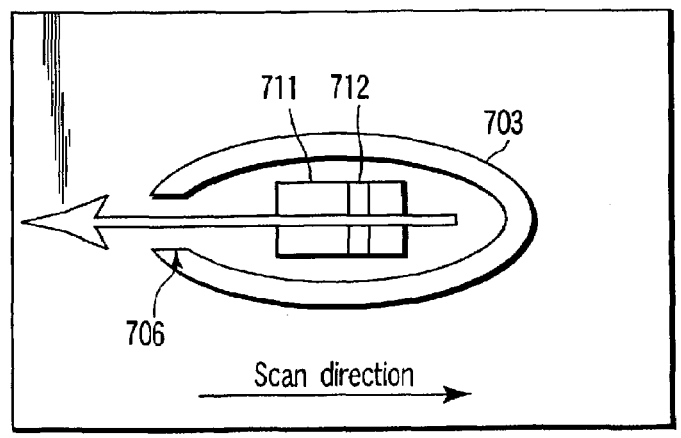

For example, the processing unit can be used in a process of: scanning the laser beam with respect to the region to be processed in one direction from the inside of the desired processed region to process the region and stop the processing in one end; and subsequently scanning the laser beam with respect to the processed region to the other end from the inside of the processed region to process the region. That is, when the liquid flow is generated in a direction opposite to the relative scan direction of the laser beam during the processing, for example, as shown in FIG. 38A, 38B, the flow may be generated. FIGS. 38A and 38B are plan views showing a processing state using the processing unit shown in FIG. 37. It is to be noted that in FIGS. 38A and 38B, the same parts as the above-described parts are denoted with the same reference numerals, and the detailed description is omitted.

As shown in FIG. 38A, when an exposure region 712 moves in a direction to the left of a drawing sheet from the right, the spout port 705 of the flow direction change unit 703 is disposed on the left side of a the whole region to be exposed region 711, and the discharge port 706 is disposed on the right side of the whole region to be exposed to form the liquid flow. Moreover, when the exposure region 712 moves to the right from the left of the drawing sheet, as shown in FIG. 38B, the flow direction change unit 703 or substrate 100 is relatively rotated by 180 degrees around the exposure region 712, the spout port 705 of the flow direction change unit 703 is disposed on the right side of the whole region to be exposed 711, and the discharge port 706 is disposed on the left side of the whole region to be exposed 711 to form the liquid flow.

Figure 39A:
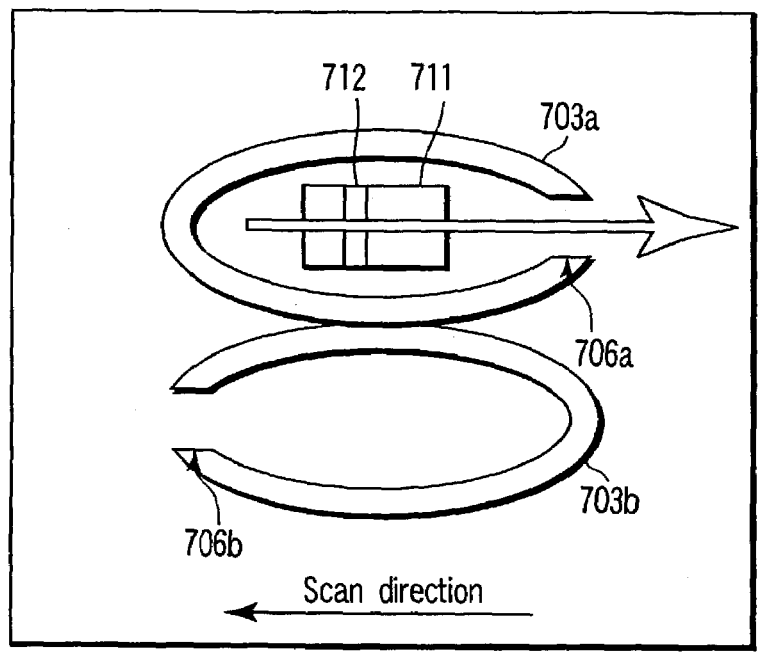
FIGS. 39A and 39B are diagrams showing a constitution of a liquid supply unit.
Figure 39B:
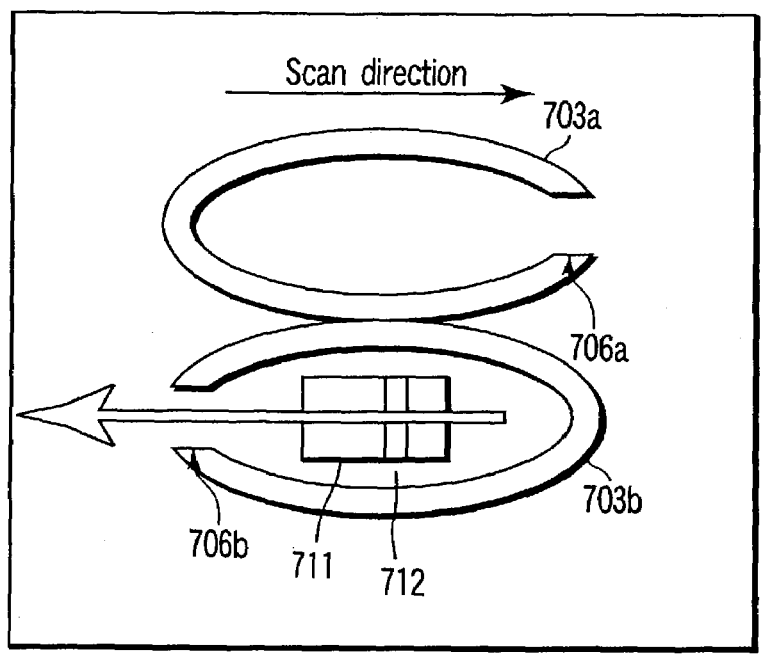

FIGS. 39A and 39B show the solution supply unit shown in FIGS. 37, 38A and 38B disposed so that nozzle positions are opposite to each other. In this case, the solution supply mechanism is only translated/moved in a direction crossing at right angles to the flowing liquid direction in the whole region to be exposed, so that the liquid flow direction can easily be changed. When the exposure region is relatively scanned to the left of the sheet surface from the inside of the whole region to be exposed to process the region, the unit is disposed as shown in FIG. 39A. Subsequently, when the irradiation region is relatively scanned to the right side of the sheet surface from the inside to process the region, the unit is disposed as shown in FIG. 39B.

19th Embodiment

Figure 40A:
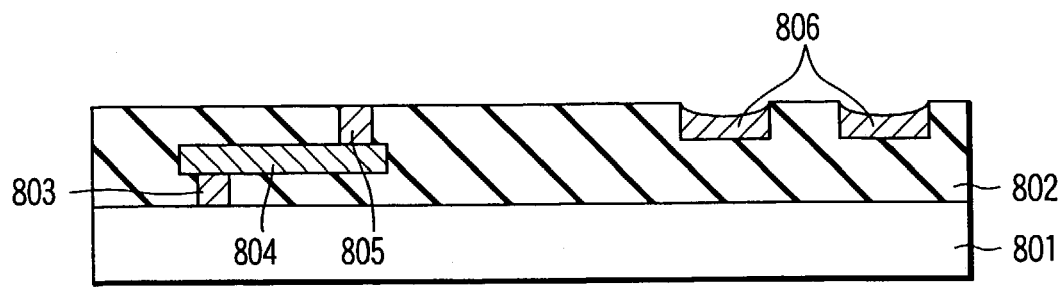
FIGS. 40A to 40C are sectional views showing a problem of an alignment defect in forming a metal wiring of Al.
Figure 40B:
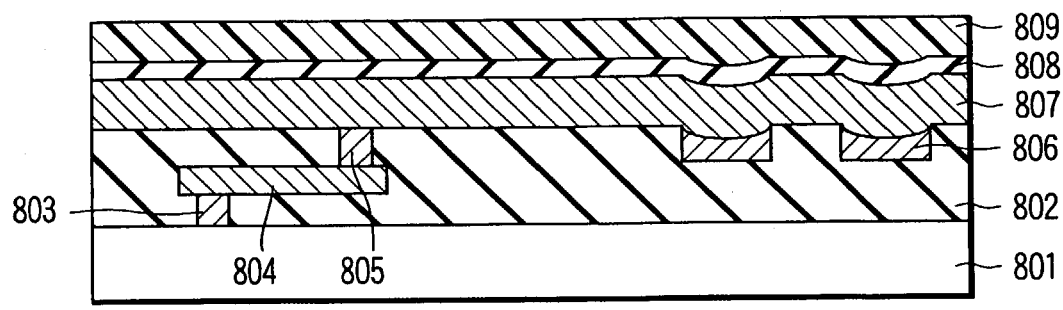
Figure 40C:
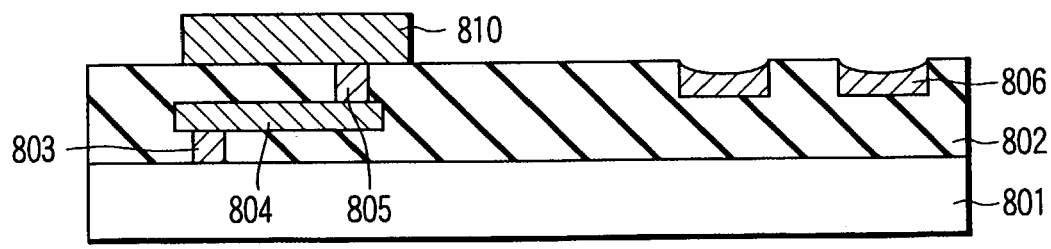

FIGS. 40A to 40C are sectional views showing a problem of an alignment defect in forming Al wiring.

The sectional view shown in FIG. 40A shows a stage before the Al wiring is formed. In an interlayer insulating film 802 formed on a semiconductor substrate 801, at least a via-hole 805 to be connected to the Al wiring, and alignment marks 806 for performing the alignment are formed. It is to be noted that reference numerals 803, 804 denote a plug and lower-layer wiring layer. It is to be noted that concave/convex portions are formed in the surfaces of the alignment marks 806. The reason for this will be described later.

Next, as shown in FIG. 40B, an Al film 807, antireflection film 808, and resist film 809 are successively formed. Barrier metals constituted of Ti, TiN, Ta, TaN are formed in an Al film 807 upper layer and/or Al film 807 lower layer (not shown).

In the state shown in FIG. 40B, the Al film 807 is formed on the alignment marks 806. Therefore, the alignment marks 806 cannot directly be detected. Therefore, without detecting the position information of the alignment marks 806 formed in the via layer of the Al film 807 lower layer, the concave shape of the Al film 807 surface is detected to align the films.

Then, in order to perform the alignment by the concave shape of the Al film 807 surface, step portions are disposed in the alignment marks 806 formed in the via layer beforehand. When the Al film 807 is formed, concave shape are generated in the surface of the Al film 807.

When the position information of the alignment marks 806 is read by the concave shape of the Al film 807 surface, and patterned, an Al wiring 810 is formed as shown in FIG. 40C.

However, since the Al film 807 surface concave shape are asymmetric against the concave shape of the substrate because of properties of film forming methods such as sputter deposition, strains are generated in the position information and an alignment error is enlarged. This alignment error induces contact defect between the Al wiring layer 810 and via-hole 805. This causes a problem that chip yield drops.

In order to raise the chip yield, the Al film 807 on the alignment marks 806 is selectively removed before the alignment is performed. In the alignment for performing lithography of the Al wiring layer, it is necessary to take a method of directly detecting the alignment mark formed in the substrate via layer.

FIGS. 41A to 41F are sectional views showing the manufacturing steps of the semiconductor device according to the 19th embodiment of the present invention. It is to be noted that in FIGS. 41A to 41F, the same parts as those of the FIGS. 40A to 40C are denoted with the same reference numerals, and the detailed description thereof is omitted.

Figure 41A:
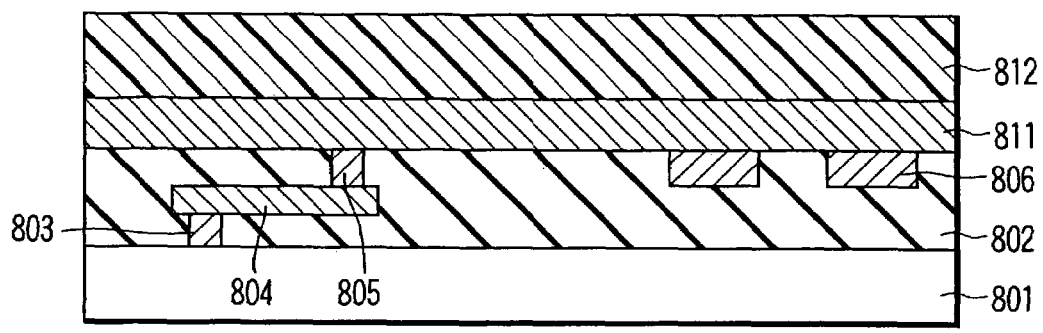
FIGS. 41A to 41F are sectional views showing the manufacturing steps of the semiconductor device according to a 19th embodiment.
Figure 41B:
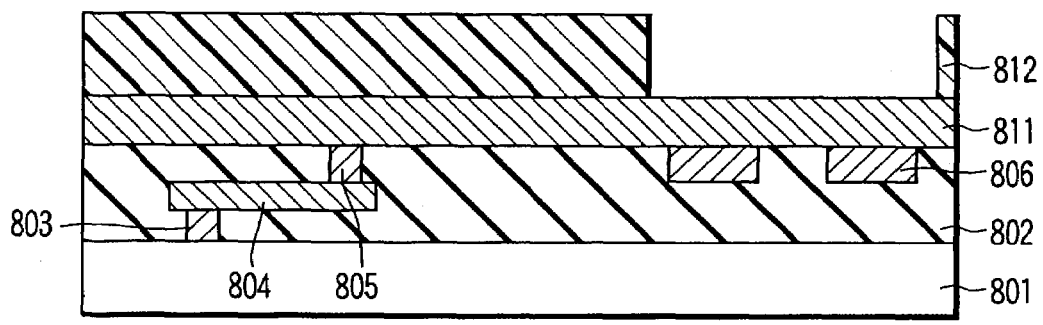

First, as shown in FIG. 41A, after an Al film 811 is formed, a resist film 812 is formed on the Al film 811. Subsequently, as shown in FIG. 41B, the whole region to be ablated of the Al film 811 in which the alignment mark and the bar in bar mark (not shown) are formed below is irradiated with the laser beam to selectively remove the resist film 812 on the alignment marks. As the removing method, any method described above in the other embodiments may also be used.

Figure 41C:
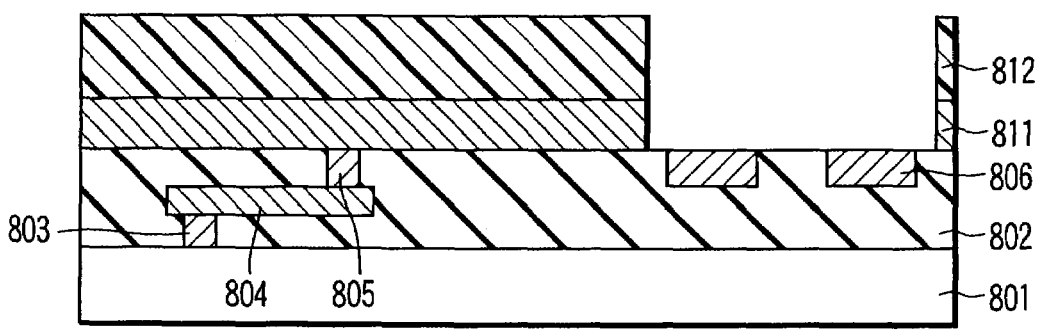

Subsequently, as shown in FIG. 41C, a wet etching method is used to remove the Al film 811 of the processed region. The resist film 812 is removed by ashing. In this state, a structure is obtained in which the Al film 811 on the alignment marks 806 and the bar in bar mark is selectively removed.

Figure 41D:
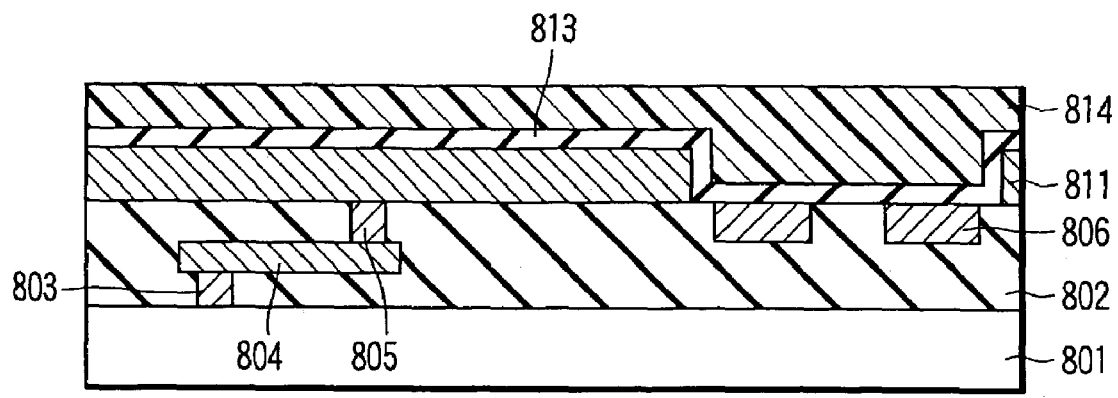
Figure 41E:
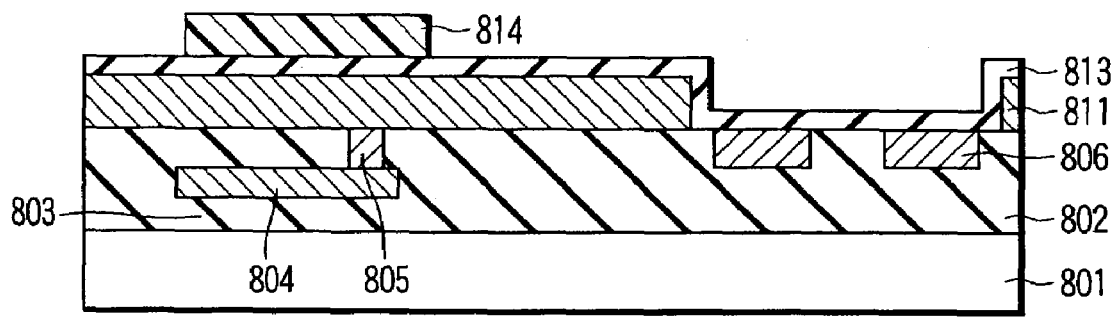

In the state in which the Al film 811 on the alignment marks 806 is selectively removed to form a resist film for i-ray 814/anti-reflection film 813 as shown in FIG. 41D. Next, the position information of the alignment marks 806 formed in the via layer is used to perform alignment adjustment. Thereafter, exposure/development is performed to form the resist pattern 814 as shown in FIG. 41E.

When the alignment is performed with the bar in bar mark, it can be confirmed that superposition is achieved with good precision. It has heretofore been difficult to check the alignment, because the Al film is also formed on the alignment check mark. However, the check is much facilitated.

Figure 41F:
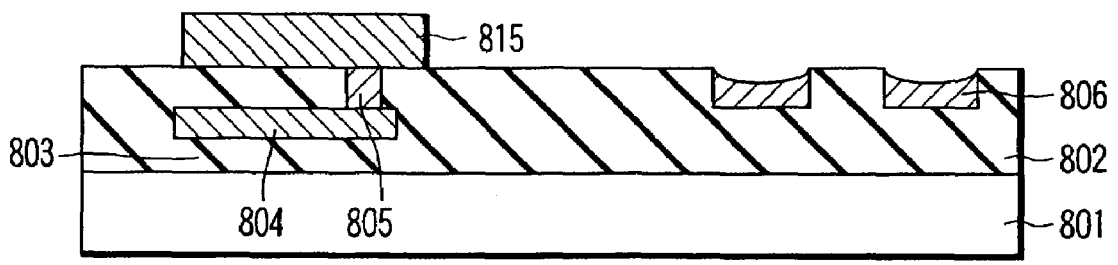

After the above-described lithography process, as shown in FIG. 41F, the Al film 811 is processed by the RIE process, an Al wire 815 is formed, and the resist pattern 814 and anti-reflection film 813 are removed. By the above-described manufacturing method, it is possible to form Al wiring without contact defect between the Al wiring 815 and via 805.

It is to be noted that in the present embodiment the forming of the processed film and the laser processing can continuously be performed by the processing apparatus. However, the forming of the processed film and the laser processing may also be performed with the independent apparatuses.

20th Embodiment

With an insufficient alignment precision between the position of exposure region and the whole region to be ablated, every time the reciprocating scan is repeated, a problem occurs that new particles are generated from the edge of the whole region to be ablated.

In the second embodiment, the method has been described comprising: considering the alignment precision in the vicinity of the edge of the whole region to be ablated; controlling the view field setting system in the second and subsequent exposures to set the exposure region to be smaller than that of the whole region to be ablated middle portion; inhibiting the particles from being generated in the vicinity of the edge of the of the whole region to be ablated; and preventing the particles from sticking into the processed region.

A method for a similar purpose will be described comprising: shifting the position of the exposure region while processing the whole region to be ablated to reduce the generation of the particles.

FIGS. 42A to 42E are plan views showing the optical processing method according to a 20th embodiment of the present invention.

Figure 42A:
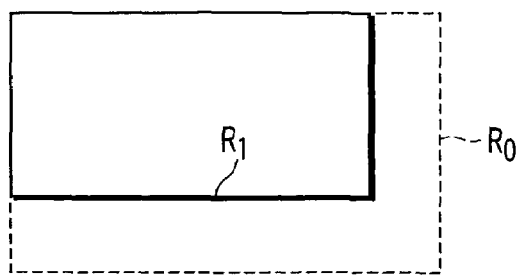
FIGS. 42A to 42E are plan views showing an optical processing method according to a 20th embodiment.

First, as shown in FIG. 42A, the exposure region having the slit shape on the substrate is relatively scanned against the substrate to ablate a first region $R_1$. One vertex of the first region $R_1$ contacts one of vertices of a processed region $R_0$.

Figure 42B:
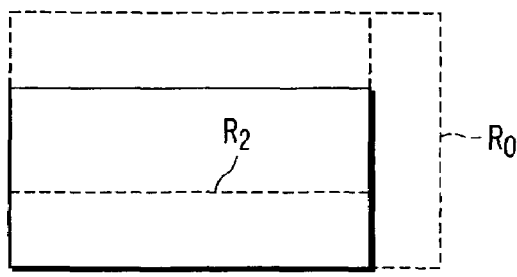

Subsequently, as shown in FIG. 42B, the irradiation region of the laser beam is changed to a second region $R_2$ from the first region $R_1$. One vertex of the second region $R_2$ which does not contact the vertex of the first region $R_1$ contacts one of the vertices of the processed region $R_0$ Moreover, the processed film in the second region $R_2$ is ablated in the same manner as in the first region $R_1$.

Figure 42C:
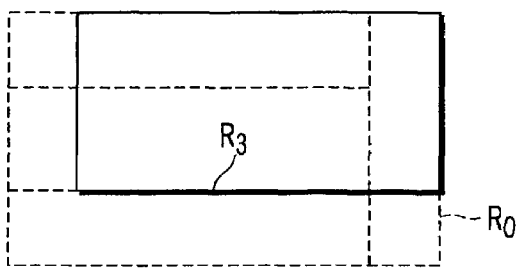

Thereafter, as shown in FIG. 42C, the irradiation region of the laser beam is changed to a third region $R_3$ from the second region $R_2$. One vertex of the third region $R_3$ which does not contact the vertices of the regions $R_1$, $R_2$ contacts one of the vertices of the processed region $R_0$. Moreover, the processed film in a region is ablated in the same manner as in the first region $R_1$.

Figure 42D:
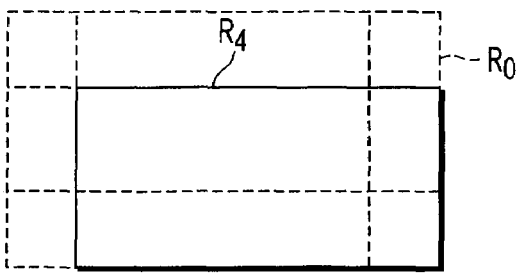
Figure 42E:
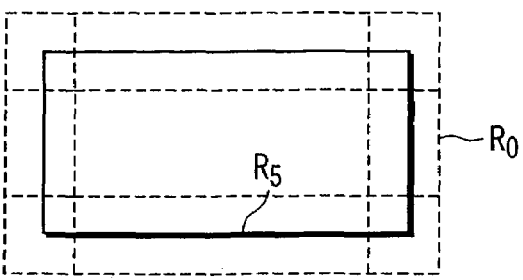

Thereafter, as shown in FIG. 42D, the irradiation region of the laser beam is changed to a fourth region $R_4$ from the third region $R_3$. One vertex of the fourth region $R_4$ which does not contact the vertices of the regions $R_1$, $R_2$, $R_3$ contacts one of the vertices of the processed region $R_0$. Moreover, in the same manner as in the first region $R_1$, the processed film in the fourth region $R_4$ is ablated. In the above-described steps, the processed film in the processed region $R_0$ is ablated.

Moreover, the method finally comprises: repeatedly reciprocating/scanning the laser beam having a long slit shape in a fifth region $R_5$ set in the processed region $R_0$; and removing the particles remaining in the fifth region $R_5$ to form the whole region to be ablated. It is to be noted that the fifth region $R_5$ may collectively be exposed to remove the remaining particles and to form the whole region to be ablated.

As described above, when the position of the exposure region is shifted to form the whole region to be ablated, the number of exposure of the edge of the whole region to be ablated can be reduced as much as possible. Therefore, the particles from the edge of the whole region to be ablated can be inhibited, and it is possible to prevent the particles from sticking into the whole region to be ablated.

In the processing process of the fifth region $R_5$, the observation system 220 constituted of the CCD camera is used to count the particles inside/outside the processed region. Moreover, the image is stored before/after the laser irradiation, and the difference is obtained. When the difference is substantially 0, the processing in the portion is stopped; otherwise, the processing is controlled to be continuously performed.

It is to be noted that a region redundantly scanned in the scan in the regions $R_1$ to $R_4$ is set to the fifth region $R_5$ and thereby the number of scans in the fifth region $R_5$ can be reduced.

It is to be noted that the scan region may be changed by moving the position of the view field setting system or moving the substrate.

In the present embodiment, the processed film on the alignment mark is completely removed, but the present invention is not limited to this. For example, when the alignment mark can be detected by the optical system for use in the alignment measurement, the processing may be ended with the slight amount of the processed film remaining in the processed region.

21st Embodiment

With an insufficient alignment precision between the position of exposure region and the whole region to be ablated, every time the reciprocating scan is repeated, a problem occurs that new particles are generated from the edge of the whole region to be ablated.

In the second embodiment, the method has been described comprising: considering the alignment precision in the vicinity of the edge of the whole region to be ablated; controlling the view field setting system in the second and subsequent exposures to set the exposure region to be smaller than that of the whole region to be ablated middle portion; inhibiting the particles from being generated in the vicinity of the edge of the of the whole region to be ablated; and preventing the particles from sticking into the processed region.

On the other hand, in the 20th embodiment, without changing the size of the view field setting system, the position of the exposure region is changed to process the whole region to be ablated. In a 21st embodiment, a method of vibrating the substrate to be treated and exposing the light to process the whole region to be ablated for similar purpose will be described.

Figure 43A:
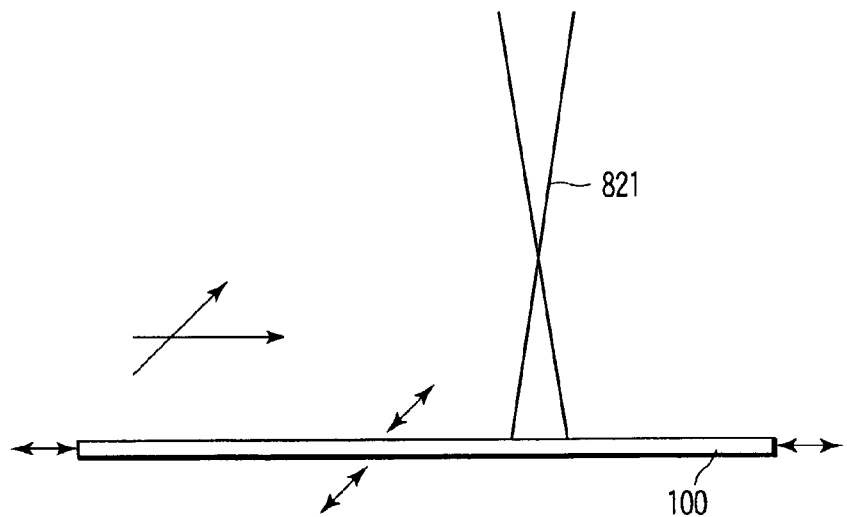
FIGS. 43A and 43B are sectional views showing the manufacturing steps of the semiconductor device according to a 21st embodiment.
Figure 43B:
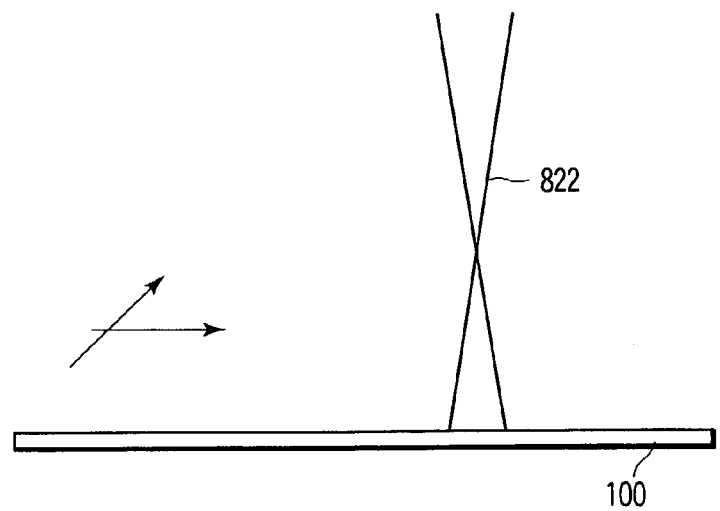

FIGS. 43A and 43B are sectional views showing the manufacturing steps of the semiconductor device according to the 21st embodiment of the present invention.

Figure 44:
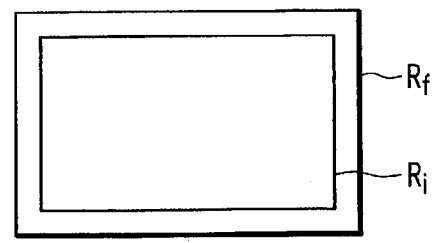
FIG. 44 is a plan view showing an irradiation region of one pulse of a laser beam.

First, as shown in FIG. 43A, the substrate 100 is vibrated by piezoelectric devices in at least a horizontal direction while scanning a thinned slit-shaped laser beam 821 to process the film to be ablated. At this time, as shown in FIG. 44, a region $R_f$ actually exposed is broader than a region $R_i$ exposed in a state free of vibration. FIG. 44 is a plan view showing the exposure region, when the substrate is vibrated. Therefore, in the method of vibrating the substrate 100 while scanning the laser beam, the actually processed region is broader than the region processed in a state in which the substrate is not vibrated.

Next, the piezoelectric device driving control circuit is disconnected. Without vibrating the substrate, as shown in FIG. 43B, a thinned slit-shaped laser beam 822 is repeatedly reciprocated/scanned in the whole region to be ablated to remove the particles remaining in the whole region to be ablated. It is to be noted that the particles remaining in the processed region may also be removed by the collective exposure.

In the present embodiment, the substrate is vibrated. However, the substrate may also be vibrated by the piezoelectric device disposed in the view field setting system.

In the second and subsequent scan steps, the observation system 220 constituted of the CCD camera is used to count the particles inside/outside the processed region. Moreover, the image is stored before/after the exposure, and the difference is obtained. When the difference is substantially 0, the processing in the portion is stopped; otherwise, the processing is controlled to be continuously performed.

In the present embodiment, the processed film on the alignment mark is completely removed, but the present invention is not limited to this. For example, when the alignment mark can be detected by the optical system for use in the alignment measurement, the processing may be ended with a slight amount of the processed film remaining in the processed region.

22nd Embodiment

In the second embodiment, the method has been described comprising: considering the alignment precision in the vicinity of the edge of the whole region to be ablated; controlling the view field setting system in the second and subsequent exposures to set the exposure region to be smaller than that of the whole region to be ablated middle portion; inhibiting the particles from being generated in the vicinity of the edge of the of the whole region to be ablated; and preventing the particles from sticking into the processed region.

In a 22nd embodiment, a gap between the window 236 of the optical processing apparatus 200 shown in FIG. 2 and the substrate 100 surface is changed in accordance with the number of scans of the exposure region to ablate the region.

Figure 45A:
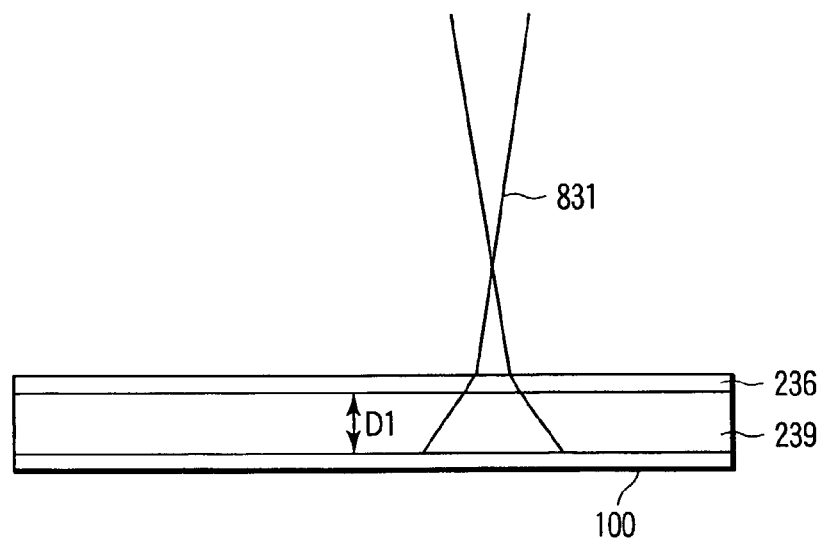
FIGS. 45A and 45B are sectional views showing the manufacturing steps of the semiconductor device according to a 22nd embodiment.
Figure 45B:
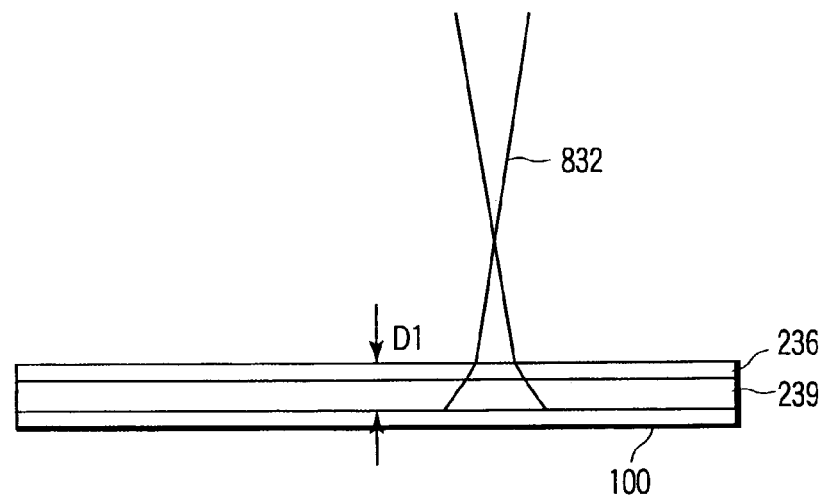

FIGS. 45A and 45B are sectional views showing the manufacturing steps of the semiconductor device according to the 22nd embodiment of the present invention.

First, as shown in FIG. 45A, the gap between the substrate 100 surface and window 236 is controlled to set the thickness of the solution 239 on the substrate 100 to D1. Moreover, a thinned slit-shaped laser beam 831 is relatively scanned against the whole region to be ablated.

Since the laser beam incident upon the pure water is refracted, an area of the exposure region is A1.

Subsequently, as shown in FIG. 45B, the gap between the window 236 and substrate 100 surface is changed to set the thickness of the solution 239 on the substrate 100 to D2 (<D1). Moreover, again with the same setting of the scan region as that of the first scan, the long slit-shaped laser beam is repeatedly reciprocated/scanned in whole region to be ablated.

Figure 46:
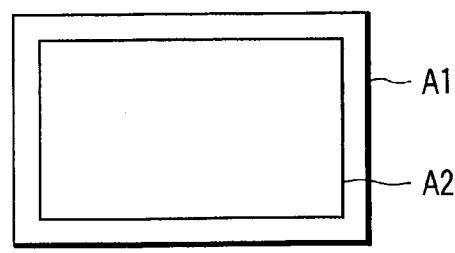
FIG. 46 is a plan view showing an irradiation area of one pulse of the laser beam.

When the solution 239 is thinned, the influence of the refraction of the laser beam in the solution 239 is reduced. Therefore, as shown in FIG. 46, an area A2 of the exposure region is smaller than the area A1. Therefore, the second scan region can be set to be smaller than the first scan region. FIG. 46 is a plan view showing the irradiation area of one pulse of the laser beam.

As described above, when the solution film thickness on the treated substrate in the process is changed, the generation of the particles from the edge of the whole region to be ablated can be inhibited, and it is possible to prevent the particles from sticking into the processed region.

In the second scan step, the observation system 220 constituted of the CCD camera is used to count the particles inside/outside the processed region. Moreover, the image is stored before/after exposure, and the difference is obtained. When the difference is substantially 0, the processing in the portion is stopped; otherwise, the processing is controlled to be continuously performed.

In the present embodiment, the processed film on the alignment mark is completely removed, but the present invention is not limited to this. For example, when the alignment mark can be detected by the optical system for use in the alignment measurement, the processing may be ended with the slight amount of the processed film remaining in the processed region.

23rd Embodiment

First, a constitution of a laser processing apparatus will be described. FIG. 47 is a diagram showing the constitution of the laser processing apparatus according to a 23rd embodiment of the present invention. In FIG. 47, the same parts as those of FIG. 2 are denoted with the same reference numerals, and the description thereof is omitted.

As shown in FIG. 47, the optical processing apparatus 200 includes the laser optical system 210, observation system 220, and laser processing section 230, and further includes a gradation/tone classification unit 251, film structure identification unit 252, and energy amount setting unit 253.

This laser optical system 210 includes the laser oscillator 211, laser oscillator control unit 212 which controls the laser oscillator 211, optical system 214, half mirror 217, and condenser lens 216.

The laser beam 213 emitted from the laser oscillator 211 is successively transmitted through the optical system 214 which forms a beam shape in a size of each exposure unit, optical shaping unit 215, half mirror 217, and condenser lens 216, and the processing surface 100a of the substrate 100 disposed in the laser processing section 230 is exposed. The observation system 220 is inserted between the optical shaping unit 215 and condenser lens 216.

The observation system 220 includes a light source for observation 223 which emits a light for observing the surface of the substrate 100, half mirror 224, and CCD camera 222.

The constitution of the optical observation system will be described hereinafter. The image information acquired by the CCD camera 222 is sent to the gradation/tone classification unit 251. The gradation/tone classification unit 251 first identifies the processed region from the image. Gradation and tone (wavelength dispersion of the gradation) in the identified the region to be exposed are obtained. Moreover, grids (pixels) which have substantially the same gradation or tone are divided into groups. Here, the grouping of the gradations or tones of the images is similar to the obtaining of intensity distribution of a reflected light from the substrate.

Gradation/tone information of each grid or group is sent to the film structure identification unit 252. The film structure identification unit 252 includes a correspondence table of the tones/gradations and film structures obtained beforehand. The film structure identification unit 252 compares the tone/gradation information of each grid or group with the correspondence table. The film structure identification unit 252 allocates the film structure to each group based on the correspondence table. The film structure information includes at least information of the thickness of the film and complex refractive index. Furthermore, data of a damage generation lower limit energy amount is also sometimes included.

The energy amount setting unit 253 determines the energy amount of each exposure region (processing unit) for each exposure unit based on the film structure information.

The laser oscillator control unit 212 controls power supplied to the laser oscillator 211 based on energy amount information and exposure position information.

It is to be noted that the exposure position of the laser beam is detected based on the information from the sensor 235 and rotation control mechanism 234. It is to be noted that the exposure position of the laser beam may also be detected based on the image information acquired by the CCD camera 222.

Moreover, the laser beam source is used in the light source for the processing in the present apparatus, but the present invention is not limited to this. When the wavelength is absorbed by the processed film, the desired processing is performed, that is, the film thickness is reduced, or the film can be removed, any light may also be used. For example, when the light is absorbed in the visible or ultraviolet region in the organic or inorganic film, the light is collected by the tungsten lamp and used. In this case, the film thickness reduction has been confirmed. Moreover, charged particle beams may also be used, such as an electron beam and ion beam.

Figure 48:
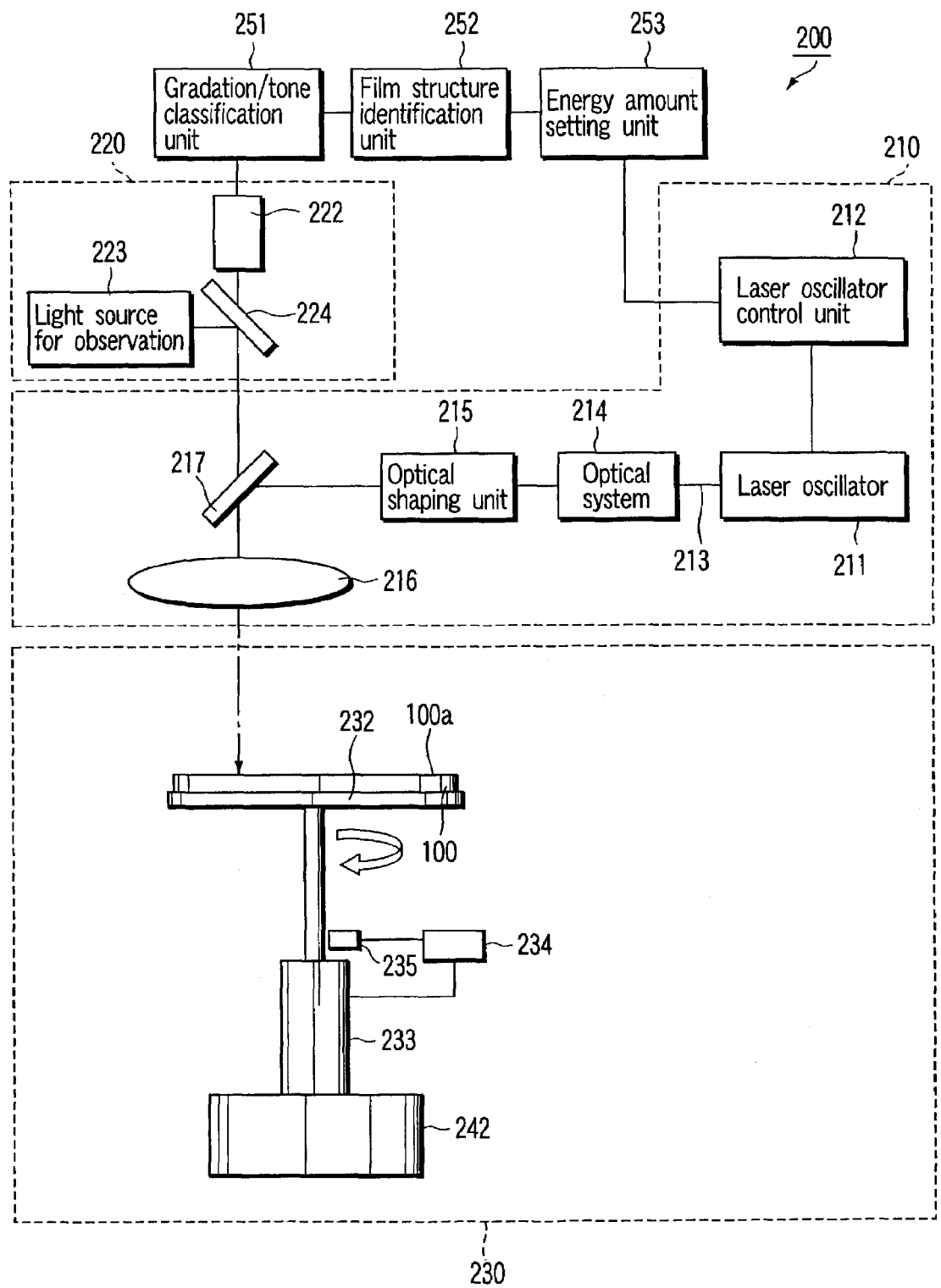
FIG. 48 is a diagram showing the constitution of the laser processing apparatus according to the 23rd embodiment.

The invention concerning the present apparatus relates to the processing in water, but is not limited to this. When the substrate to be treated is treated in the atmosphere, the processing is possible in an apparatus constitution shown in FIG. 48. In FIG. 48, the same mechanism is denoted with the same reference numerals. Even in the treatment in a pressurized or reduced pressure state, the apparatus or stage portion having a mode of FIG. 48 is disposed in a chamber and used, and an object of the present invention can thereby be achieved.

24th Embodiment

In a 24th embodiment, an example of the processing using the apparatus described in the 23rd embodiment will be described.

On a wafer having a diameter of 300 nm in a semiconductor forming process, an anti-reflection film layer having a film thickness of 56 nm (complex refractive index=$n_{12}$-$k_{12}$i: i is an imaginary number unit), and a uniform resist film having a film thickness of 400 nm (complex refractive index=$n_{11}$-$k_{11}$i: i is the imaginary number unit) are successively formed. The laser processing apparatus shown in FIG. 47 is used to process the wafer.

First, the light intensity from the observation light source and detection sensitivity of the CCD camera are corrected. The correction comprises: irradiating a standard sample whose surface (not shown) has been polished in a mirror surface form with the light from the observation light source; receiving the reflected light by the CCD camera; and adjusting light amount of the observation light source or gain of the CCD camera so that the detected gradation of the CCD camera indicates a value designated beforehand.

After the observation system is corrected, the wafer 100 is laid on the stage 232 in the holder 231. The solution flow unit 237 supplies a ultrapure water onto the upper surface of the wafer 100. In a stage of the holder 231 completely filled with the ultrapure water, the CCD camera 222 acquires the image around the whole region to be exposed. In the present embodiment, the whole region to be exposed is an alignment mark region. The used CCD camera 222 can acquire images of 256 gradations of white/black. The image observed by the CCD camera 222 is sent to the gradation/tone classification unit 251.

FIG. 49 schematically shows the image observed by the CCD camera 222 (set to a gray scale). The gradation/tone classification unit 251 evaluates the gradation from the image. In the present embodiment, there are 167 gradations in a second region 1302 in which the alignment marks are formed. Moreover, a first region 1301 includes 56 gradations. It is to be noted that in FIG. 49, reference numeral 1300 denotes a processed region.

This gradation information is next sent to the film structure identification unit 252. Here, transferred data arrangement is, for example, (x-direction exposure origin, y-direction exposure origin, x-direction exposure width, y-direction exposure width, gradation). This data is data in which a plurality of gradations are grouped based on the gradation information owned by each grid (pixel). It is to be noted that the x-direction and y-direction exposure widths are exposure units (processing units) predetermined by the apparatus and indicate fixed values. The exposure unit has a shape of a slit or dot with respect to the processed region.

It is to be noted that the slit shape mentioned herein is a shape in which the longitudinal direction of the exposure shape is substantially equal to one side of the processed region and a width of a direction crossing at right angles to the longitudinal direction is shorter than the other side of the processed region. Moreover, the exposure shape of the dot shape indicates that each of two widths of the direction crossing at right angles in the exposure shape is shorter than the width of the direction crossing at right angles in the processed region.

Film structure search means uses the correspondence table described, for example, in Table 1 to determine the film structure.

TABLE 1

|  | Film structure 1A | Film structure 1B | Film structure 1C |
| --- | --- | --- | --- |
| Gradation | 54 ± 3 | 168 ± 2 | 144 ± 5 |
| Energy upper limit [J/cm$^2$/shot] | 0.6 | 0.4 | 0.6 |
| Energy lower limit [J/cm$^2$/shot] | 0.3 | 0.2 | 0.3 |
| Uppermost layer of substrate | 3 | 3 | 4 |
| Number of layers | 4 | 6 | 5 |
| Layer 1 | $n_{11}, k_{11}$ | $n_{11}, k_{11}$ | $n_{11}, k_{11}$ |
| Layer 2 | $n_{12}, k_{12}$ | $k_{12}, k_{12}$ | $n_{13}, k_{13}$ |
| Layer 3 | $n_{15}, k_{15}$ | $n_{18}, k_{18}$ | $n_{14}, k_{14}$ |
| Layer 4 | $n_{16}, k_{16}$ | $n_{19}, k_{19}$ | $n_{15}, k_{15}$ |
| Layer 5 | — | $n_{110}, k_{110}$ | $n_{16}, k_{16}$ |
| Layer 6 | — | $n_{16}, k_{16}$ | — |
| Layer 7 | — | — | — |

In Table 1, for example, a film structure 1A is a four-layer structure. As shown in FIG. 50A, the film structure 1A is constituted of a resist film (layer 1) 1401, anti-reflection film (layer 2) 1402, and substrate layers 1405 (layer 3), 1406 (layer 4). It is to be noted that only the complex refractive index is described in the correspondence table, but in actuality, the information of the film thickness is also attached.

As shown in FIG. 50B, a film structure 1B is constituted of the resist film 1401 (layer 1) including a three-layer structure, anti-reflection film 1402 (layer 2), and substrate layers 1408 (layer 3), 1409 (layer 4), 1410 (layer 5), and 1406 (layer 6). In the film structure 1B, the uppermost layer of the substrate layer is 1408 (layer 3). As shown in FIG. 50C, a film structure 1C is constituted of the resist films including the three-layer structure 1401 (layer 1), 1403 (layer 2), 1404 (layer 3), and substrate layers 1405 (layer 4), 1406 (layer 5). The uppermost layer of the substrate layer is the substrate layer 1405.

Based on this information, the first region 1301 is identified as the film structure 1B, and the second region 1302 is identified as the film structure 1A. Moreover, it is seen from this correspondence table that a maximum value of energy exposure with respect to the first region 1301 is 0.4 J/cm$^2$/shot, and the maximum value of the energy exposure with respect to the second region 1302 is 0.6 J/cm$^2$/shot. In Table 1, an energy lower limit is an energy necessary for removing the film. The energy lower limit of the film structure 1A is larger than that of the film structure 1B, because little light is absorbed in the processed film substrate in the film structure 1A and heat value is little in the substrate.

Moreover, the energy amount setting unit 253 sets an optimum exposure energy amount for each exposure region (processing unit) from the energy upper limit and lower limit and optical constant of the film described in Table 1. When the energy is amplified by multiple interference, an energy amount smaller than the value of the table is assigned. Conversely, when the energy is offset, the energy larger than the value of the table is assigned. The lower limit of the energy amount is an energy amount with which it is difficult to process the film to be processed. Of course, a larger energy amount is assigned.

Figure 51:
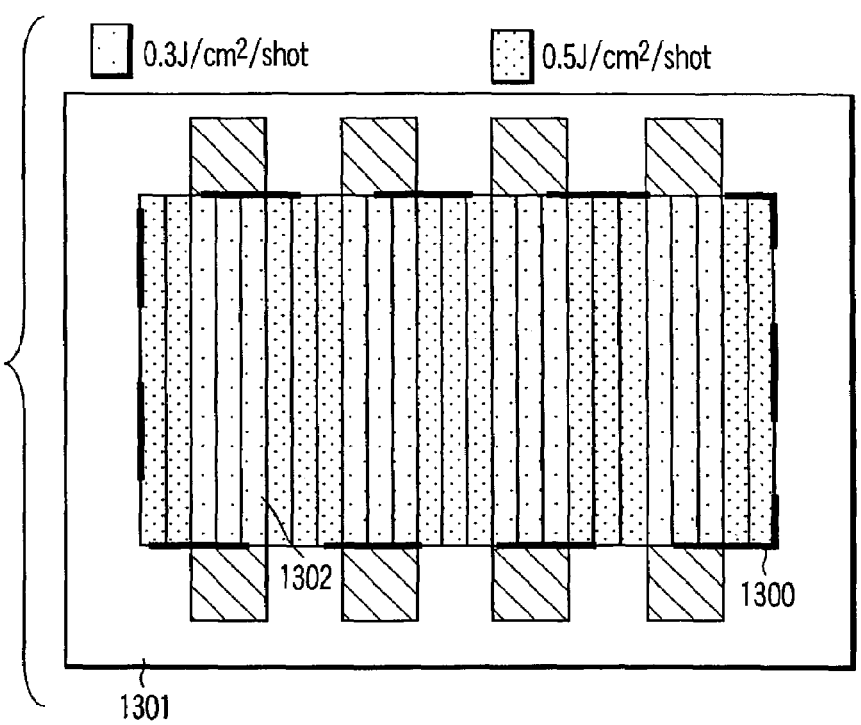
FIG. 51 is a diagram showing setting of an energy amount in each irradiation region in the processing method according to the 23rd embodiment.
Figure 52:
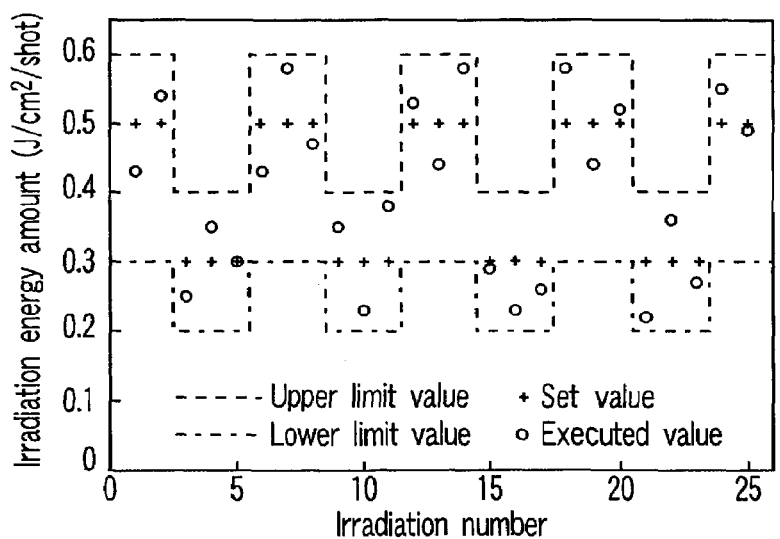
FIG. 52 is a diagram showing the setting of the energy amount in each irradiation region in the processing method according to the 23rd embodiment.
Figure 53:
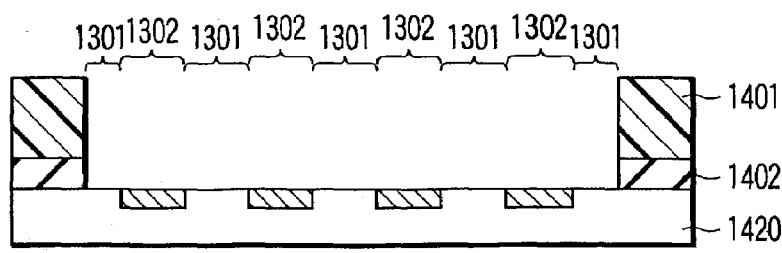
FIG. 53 is a sectional view showing the constitution of the semiconductor device formed in the processing method according to the 23rd embodiment.

The energy amount setting unit 253 considers the dispersion of the exposure energy, and sets the exposure energy amount onto the first region 1301 to 0.3 J/cm$^2$/shot as shown in FIG. 51. The energy amount setting unit 253 sets the exposure energy amount onto the second region 1302 to 0.5 J/cm$^2$/shot. In accordance with the energy amount set in this manner, the abrasion is performed for each processing unit. According to the processing method described in the present embodiment, as shown in FIG. 53, the first and second regions 1301 and 1302 can be processed with appropriate energies.

Figure 54:
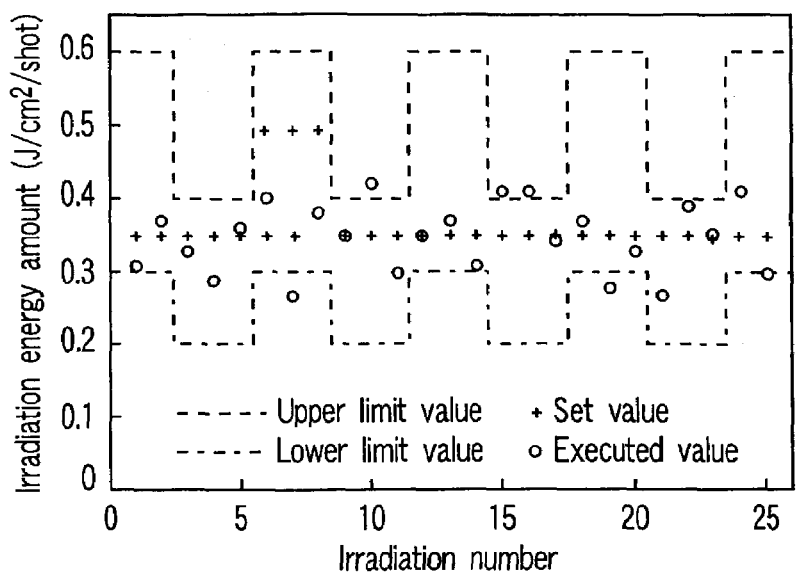
FIG. 54 is a diagram showing the setting of the energy amount in each irradiation region in a related-art processing method.
Figure 55:
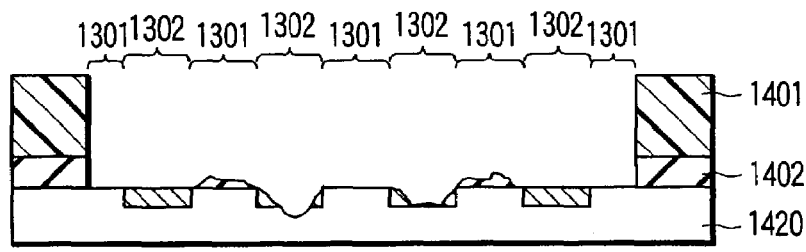
FIG. 55 is a sectional view showing the constitution of the semiconductor device formed in the related-art processing method.

For example, it is assumed that the energy of the laser is set to 0.35 J/cm$^2$/shot regardless of the first and second regions. In this case, the exposure energy has bad stability. When the exposure energy is reduced, the film remains in the second region 1302. When the exposure energy increases, the first region 1301 is damaged, and many processing defects are generated (FIGS. 54 and 55).

When the exposure energy is changed by the constitution of the substrate to perform the ablation as in the processing method described in the present embodiment, the processing can be realized in a satisfactory state without any remaining film or any damage.

When the alignment mark is exposed by this processing, the alignment can be strictly performed. Therefore, a gate dimension can further be reduced, and it is possible to manufacture an LSI in which high-rate treatment is possible. In the semiconductor device prepared using the present technique in this manner, the treatment can be performed at a high rate. Moreover, since an allowance of alignment can be set to be small, a chip area can also be reduced.

In the present embodiment, the CCD camera with the gray scale is used as the optical observation system, but the present invention is not limited to this, and a color video camera may also be used.

Moreover, the correspondence table is not limited to the type of Table 1, and any mode may be used as long as the information necessary for the processing is stored.

25th Embodiment

On the wafer having a diameter of 300 nm in the forming process of the semiconductor device, the anti-reflection film layer having a film thickness of 300 nm (complex refractive index=$n_{24}$-$k_{24}$i: i is the imaginary number unit), SOG layer having a film thickness of 90 nm (complex refractive index=$n_{23}$-$k_{23}$i: i is the imaginary number unit), and the uniform resist film having a film thickness of 400 nm (complex refractive index=$n_{21}$-$k_{21}$i: i is the imaginary number unit) are successively formed.

The wafer 100 is laid on the stage 232. The CCD camera 222 (RGB) acquires the image around the processed region. In the present embodiment, the processed region is the alignment mark region. The used CCD camera 222 can acquire images of 256 gradations of each of RGB. The image observed by the CCD camera 222 is sent to the gradation/tone classification unit 251 to evaluate the gradation.

Figure 56:
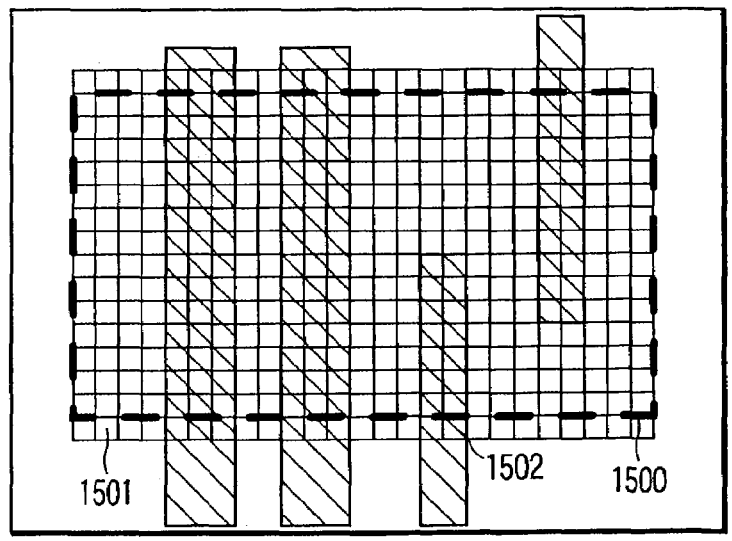
FIG. 56 is a diagram showing an example of the image obtained from the CCD camera of the laser processing apparatus according to a 25th embodiment.

FIG. 56 shows a photographed image. The gradation/tone information is assigned to the regions divided by the grids in FIG. 54. A region in a dotted line is a processed region 1500. The gradation/tone in a second region (mark portion) 1502 is (R, G, B)=(150, 93, 201). Moreover, the gradation/tone in a first region 1501 is (R, G, B)=(32, 100, 87). This information is next sent to the film structure search means. Here, the transferred data arrangement is, for example, (x-direction exposure origin, y-direction exposure origin, x-direction exposure width, y-direction exposure width, R gradation, G gradation, B gradation). The data is data in which the gradations are grouped based on the gradation information owned by each region. For the x-direction and y-direction exposure widths, the (R, G, B) gradations of the regions disposed adjacent to each other are compared with each other, the regions having a gradation difference of ±5 or less are regarded as the same group and grouped, and further the region is divided into slit or dot shapes to obtain the exposure widths of the x, y directions of the slit or dot. The film structure search means uses the correspondence table for example, Table 2, to determine the film structure.

TABLE 2

|  | Film structure 2A | Film structure 2B | Film structure 2C |
|---|---|---|---|
| Gradation (R, G, B) ±10% | (50, 90, 122) | (147, 95, 199) | (30, 100, 90) |
| Energy upper limit [J/cm²/shot] | 0.6 | 0.4 | 0.7 |
| Energy lower limit [J/cm²/shot] | 0.3 | 0.2 | 0.4 |
| Uppermost layer of substrate | 3 | 4 | 4 |
| Number of layers | 4 | 7 | 5 |

TABLE 2-continued

|  | Film structure 2A | Film structure 2B | Film structure 2C |
|---|---|---|---|
| Layer 1 | $n_{21}, k_{21}$ | $n_{21}, k_{21}$ | $n_{21}, k_{21}$ |
| Layer 2 | $n_{22}, k_{12}$ | $n_{23}, k_{23}$ | $n_{23}, k_{23}$ |
| Layer 3 | $n_{25}, k_{25}$ | $n_{24}, k_{24}$ | $n_{24}, k_{24}$ |
| Layer 4 | $n_{26}, k_{26}$ | $n_{28}, k_{28}$ | $n_{25}, k_{25}$ |
| Layer 5 | — | $n_{29}, k_{29}$ | $n_{26}, k_{26}$ |
| Layer 6 | — | $n_{210}, k_{210}$ | — |
| Layer 7 | — | $n_{26}, k_{26}$ | — |

In Table 2, for example, a film structure 2A is a four-layer structure. As shown in FIG. 57A, the film structure 2A is constituted of a resist film 1601 (layer 1) including the three-layer structure, anti-reflection film 1602 (layer 2), and substrate layers 1605 (layer 3), 1606 (layer 4). It is to be noted that only the complex refractive index is described in the correspondence table, but in actual fact the information of the film thickness is also attached.

As shown in FIG. 57B, a film structure 2B is constituted of the resist film 1601 including the three-layer structure (layer 1), SOG film 1603 (layer 2), anti-reflection film 1604 (layer 3), and substrate layers 1608 (layer 4), 1609 (layer 5), 1610 (layer 6), and 1606 (layer 7). As shown in FIG. 57C, a film structure 2C is constituted of the resist film 1601 (layer 1), SOG film 1603 (layer 2), anti-reflection film 1604 (layer 3), and substrate layers 1605 (layer 4), 1606 (layer 5).

Based on this information, the first region 1501 is determined as the film structure 2B, and the second region 1502 is determined as the film structure 2C. Moreover, it is seen from Table 2 that the upper limit value of the exposure energy amount with respect to the first region 1501 is 0.4 J/cm²/shot, and the maximum value of the energy exposure with respect to the second region 1502 is 0.7 J/cm²/shot. Here, the upper limit value of the exposure energy amount is registered as an energy for vaporizing only the anti-reflection film in the film structures 2B, 2C. The lower limit value of the exposure energy amount is an energy necessary for removing the processed film. The lower limit value of the exposure energy amount of the film structure 2C is larger than that of the film structure 2B. This is because in the film structure 2C the light absorption in the processed film substrate is little and the heat value in the substrate is small.

The energy amount setting unit 253 first sets the exposure region (processing unit) based on the groups classified in accordance with the gradation/tone. When the size of the region of the group is larger than that of the exposure region, the region of the group is divided into the slit-shaped or dot-shaped regions smaller than the exposure regions. For example, as shown in FIG. 58, as the exposure regions in the processed region 1500, first exposure regions 1511a to 1511g, and second exposure regions 1512a to 1512d are set.

Moreover, the energy amount setting unit 253 sets the optimum exposure energy amount for each exposure region (processing unit) from the energy upper and lower limits and optical constant of the film described in Table 2. When the energy is amplified by the multiple interference, the energy amount smaller than the value of the table is assigned. Conversely, when the energy is offset, the energy amount larger than the value of the table is assigned. The lower limit of the energy amount is the energy amount with which it is difficult to process the film to be processed. Naturally, the larger energy amount is assigned.

The energy amount setting unit 253 sets the energy amount of the first exposure regions 1511a to 1511g to 0.3

J/cm$^2$/shot. The energy amount setting unit 253 sets the energy amount of the second exposure regions 1512*a* to 1512*d* to 0.5 J/cm$^2$/shot. In accordance with the energy amount set in this manner, the ablation is performed for each processing unit. According to the processing method described in the present embodiment, the first and second regions 1501 and 1502 can be processed with the respective appropriate energies.

The exposure energy amounts into the first and second regions 1501 and 1502 are set to be appropriate. The energy amount is set for each exposure (processing) unit in the energy setting means. The energy amount is optimized and determined from the energy upper and lower limits described in the correspondence table and the optical constant of the film. When the energy is amplified by the multiple interference, the energy amount smaller than the value of the table is assigned. Conversely, when the energy is offset, the energy amount larger than the value of the table is assigned. The lower limit of the energy amount is the energy amount with which it is difficult to process the film to be processed. Naturally, the larger energy amount is assigned.

A result of the assignment of the energy amount by the above-described steps is shown in FIG. 58. To the first and second regions, respectively, 0.3 J/cm$^2$/shot and 0.6 J/cm$^2$/shot were assigned. In accordance with the energy amounts determined in this manner, the abrasion is performed for each processing unit, and the processing can be performed without any remaining film or without any substrate damage.

It is assumed that the energy amount of the laser is set to 0.4 J/cm$^2$/shot regardless of the region to perform the processing. This energy amount is the upper limit of the first region 1501, and is also the lower limit of the second region 1502. Therefore, the first region 1501 was much damaged. Moreover, there were many remaining films in the second region 1502. Therefore, it is difficult to practically use the energy amount.

When the exposure energy is changed by the constitution of the substrate to perform the abrasion as in the processing method described in the present embodiment, the processing can be realized in the satisfactory state without any remaining film or any damage.

When the alignment mark is exposed by this processing, the alignment can be strictly performed. Therefore, the gate dimension can be further reduced, and it is possible to manufacture an LSI in which a high-rate treatment is possible. In the semiconductor device prepared using the present technique in this manner, the treatment can be performed at the high rate. Moreover, since the allowance of alignment can be set to be small, the chip area can also be reduced.

In the present embodiment, a CCD camera is used as the optical observation system, but the present invention is not limited to this, and a video camera may also be used. Moreover, the correspondence table is not limited to the format of Table 2, and any mode may also be used as long as the information necessary for the processing is stored. Moreover, in the same manner as in the 24th embodiment, the solution may be passed through the region to be processed so as to process the region.

26th Embodiment

The constitution of the laser processing apparatus will be described. In FIG. 59, the same parts as those of FIG. 47 are denoted with the same reference numerals, and the detailed description is omitted.

In FIG. 59, the gas member diameter measurement unit 1261 calculates the number of pixels in a specific gradation range in the reflected light received by the CCD camera 222 to obtain the measurement of the diameter of the bubble. Moreover, the laser oscillator control unit 212 compares the measured diameter of the bubble with the set value registered beforehand. When the diameter of the bubble is not less than the set value, the laser oscillator control unit 212 stops the exposure with the laser beam from the laser oscillator 211. When the diameter of the bubble is smaller than the set value, the laser oscillator control unit 212 allows the laser oscillator 211 to oscillate the laser beam.

Moreover, the method of measuring the diameter of the bubble from the image of the reflected light received by the CCD camera 222 is used, but the present invention is not limited to this. For example, any method may be used, as long as the presence of the bubble generated in processing the film to be processed can be observed. For example, by a method of exposing the region with light different from that of the light source for the processing; and measuring a scattered angle of the light for observation by the bubble, the presence/absence of the gas member or the size of the gas member can be judged.

A solution flow generation unit 1263 is disposed. The solution flow generation unit 1263 generates a solution flow in the exposure region of the laser beam. The gas member generated by the exposure of the laser beam can continuously be removed by the solution flow. The solution flow generation unit 1263 preferably generates the solution flow having a constant flow rate in a given direction so as to prevent irregular disturbance from being generated in the laser beam. Moreover, the solution flow generation unit 1263 may be driven, when the laser processing is actually performed.

Moreover, the laser beam source is used in the light source for the processing in the present apparatus, but the present invention is not limited to this. Any light may be used, as long as the wavelength is absorbed by the processed film and desired processing can be performed, that is, the film thickness can be reduced, or the film can be removed. For example, a tungsten lamp or Xe flash lamp can be used. When the wavelength is absorbed by the visible or ultraviolet region in the organic or inorganic film, the light of a tungsten or Xe flash lamp is condensed and used, and the film thickness decreases. Furthermore, a irradiation light, charged particle beams, such as electron or ion beams, may also be used.

Figure 60:
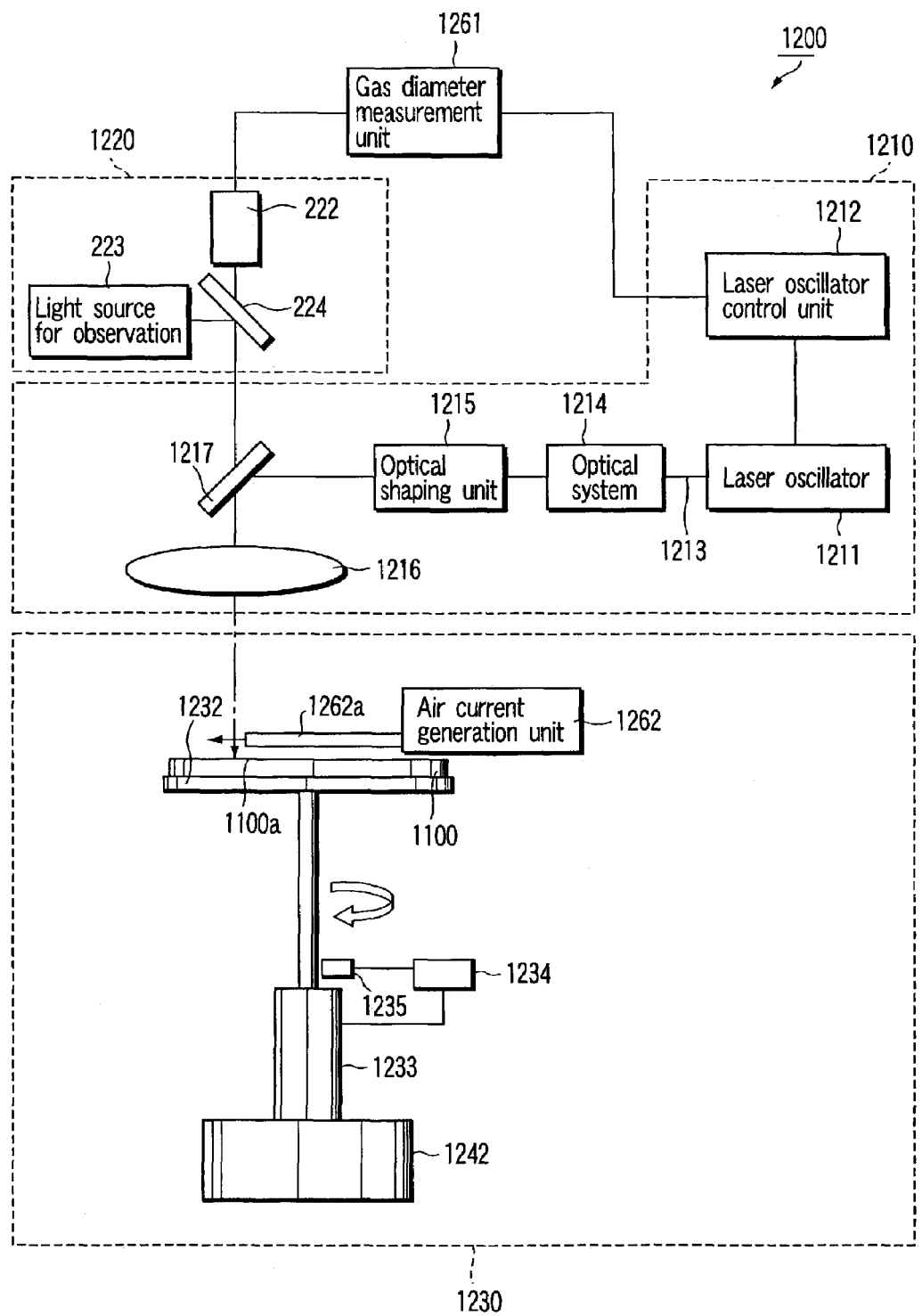
FIG. 60 is a diagram showing the constitution of the laser processing apparatus according to the 26th embodiment.

The constitution of the laser processing apparatus in an atmosphere will be described with reference to FIG. 60. FIG. 60 is a diagram showing the schematic constitution of the laser processing apparatus according to the 26th embodiment of the present invention. In FIG. 60, the same parts as those of FIG. 59 are denoted with the same reference numerals, and the description thereof is omitted.

In FIG. 60, an air current generation unit 1262 is disposed. The air current generation unit 1262 generates an air current in the exposure region of the laser beam. The gas member generated by the exposure of the laser beam can continuously be removed by the air current. The air current generation unit 1262 preferably generates the air current in a constant velocity in the given direction so as to prevent irregular disturbances from being generated in the laser beam. Moreover, the air current generation unit 1262 may be driven, when the laser processing is actually performed.

The exhaust port of an air current supply tube 1262a is disposed very close to the processing surface 100a of the substrate to be treated 100, and the air current is preferably selectively generated only in the vicinity of the irradiation region of the laser beam. Moreover, the gas is exhausted to generate the air current, but may also be sucked to generate the current.

Additionally, the present apparatus relates to the processing in atmosphere, but this is not limited. The method can also be applied to the treatment in pressurizing treatment, or reduced pressure treatment of the substrate to be treated, used with a holder structure can be used in accordance with the respective treatments.

27th Embodiment

In a 27th embodiment, the optical processing apparatus including the apparatus constitution described in the 26th embodiment is used. An example of application to various types of processing required in the manufacturing steps of the semiconductor device will be described. The application example described hereinafter can satisfactorily be achieved using the optical processing apparatus of the 26th embodiment.

First, a case in which the bubble above the exposure region is not considered and the laser beam is emitted to perform the optical processing will be described with reference to FIGS. 61A to 61C.

Figure 61A:
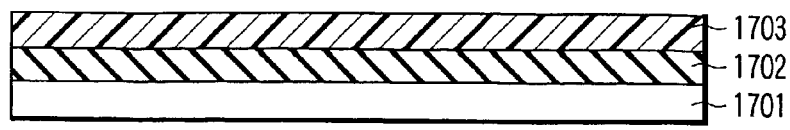
FIGS. 61A to 61C are diagrams showing the optical processing method in which bubbles are not considered.
Figure 61B:
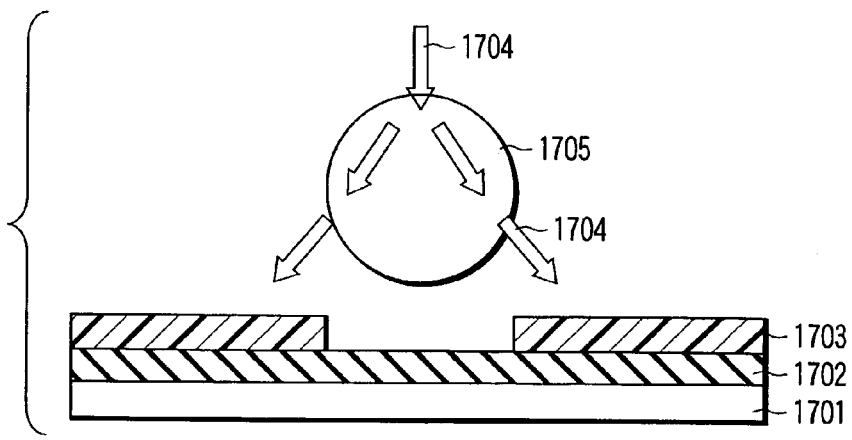

As shown in FIG. 61A, a substrate is prepared, and an insulating film 1702 and resist film 1703 having a film thickness of 1 µm are formed on a silicon wafer 1701. Subsequently, the resist film 1703 in the whole region to be ablated is exposed with the third higher harmonic wave (wavelength 355 nm) of the Q-Switch YAG laser, and removed. The energy density per pulse of the laser beam is 0.4 J/cm²/shot. For example, an oscillation frequency of a laser beam 1704 is set to 250 Hz. A size of the whole region to be ablated is longitudinal 100 µm×lateral 200 µm.

When the resist film is exposed with the laser beam, the film is ablated to generate the bubble. With the presence of the bubble in the optical path, when the next laser beam 1704 is emitted, as shown in FIG. 61B, the laser beam 1704 is scattered by a bubble 1705 remaining above the exposure region. As a result, the outside of the whole region to be ablated is also exposed with the laser beam 1704.

Figure 61C:
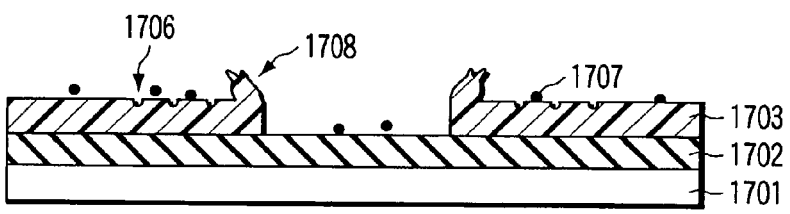

As a result, as shown in FIG. 61C, a large number of pinholes 1706 and particles 1707 are generated by the light scatted outside the processed region. Additionally, film peels 1708 of the resist film are seen in the edge portion of the whole region to be ablated. This film peel remarkably appears also in a compound resist film formed in a multi-layered structure including a photo resist, inorganic film, and anti-reflection film.

Then, in the process in the present embodiment, the laser beam processing apparatus shown in FIG. 59 is used to observe the film. The gas member diameter measurement unit 1261 measures the size of the bubble generated from the exposure region from the image observed by the CCD camera 222. The laser oscillator control unit 212 controls the oscillation of the laser beam in accordance with the measured size.

The optical processing method of the present embodiment will be described with reference to FIGS. 62A and 62B.

Figure 62A:
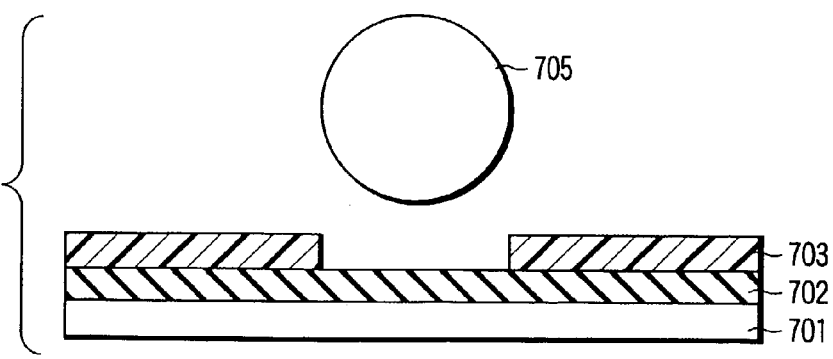
FIGS. 62A and 62B are diagrams showing the optical processing method according to a 27th embodiment.
Figure 62B:
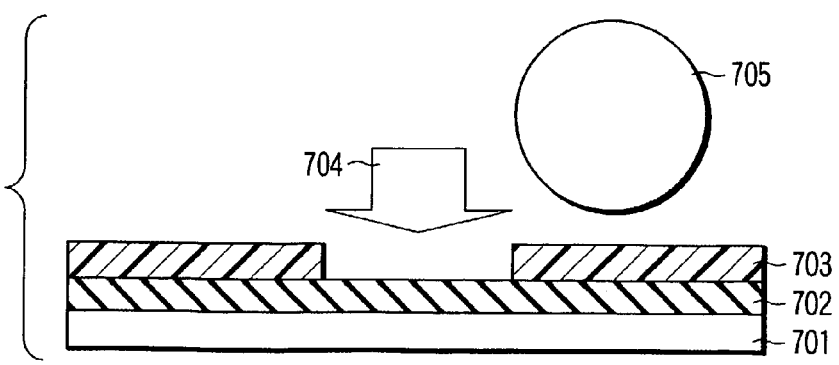

FIGS. 62A and 62B are diagrams showing the optical processing method according to the 27th embodiment of the present invention.

As shown in FIG. 62A, while the bubble 1705 generated in the previous exposure exists above the exposure region of the laser beam in the image obtained from the CCD camera 222, the next exposure is not performed. The gas member diameter measurement unit 1261 confirms that the bubble 1705 is carried by the solution flow and disappears. Thereafter, as shown in FIG. 62B, the exposure with the laser beam 1704 is resumed. While the above-described steps are repeated, the control is executed so as to process the whole region to be ablated.

A relation between the distance from the edge of the whole region to be ablated and the number of pinholes is shown in FIG. 63 in the ablating without considering the existence of the bubbles above the exposure region or in consideration of that. In FIG. 63, A shows the number of pinholes in the ablation considering the existence of the bubbles, and B shows the number of pinholes in the processing without considering the existence of the bubbles. As shown in FIG. 63, when the bubble is considered, the number of pinholes outside the whole region to be ablated remarkably decreases. As a result, the ablation can be performed without influencing a position where a device pattern is to be disposed. Moreover, the peels of the resist film can also be reduced.

Furthermore, even in the result of SEM observation, the pinholes and particles outside the whole region to be ablated are not found, and it has been confirmed that the peels of the resist film in the whole region to be ablated edge portion can be reduced.

Moreover, as shown in FIGS. 64A and 64B, the exposure region of the laser beam preferably has the thinned slit shape against the whole region to be ablated. FIG. 64A is a sectional view, and FIG. 64B is a plan view. As shown in FIGS. 64A and 64B, the shape of an exposure region 1712a of a laser beam 1712 is set to the slit shape (longitudinal 100 µm×lateral 5 µm). Moreover, the laser beam 1712 is relatively scanned against the substrate 1701. A method of relatively scanning the substrate 1701 against exposure region of laser beam 1712 comprises: fixing the light axis of the laser beam; and moving the substrate. Alternatively, the method comprises: translating/moving the slit disposed in the optical path of the laser beam to control the shape; and scanning the laser beam.

As shown in FIGS. 65A and 65B, an exposure region 1711a substantially equal in size to the whole region to be ablated 1710 is exposed with a laser beam 1711 to collectively optically process the whole region to be ablated 1710. In this case, depending on the type or film thickness of the resist, at a first exposure time, the resist film 1703 is peeled in the edge portion of whole region to be ablated 1710, and there is a fear of defect. This is because the resist film 1703 is ablated by the exposure of the laser beam, then a stress generated in an interface between the resist and substrate is enlarged, and the resist film is flied and processed.

Therefore, the method preferably comprises: relatively scanning the thinned slit-shaped light against the substrate; and confirming that the bubble does not exist above the exposure region to perform the predetermined processing. Thereby, since the area processed by one exposure is small, the stress in the interface between the resist and substrate can be relaxed, and the film peels can be reduced.

Moreover, as shown in FIG. 66A, a plurality of slit-shaped exposure regions 1721 may also be relatively scanned against the whole region to be ablated 1720. Furthermore, as shown in FIG. 66B, a plurality of slit-shaped exposure regions 1722 may also be relatively scanned against the whole region to be ablated 1720. Additionally, one dot-shaped exposure region may also be scanned.

In the present embodiment, the third higher harmonic wave of the Q-Switch YAG laser is used as the light source for the processing, but the light source is not limited to this, and the fourth higher harmonic wave (wavelength 266 nm) of the Q-Switch YAG laser, pulse laser such as the KrF excimer laser, and lamp light may also be used. Moreover, the energy density per shot is usually 0.2 J/cm²/shot to 0.5 J/cm²/shot, and the energy density per shot whose range can satisfactorily be processed without damaging the region inside/outside the whole region to be ablated is appropriately adjusted. For the material other than the organic material, the energy density per shot may appropriately be selected without damaging the inside/outside of the whole region to be ablated.

Moreover, the image from the CCD camera is acquired and used as observation means of the bubble, but the observation means of the bubble is not limited to this, and the bubble may also be detected from the scatted light by the bubble or another light incident upon the exposure region.

Next, in a state in which the bubble having the constant diameter remains above the exposure region. FIG. 67 is a diagram showing a relation between the diameter of the bubble and the number of pinholes. As shown in FIG. 67, when the diameter of the bubble is 3 µm or less, the number of generated pinholes is substantially 0. Therefore, with the diameter of the bubble of 3 µm or less, the laser beam is exposed to ablate the whole region to be ablated before the bubble disappears. The throughput can be enhanced.

Moreover, as the result of the SEM observation, when the diameter of the generated bubble is 3 µm or less even, the particles is not seen, and the peels of the resist film in the edge portion the whole region to be ablated has been confirmed to be reduced.

As described above, for the resist film, when the bubble remaining above the exposure region has a diameter of 3 µm or less, the desired processing can be realized without any processing defect such as pinholes. However, the size relation between the pinhole and bubble differs with each type of film to be processed. Therefore, the processing may appropriately be performed so as to satisfy a condition that any pinhole is not generated for each processed film in the relation between the pinhole and bubble diameter.

Figure 68:
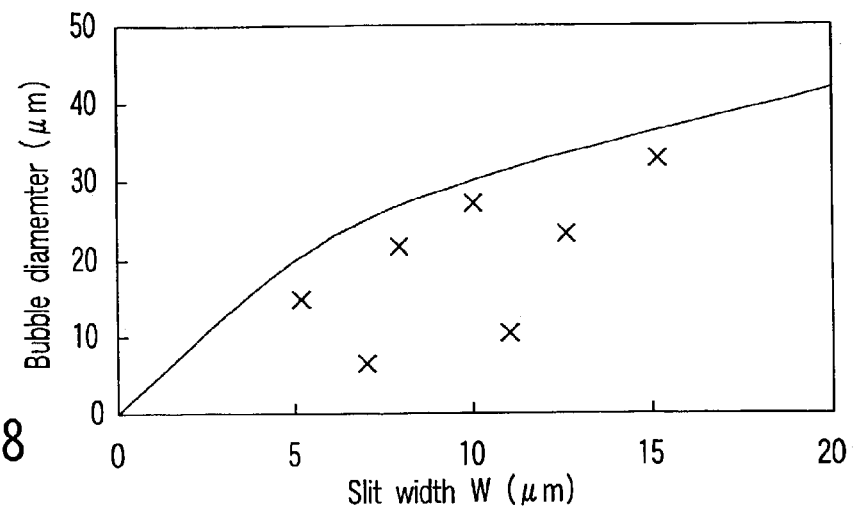
FIG. 68 is a diagram showing a relation between a width W of the irradiation region and a bubble diameter φ generated at a processing time.

Moreover, when the bubble diameter can be estimated beforehand, the flow rate of the solution flow may be optimized. FIG. 68 is a diagram showing a relation between a width W of the exposure region and a bubble diameter φ generated at the ablation. It is to be noted that the energy density per shot of the laser beam is in a range of 0.2 J/cm²/shot to 0.5 J/cm²/shot. The width W of the exposure region indicates the length of the direction in which the solution of the irradiated region flows. As shown in FIG. 68, a curve is represented by the upper limit value of the bubble diameter generated with respect to the irradiation region width W. As a result, at the processing time with an oscillation frequency Z (1/sec) and irradiation region width W, a flow velocity V (µm/sec) in the treated substrate upper part φ/2 (µm) is set so as to satisfy the following relation equation. Thereby, the laser beam can be oscillated substantially in the state free of bubbles.

$$V \geq 6 \times \sqrt{\frac{W}{2}} \times Z$$

When the processing is performed so as to satisfy this relation, the irradiation timing of the laser beam does not have to be controlled in accordance with the size or presence/absence of the bubble. A control unit for controlling any one of the oscillation frequency Z, width W, and flow velocity V so as to satisfy this relation may be disposed. The control unit may also control the flow velocity V in accordance with the preset oscillation frequency Z and width W. or, the control unit may also control the oscillation frequency Z in accordance with the preset flow velocity V and width W.

Figure 69A:
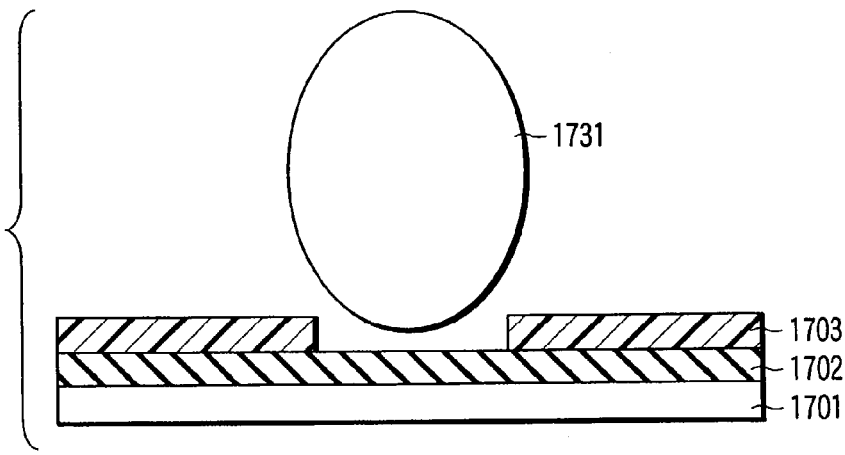
FIGS. 69A and 69B are sectional views showing the optical processing performed while an air current is generated in the processed region in the atmosphere.
Figure 69B:
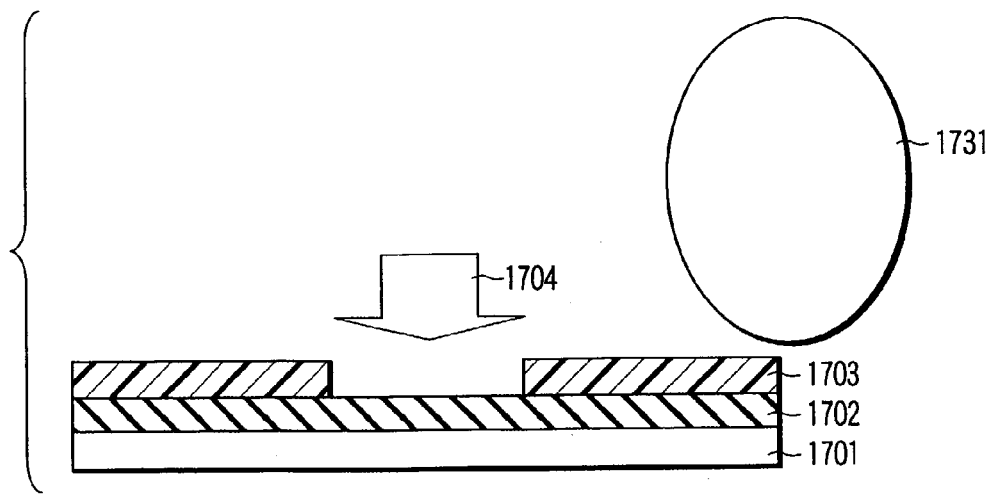

The optical processing performed while generating the air current in the processed region by the laser processing apparatus as shown in FIG. 60 will be described with reference to FIGS. 69A and 69B. As shown in FIG. 69A, in the processing process, the gas member diameter measurement unit 1261 is used to observe a gas member 1731 generated in the air current at the exposure. Subsequently, as shown in FIG. 69B, after confirming that the gas member 1731 disappears above the exposure region, the exposure of the laser beam 1704 is resumed. When the above-described steps are repeated, the satisfactory processing can be achieved. Moreover, also in the processing in an atmosphere, in the same manner as in the optical processing in the solution, the method of relatively scanning the thinned slit-shaped exposure region of the light against the substrate may be used. Furthermore, for the shape of the exposure region, the dot shape, or the arrangement of a plurality of slit or dot shapes may also be used.

In the above-described embodiments, the method of removing the resist film for use in the lithography process by the irradiation has been described. On the other hand, in the semiconductor device, the films such as the polyimide film, Si polycrystalline film, and silicon carbide film are formed, and the method can also be used in removing these films.

28th Embodiment

Figure 70A:
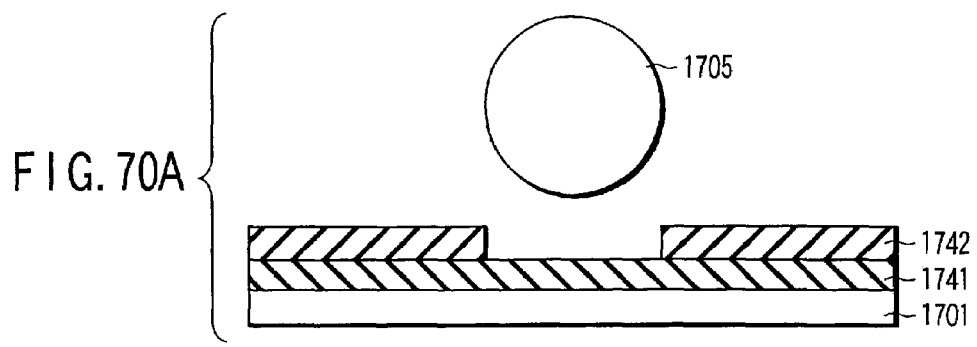
FIGS. 70A and 70B are diagrams showing the manufacturing steps of the semiconductor device according to a 28th embodiment.
Figure 70B:
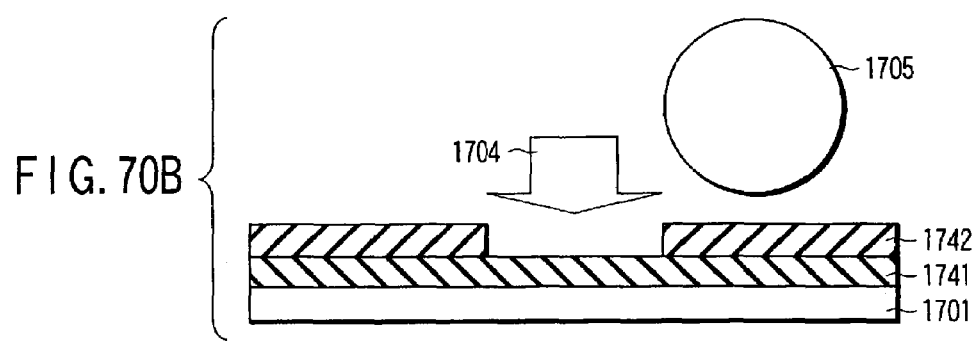

FIGS. 70A and 70B are diagrams showing the manufacturing steps of the semiconductor device according to a 28th embodiment of the present invention. FIGS. 70A and 70B show steps of laser-processing a silicon nitride film 1742 formed on the interlayer insulating film 1741 in the solution. The silicon nitride film 1742 is formed, for example, using CVD or sputtering. The silicon nitride film has a film thickness of 20 nm. The whole region to be ablated of the silicon nitride film (longitudinal 100 µm×lateral 200 µm) is ablated with the fourth higher harmonic wave (wavelength 266 nm) of the Q-Switch YAG laser at an energy density per shot of 0.5 J/cm²/shot.

In the present embodiment, the apparatus shown in FIG. 50 is used to perform the optical processing in the solution. From the image obtained by the CCD camera 222, the gas member diameter measurement unit 1261 measures the diameter of the bubble generated from the exposure region by the exposure of the laser beam. As shown in FIG. 70A, while the bubble 1705 exists above the exposure region, the next exposure of the laser beam is not performed. As shown in FIG. 70B, the bubble 1705 is carried by the solution flow, the gas member diameter measurement unit 1261 confirms that the bubble 1705 disappears, and the exposure of the laser beam 1704 is resumed. The above-described steps are repeated, the processing is performed.

As a result of the SEM observation after the processing, the pinholes or scattered silicon nitride particles were not seen in the surface of the silicon nitride film 1742, and the film peels in the edge portion was not observed.

It is to be noted that the silicon nitride film does not absorb the laser beam of the third higher harmonic wave (wavelength 355 nm), second higher harmonic wave (wavelength 532 nm), or basic wave (wavelength 1064 nm) of the Q-Switch YAG laser. Therefore, these wavelengths cannot be used to process the film.

Moreover, the processing method is not limited to this, and may also be performed in an atmosphere.

29th Embodiment

Figure 71A:
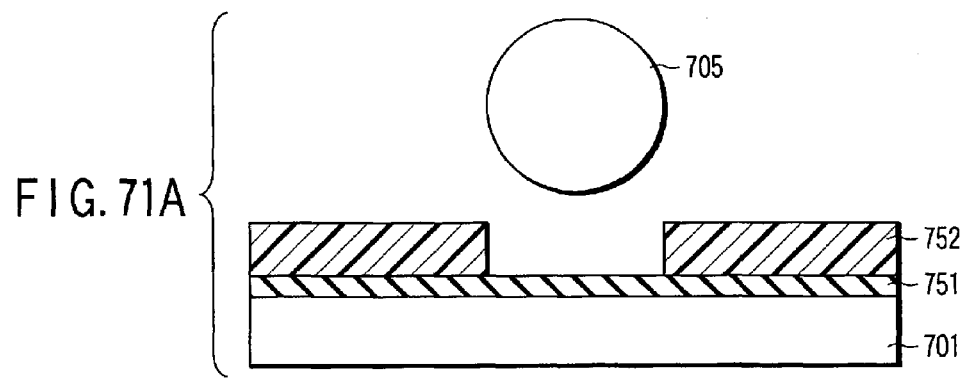
FIGS. 71A and 71B are diagrams showing the manufacturing steps of the semiconductor device according to a 29th embodiment.
Figure 71B:
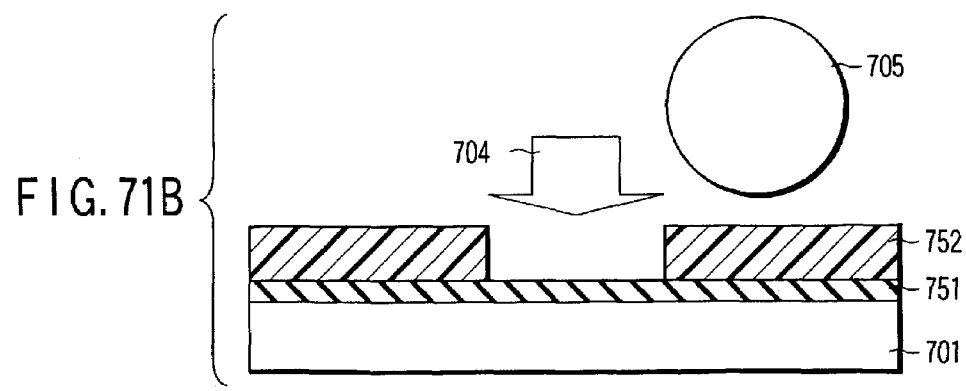

FIGS. 71A and 71B are diagrams showing the manufacturing steps of the semiconductor device according to a 29th embodiment of the present invention. FIGS. 71A and 71B show the steps of laser-processing a polyimide film 1752 formed on the silicon wafer 1701 vian an interlayer insulating film 1751 in the solution. The polyimide film 1752 absorbs the laser beam having a wavelength of 266 nm, and is therefore processed using the fourth higher harmonic wave (wavelength 266 nm) of the Q-Switch YAG laser at an energy density per shot of 0.5 $J/cm^2/shot$.

In the present embodiment, the apparatus shown in FIG. 59 is used to perform the optical processing in the solution. From the image obtained by the CCD camera 222, the gas member diameter measurement unit 1261 measures the diameter of the bubble generated from the exposure region by the exposure of the laser beam. As shown in FIG. 71A, while the bubble 1705 exists above the exposure region, the next exposure of the laser beam is not performed. As shown in FIG. 71B, the bubble 1705 is carried by the solution flow, the gas member diameter measurement unit 1261 confirms that the bubble 1705, and the exposure of the laser beam 1704 is resumed. The above-described steps are repeated, the processing is performed.

As a result of the SEM observation after the processing, the pinholes or scattered polyimide particles were not seen in the surface of the polyimide film 1752. Therefore, it can be confirmed that the satisfactory processing has been performed.

Moreover, the processing method is not limited to this, and the processing may also be performed in the atmosphere.

30th Embodiment

Figure 72A:
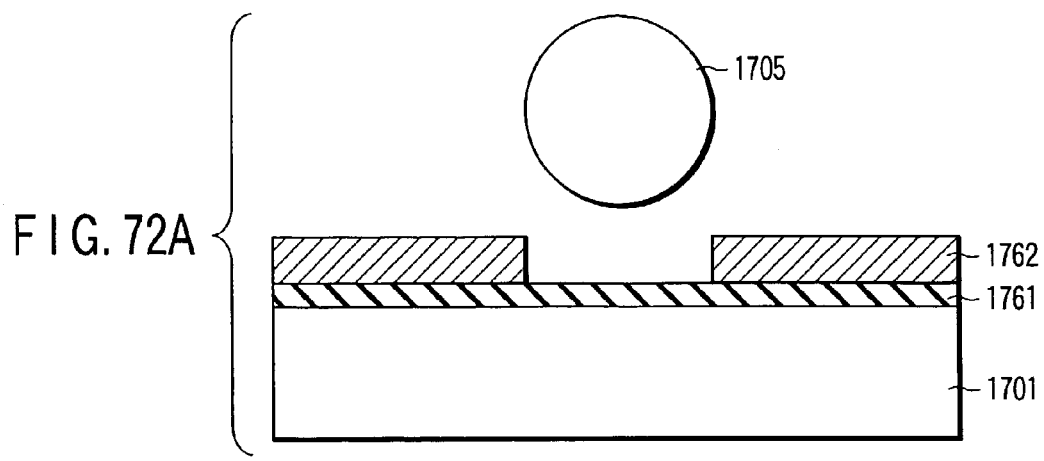
FIGS. 72A and 72B are diagrams showing the manufacturing steps of the semiconductor device according to a 30th embodiment.
Figure 72B:
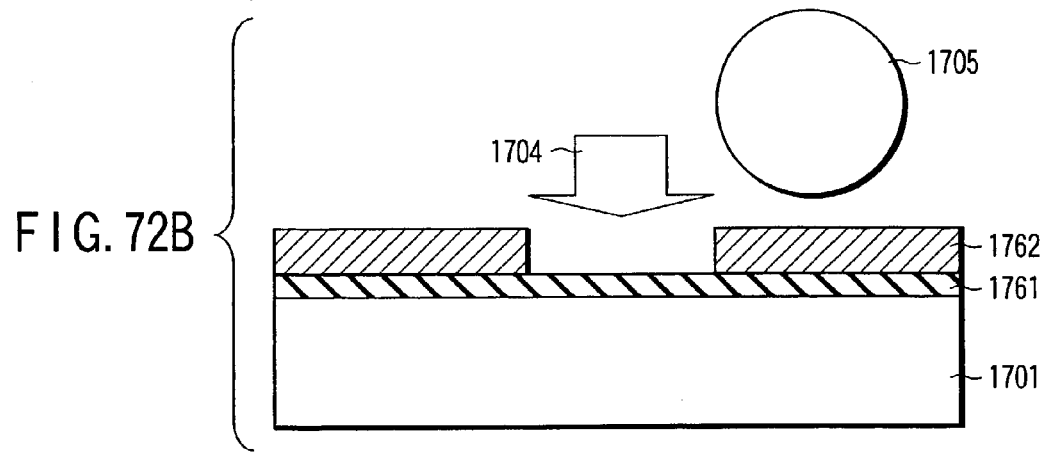

FIGS. 72A and 72B are diagrams showing the manufacturing steps of the semiconductor device according to a 30th embodiment of the present invention. FIGS. 72A and 72B show the steps of laser-processing a metal film 1762 formed on the silicon wafer 1701 via silicon oxide films 1761. In the present embodiment, a copper film is used as the metal film 1762. The surface of the copper film 1762 is exposed with laser ablation. The optically processed copper film 1762 is used, for example, in a wiring for electrically connecting the device to another device, power supply wiring for supplying a power, electrode, and the like.

In the present embodiment, the processing apparatus shown in FIG. 59 is used to perform the processing in the solution. The pure copper film 1762 having a film thickness of 500 nm is exposed with the fourth higher harmonic wave (wavelength 266 nm) of the Q-Switch YAG laser and optically processed. The shape of the irradiation region is longitudinal 100 μm×lateral 200 μm, and the energy density per shot is 3 $J/cm^2/shot$.

At the optical processing time, from the image obtained by the CCD camera 222, the gas member diameter measurement unit 1261 measures the diameter of the bubble generated from the exposure region by the exposure of the laser beam. As shown in FIG. 72A, while the bubble 1705 exists above the exposure region, the next exposure of the laser beam is not performed. As shown in FIG. 72B, the bubble 1705 is carried by the solution flow, the gas member diameter measurement unit 1261 confirms that the bubble 1705 disappears, and the exposure of the laser beam 1704 is resumed. The above-described steps are repeated, the processing is performed.

As a result of the SEM observation after the processing, the pinholes or scattered metal particles were not seen in the periphery of the processed region. Moreover, the film peels in the edge portion were not observed. Therefore, it can be confirmed that the satisfactory processing has been performed.

This effect is similarly achieved, even when the Q-Switch YAG laser is changed to the third higher harmonic wave (wavelength 355 nm), second higher harmonic wave (wavelength 532 nm), and basic wave (wavelength 1064 nm). That is, with the light having the wavelength absorbed by a thin copper film, the thin copper film on the wafer can satisfactorily be processed.

The example in which the copper film is used as the metal film 1762 has been described. However, a compound film in which nickel and chromium films are stacked to enhance corrosion resistance, single-layer film of an aluminum, aluminum alloy (Al—Si, Al—Cu, Al—Cu—Si, and the like) film, compound film in which a barrier metal film or anti-reflection film is stacked on the above-described metal layer can be ablated. Even in this case, a similar effect is obtained.

It is to be noted that the apparatus shown in FIG. 60 may also be used to perform the processing in an atmosphere.

31st Embodiment

The laser processing onto the semiconductor wafer is expected as a dicing technique for cutting out wafer chips. Especially while the semiconductor chip is progressively thinned, or the pattern is progressively miniaturized, as the method of cutting out the semiconductor chip, a pre-dicing technique is effective comprising: forming a trench halfway from the semiconductor wafer surface beforehand (half cut); and thereafter polishing and separating the back surface of the semiconductor wafer until reaching the half cut trench.

Figure 73A:
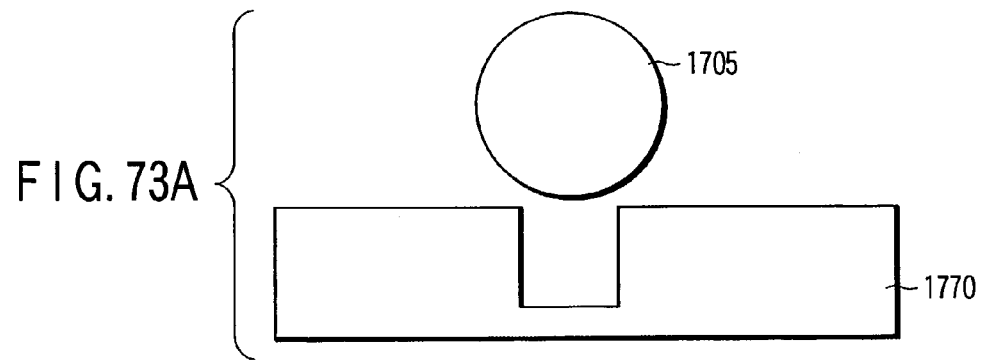
FIGS. 73A and 73B are diagrams showing the manufacturing steps of the semiconductor device according to a 31st embodiment.
Figure 73B:
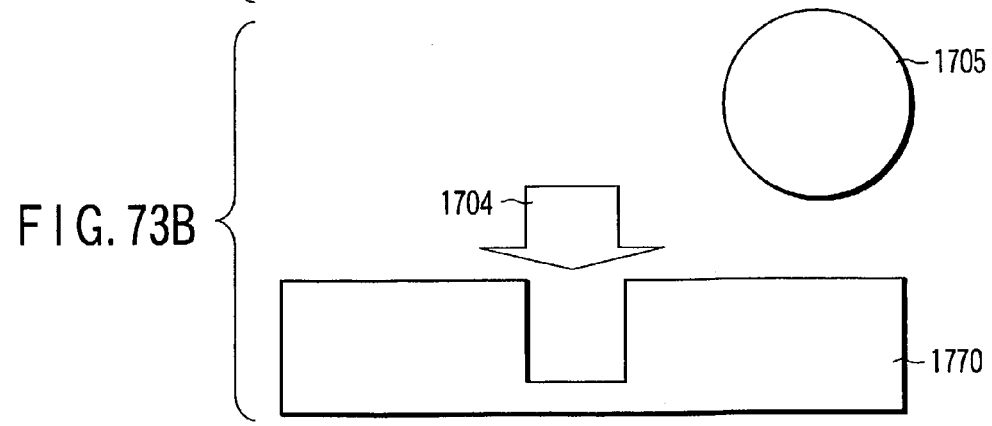

FIGS. 73A and 73B are diagrams showing the manufacturing steps of the semiconductor device according to a 31st embodiment of the present invention. The processing apparatus shown in FIG. 59 is used to perform the processing in the solution. The processing is performed by the exposure with the fourth higher harmonic wave (wavelength 266 nm) of the Q-Switch YAG laser. The shape of the exposure region of the laser beam at the processing time is a rectangular shape with 10 μm in a short-side direction and 500 μm in a long-side direction. The energy density per shot of the laser beam is 4 $J/cm^2/shot$. The exposure region of the laser beam is relatively scanned against a semiconductor wafer 1770 at a speed of 10 mm/sec in the long-side direction to form a dicing line (trench) around each semiconductor device. Moreover, the formed trench has a width of about 10

μm and depth of 50 μm. In the processing process, the size of the bubble generated from the exposure region by the laser beam is observed.

At the optical processing time, from the image obtained by the CCD camera 222, the gas member diameter measurement unit 1261 measures the diameter of the bubble generated from the exposure region by the exposure of the laser beam. As shown in FIG. 73A, while the bubble 1705 exists above the exposure region, the next exposure of the laser beam is not performed. As shown in FIG. 73B, the bubble 1705 is carried by the solution flow, the gas member diameter measurement unit 1261 confirms that the bubble 1705 has disappeared, and the exposure of the laser beam 1704 is resumed. The above-described steps are repeated, the processing is performed. After the processing, the semiconductor wafer 1770 is polished from a back surface side and separated.

As a result of the SEM observation after the processing, the pinholes or scattered silicon wastes were not seen in the vicinity of the whole region to be ablated. Moreover, the film peels in the edge portion of the whole region to be ablated were not observed. Therefore, it can be confirmed that the satisfactory processing has been performed.

In the above-described optical processing, the fourth higher harmonic wave (wavelength 266 nm) of the Q-Switch YAG laser is used. However, this effect is similarly achieved, even when the Q-Switch YAG laser is changed to the third higher harmonic wave (wavelength 355 nm), second higher harmonic wave (wavelength 532 nm), and basic wave (wavelength 1064 nm). Additionally, with the light having a wavelength absorbed by the silicon wafer, the silicon wafer can satisfactorily be processed. Moreover, the processing apparatus shown in FIG. 60 may also be used to perform the processing in the atmosphere.

Furthermore, in FIG. 60 the dicing line is formed in the silicon wafer, and the technique of forming the dicing line by the present processing method can also be applied to the separation of the device of the light emitting diode or semiconductor laser formed of compound semiconductors such as Ga, P, As, In, Al.

32nd Embodiment

In addition to the pre-dicing method described in the 31st embodiment, the present processing method can also be used in a technique of finally dicing the silicon wafer thinned beforehand. FIGS. 74A to 74D are diagrams showing the manufacturing steps of the semiconductor device according to a 32nd embodiment. FIGS. 74A to 74D are diagrams showing this post-dicing process.

Figure 74A:
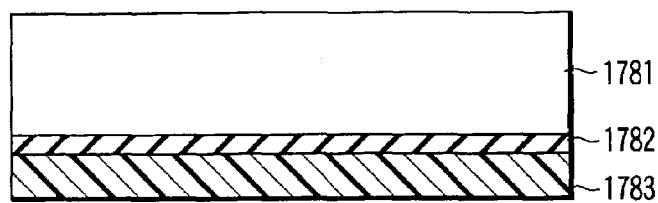
FIGS. 74A to 74D are diagrams showing the manufacturing steps of the semiconductor device according to a 32nd embodiment.

First, as shown in FIG. 74A, a device layer 1782 of a silicon wafer 1781 is held by a dicing tape 1783. Here, the semiconductor device and multilayered wiring layer are formed in the device layer 1782. A passivation layer is formed in the uppermost layer of the device layer 1782.

Figure 74B:
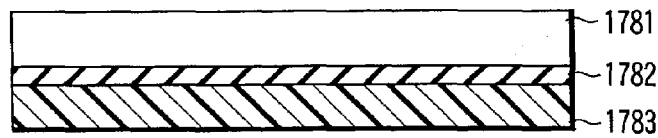

Subsequently, as shown in FIG. 74B, the silicon wafer 1781 is mechanically polished from the back surface, and the silicon wafer 1781 is formed into a thin film. In the polished surface of the thin-film silicon wafer 1781, a fractured layer is formed because of a mechanical stress and intense deterioration. To prevent the intense deterioration, the fractured layer is removed by wet etching, and chip strength is inhibited from dropping.

Figure 74C:
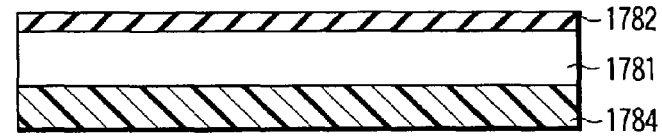

Subsequently, as shown in FIG. 74C, the dicing tape 1783 is removed. Subsequently, the wafer is turned over and the back surface of the silicon wafer 1781 is held by a dicing tape 1784.

Figure 74D:
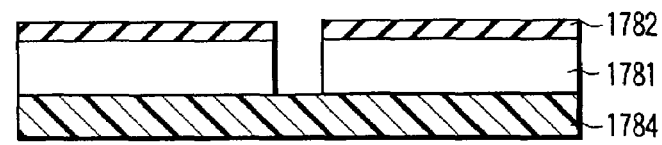

Subsequently, as shown in FIG. 74D, the device layer 1782 is processed to be ablated with the light. In the present embodiment, the processing apparatus shown in FIG. 59 is used to perform the processing in the solution. The processing is performed by the exposure with the fourth higher harmonic wave (wavelength 266 nm) of the Q-Switch YAG laser. The energy density per shot of the laser beam is 4 $J/cm^2/shot$.

In the processing process, in the same manner as described above, from the image obtained by the CCD camera 222, the gas member diameter measurement unit 1261 measures the diameter of the bubble generated from the exposure region by the exposure of the laser beam. As shown in FIG. 73A, while the bubble 1705 exists above the exposure region, the next exposure of the laser beam is not performed. As shown in FIG. 73B, the bubble 1705 is carried by the solution flow, the gas member diameter measurement unit 1261 confirms that the bubble 1705 has disappeared, and the exposure of the laser beam 1704 is resumed. The above-described steps are repeated, the processing is performed. While the above-described steps are repeated, the wafer 1781 is exposed with the light, processed, and cut. Thereby, micro processing wastes can be prevented from sticking to the device layer 1782.

When a blade is used to perform the dicing, a chip side wall is damaged, and the chip strength drops. Moreover, in a region having a thickness of 50 μm or less, the chip is cracked during the dicing by the blade, and there is a problem that the yield drops. On the other hand, the present processing method can be used to form the dicing line without breaking any chip even in the wafer thickness of 50 μm or less. Moreover, the processing apparatus shown in FIG. 60 may also be used to perform the processing in the atmosphere.

33rd Embodiment

Figure 75A:
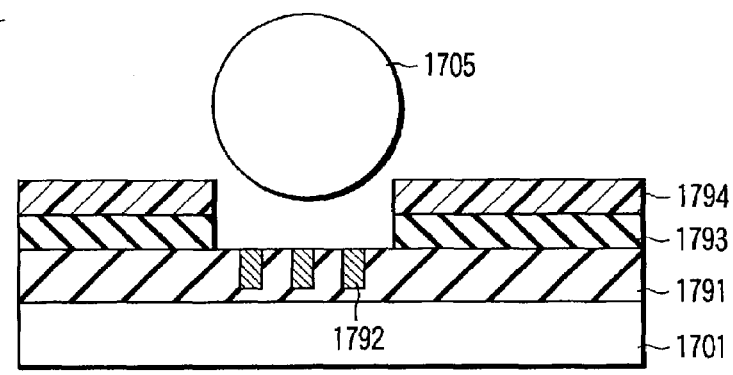
FIGS. 75A and 75B are diagrams showing the manufacturing steps of the semiconductor device according to a 33rd embodiment.
Figure 75B:
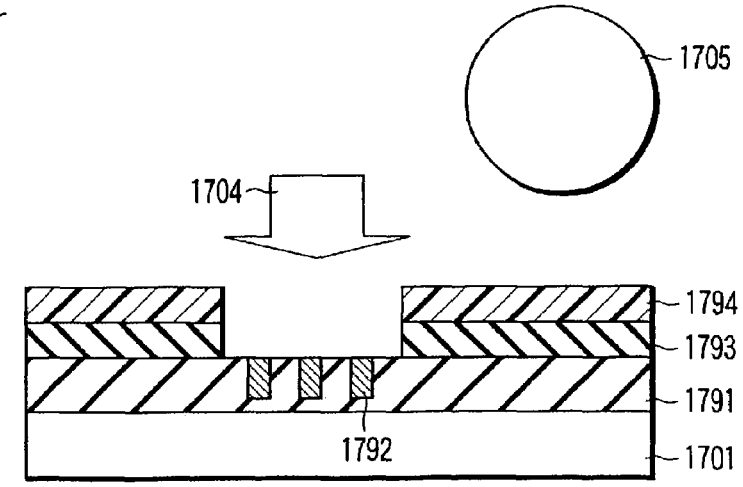

FIGS. 75A and 75B are diagrams showing the manufacturing steps of the semiconductor device according to a 33rd embodiment of the present invention. FIGS. 75A and 75B show the steps of removing an anti-reflection film 1793 and resist 1794 on alignment marks 1792 by the laser processing. The alignment marks 1792 are buried/formed in an insulating film 1791 formed on the silicon wafer 1701.

At the optical processing time, from the image obtained by the CCD camera 222, the gas member diameter measurement unit 1261 measures the diameter of the bubble generated from the exposure region by the exposure of the laser beam. As shown in FIG. 75A, while the bubble 1705 exists above the exposure region, the next exposure of the laser beam is not performed. As shown in FIG. 75B, the bubble 1705 is carried by the solution flow, the gas member diameter measurement unit 1261 confirms that the bubble 1705 has disappeared, and the exposure of the laser beam 1704 is resumed. The above-described steps are repeated, the processing is performed.

As a result of the SEM observation after the processing, the pinholes or resist film wastes were not seen in the treated substrate surface. Moreover, the film peels in the edge portion of the whole region to be ablated were not observed. When the surface is processed without being influenced by the scattering by the bubbles remaining above the exposure region, the alignment mark can be exposed without any processing defect.

It is to be noted that the processing apparatus shown in FIG. 60 may also be used to perform the processing in the atmosphere.

34th Embodiment

A global wiring extends over circuit blocks on the chips, and is an upper-layer wiring which supplies global clocks. Since the wiring is a long-distance wiring, it is necessary to reduce wiring delay as much as possible, and it is important to reduce resistance. Therefore, the above-described optical processing method is effectively applied in which the generation of the micro particles and pinholes can effectively be inhibited.

FIGS. 76A to 76F are sectional views showing the manufacturing steps of the semiconductor device according to a 34th embodiment of the present invention. FIGS. 76A to 76F show the steps of forming a single-layer global wiring.

Figure 76A:
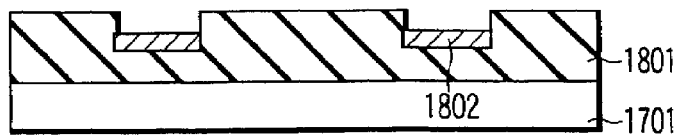
FIGS. 76A to 76F are sectional views showing the manufacturing steps of the semiconductor device according to a 34th embodiment.
Figure 76B:
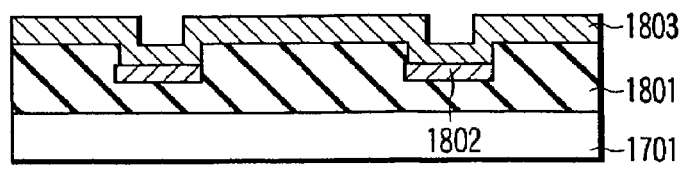
Figure 76C:
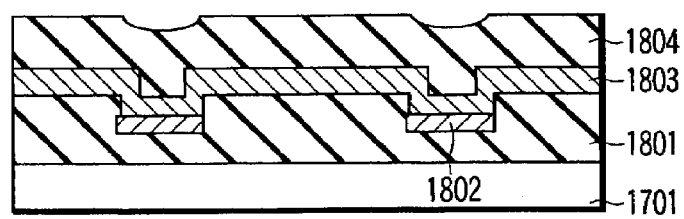

First, as shown in FIG. 76A, a substrate is prepared including pads 1802 formed on the silicon wafer 1701 vian an insulating film 1801. Subsequently, as shown in FIG. 76B, a thin metal film 1803 such as Cu/Ta/TaN, Pd/Ti/Ni is formed on the whose surface of the insulating film 1801 and pads 1802. Subsequently, as shown in FIG. 76C, a resin insulating film 1804 is formed on the thin metal film 1803.

Figure 76D:
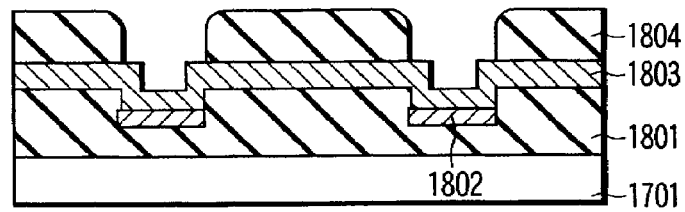

Subsequently, as shown in FIG. 76D, the resin insulating film 1804 on the pads formed below layer is exposed with the light, and the trench is formed in the resin insulating film 1804. In the processing process, in the same manner as described above, from the image obtained by the CCD camera 222, the gas member diameter measurement unit 1261 measures the diameter of the bubble generated from the exposure region by the exposure of the laser beam. While the bubble 1705 exists above the exposure region, the next exposure of the laser beam is not performed. The gas member diameter measurement unit 1261 confirms that the bubble 1705 has disappeared, and the exposure of the laser beam 1704 is resumed. The above-described steps are repeated, the processing is performed.

When the optical processing is performed, the satisfactory pattern can be formed in the processed surface without the pinholes or particles.

Figure 76E:
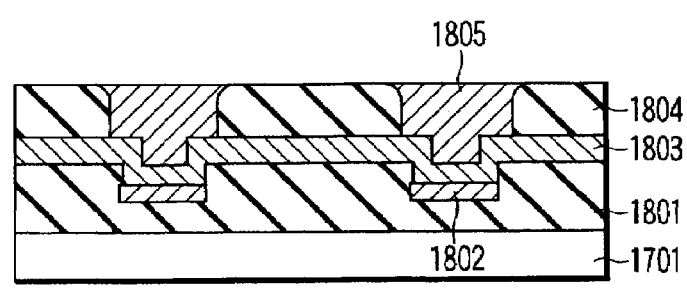
Figure 76F:
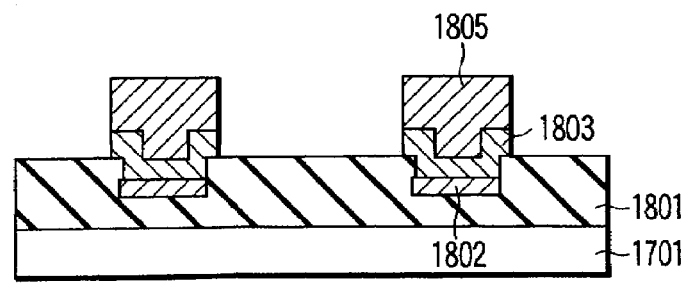

Subsequently, as shown in FIG. 76E, Cu, Au, solder, and the like are buried in the trench formed in the resin insulating film 1804 to form a plated layer 1805 by electrolytic plating. Finally, as shown in FIG. 76F, the resin insulating film 1804 is removed by an organic solvent, and acids such as acetic acid, hydrochloric acid, nitric acid, and rare hydrofluoric acid are used to remove the metal film 1803. Thereby, the global metal wiring and metal bumps are formed.

In this method, an expensive mask for exposure or CMP is not required as in the related-art lithography process, and the wiring can be accurately formed on the substrate. It is to be noted that the processing apparatus shown in FIG. 60 may also be used to perform the processing in an atmosphere.

35th Embodiment

Figure 77A:
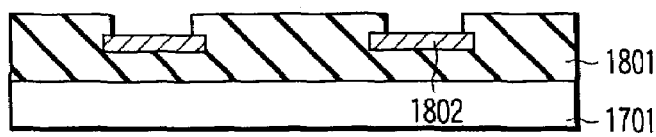
FIGS. 77A to 77H are sectional view showing the manufacturing steps of the semiconductor device according to a 35th embodiment.
Figure 77B:
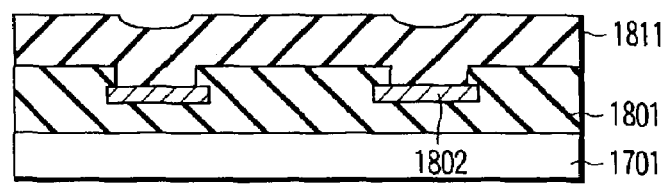

FIGS. 77A to 77H are sectional views showing the manufacturing steps of the semiconductor device according to a 35th embodiment of the present invention. FIGS. 77A to 77H show the steps of forming a multilayered global wiring. First, as shown in FIG. 77A, a substrate is prepared including the pads 1802 formed on the silicon wafer 1701 via the insulating film 1801. Subsequently, as shown in FIG. 77B, a first resin insulating film 1811 is formed on the insulating film 1801.

Figure 77C:
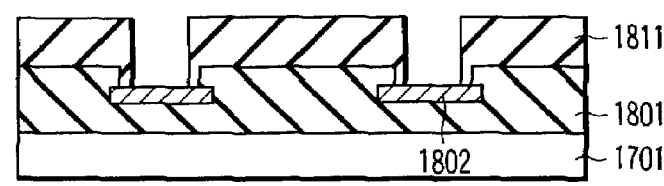

Next, a predetermined portion of the first resin insulating film 1811 is irradiated with the laser beam to perform the optical processing. The apparatus shown in FIG. 59 is used to perform the optical processing in the solution flow. In the optical processing, as shown in FIG. 77C, the first resin insulating film 1811 on the pads 1802 is removed, and via-holes in which the pads are exposed are formed.

Figure 77D:
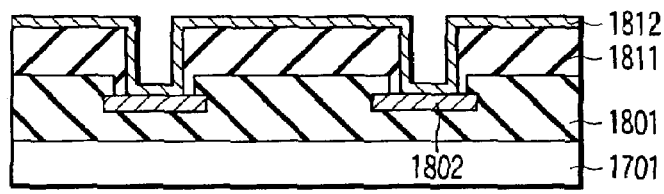
Figure 77E:
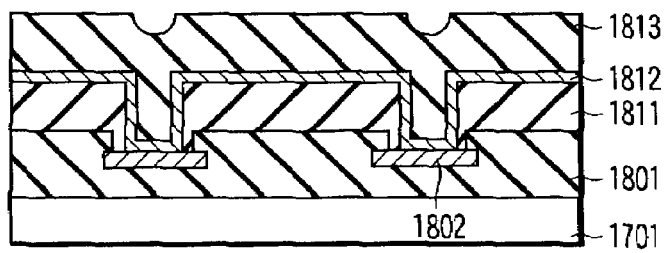
Figure 77F:
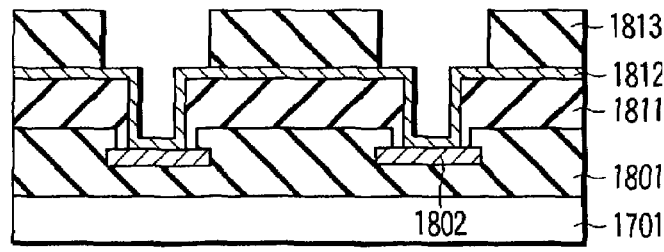

Subsequently, as shown in FIG. 77D, a metal film 1812 such as Cu/Ta/TaN, Pd/Ti/Ni is formed on the first resin insulating film. Subsequently, as shown in FIG. 77E, a second resin insulating film 1813 is formed on the metal film 1812. Subsequently, the second resin insulating film 1813 is irradiated with the laser beam again, and optically processed. In the optical processing, as shown in FIG. 77F, the via-holes and wiring trenches are formed.

Figure 77G:
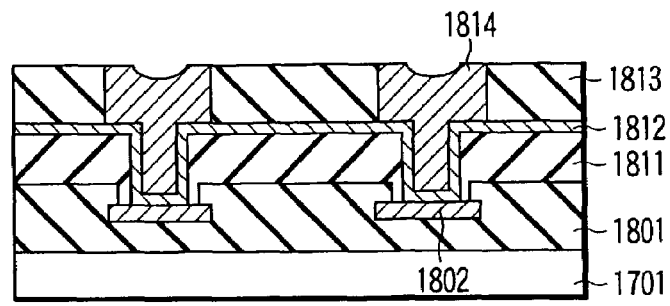
Figure 77H:
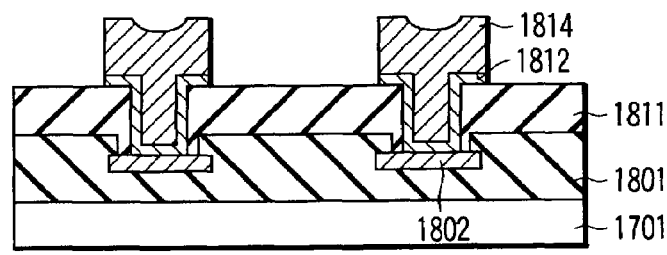

Subsequently, as shown in FIG. 77G, Cu, Au, and the like are buried/formed in the via-holes and wiring trenches-to form a plated layer 1814 by the electrolytic plating. Finally, as shown in FIG. 77H, the second resin insulating film 1813 is removed by the organic solvent. Furthermore, the thin metal film 1812 is etched by the acid solution to form metal wirings.

In the above-described forming, without using the photolithography process incurring a high manufacturing cost, the multilayered wiring can be exactly formed with high reliability.

The above-described steps can also be applied in forming solder or Au bumps on the semiconductor device surface, or forming the global wiring, or wiring on a packaged substrate.

Moreover, for the processing method, a satisfactory processing method may appropriately be selected from the processing method described in the 27th embodiment.

36th Embodiment

In recent years, a chip-on-chip technique of forming a through hole in the semiconductor device and stacking the semiconductor chips which are metal wirings such as Cu buried in the through hole has been noted.

Figure 78:
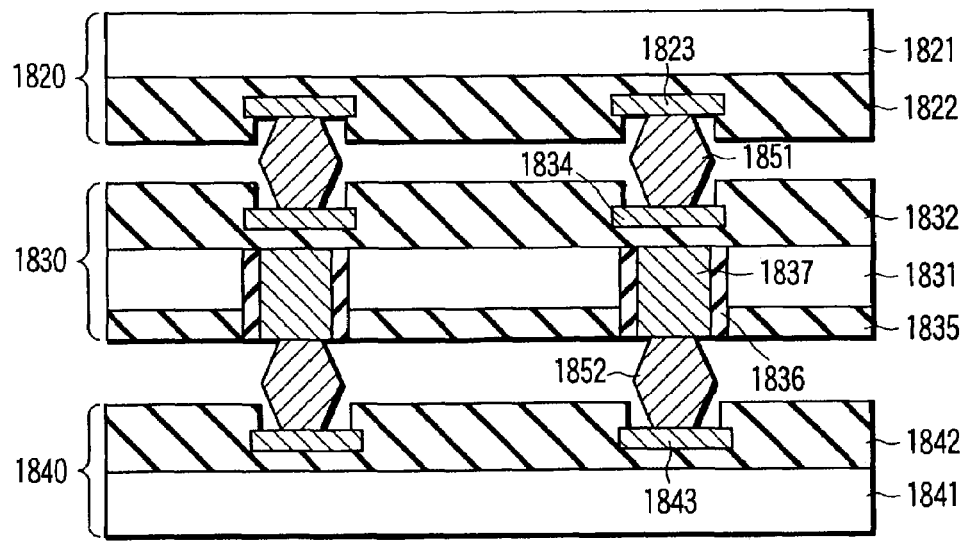
FIG. 78 is a sectional view showing the semiconductor device of a chip-on-chip type according to a 36th embodiment.

FIG. 78 is a sectional view showing the semiconductor device of a chip-on-chip type according to a 36th embodiment of the present invention. As shown in FIG. 78, a second chip 1830 is held between first and third chips 1820 and 1840 including metal bumps 1851, 1852 on pads 1823, 1843. The second chip 1830 includes through plugs 1837 having through holes filling metal. By connection among the stacked chips, a wiring length can be largely reduced, and wiring delay can be suppressed. It is to be noted that in FIG. 78 reference numerals 1821, 1831, 1841 denote silicon wafers, reference numerals 1822, 1832, 1842 denote device layers, 1835 denotes a passivation layer, and 1836 denotes a side-wall insulating film.

At present, the through holes are made/processed by RIE. However, a processing rate is slow and productivity is low.

Figure 79A:
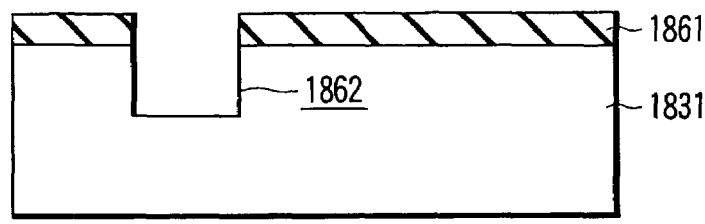
Figure 79B:
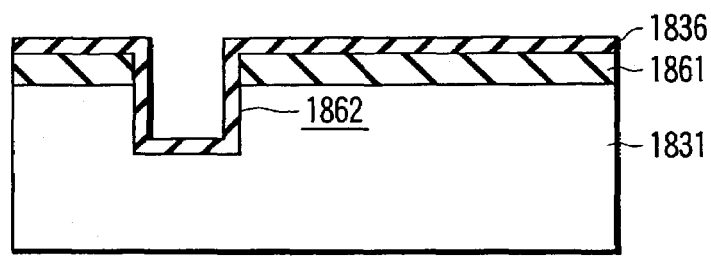

FIGS. 79A to 79H are sectional views showing the manufacturing steps of the semiconductor device according to the 36th embodiment of the present invention. FIGS. 79A to 79H show an example of steps of forming the through hole in the chip for use in the semiconductor device of the chip-on-chip type. First, as shown in FIG. 79A, a substrate is prepared in which a semiconductor device (not shown) and silicon oxide film 1861 are formed on a silicon wafer 1831. When the laser processing is performed in a method similar to that of the 27th embodiment, a through hole 1862 is formed in the silicon oxide film 1861 and silicon wafer 1831. Here, apparatus as shown in FIG. 59 is used to ablate the region. Subsequently, as shown in FIG. 79B, a second silicon oxide film 1836 is formed on the surface of the through hole 1862.

Figure 79C:
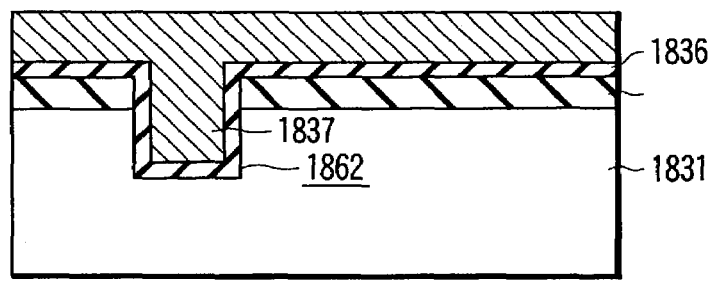
Figure 79D:
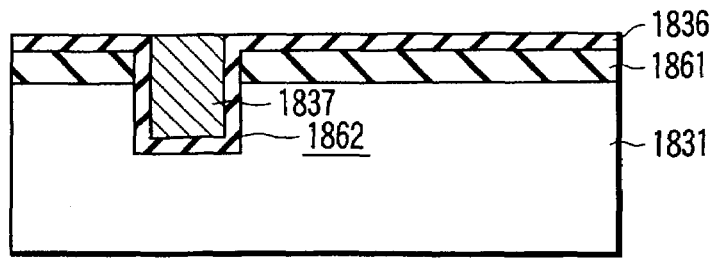

Subsequently, as shown in FIG. 79C, a metal film 1837 is formed on the through hole 1862 and the second silicon oxide film 1836. Subsequently, as shown in FIG. 79D, the surface of the metal film 1837 is flattened, and the through plug 1837 is formed in the through hole 1862. Subsequently, as shown in FIG. 79E, an interlayer insulating film 1863 is formed on the second silicon oxide film 1836, and pad 1834 is formed in the interlayer insulating film 1863. It is to be noted that reference numerals 1861, 1836, 1863 on the silicon wafer 1831 correspond to the device layer 1832.

Subsequently, as shown in FIG. 79F, the silicon substrate is formed into the thin film by polishing. Subsequently, as shown in FIG. 79G, the passivation layer is formed on the back surface of the silicon wafer 1831. Subsequently, as shown in FIG. 79H, the surface of the passivation layer 1835 is flattened to expose the through plug 1837 and to form a connection surface with the bump.

By the present processing method, a satisfactory processed shape is achieved without pinholes or particles, which enhances the operation reliability of the final semiconductor device.

Moreover, the apparatus shown in FIG. 60 may also be used to perform the processing in the atmosphere.

37th Embodiment

In a 37th embodiment, a step of using the optical processing apparatus described in the 26th embodiment to process a photoresist film which is the organic material formed on the aluminum film will be described. It is to be noted that in the present embodiment, instead of the gas member diameter measurement unit 1261, a control unit is disposed to control at least one of the exposure position of the laser beam at the exposure irradiation timing of the laser beam and the scan speed with respect to the substrate.

The aluminum film formed on the semiconductor substrate (wafer) having a diameter of 300 nm is coated with the photoresist film by a spin coat process, and subsequently heated to form the photoresist film having a film thickness of 1 µm on the aluminum film. Next, the third higher harmonic wave (wavelength 355 nm) of the Q-Switch YAG laser is exposed to ablate the photoresist film in the whole region to be exposed. Here, the energy density per pulse was set to 0.5 J/cm$^2$/pulse. The ablation was performed in a state in which pure water flows.

The exposure region has a slit shape having a length of 80 µm and width of 5 µm, and a substrate hold mechanism is relatively scanned against exposure light. The region to be ablated was set to 80 µm×100 µm, and the number of scans is twice for reciprocation.

Figure 80A:
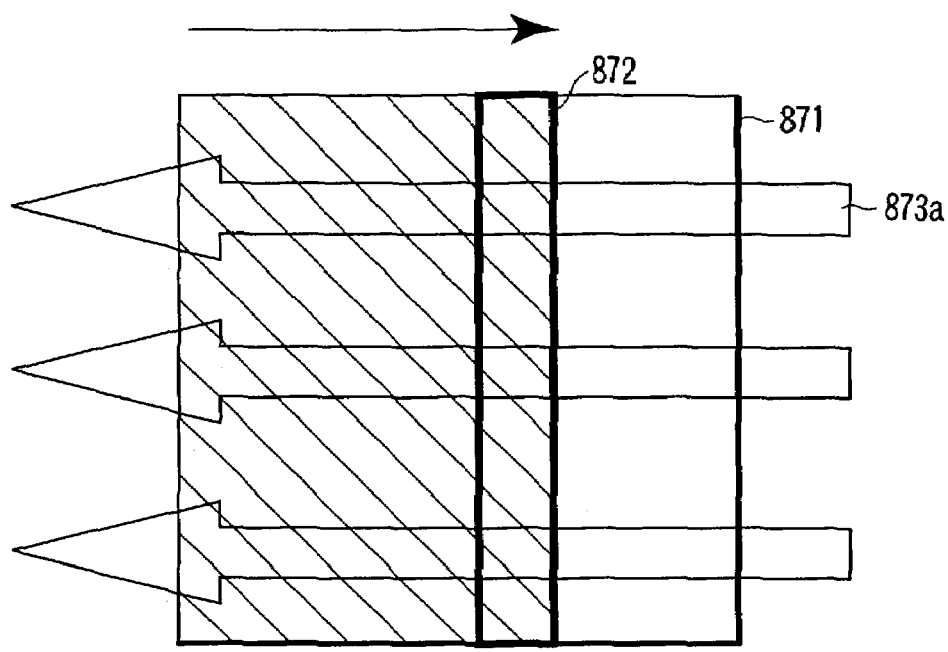
FIGS. 80A and 80B are plan views showing a relation between the processed region and solution flow according to a 37th embodiment.
Figure 80B:
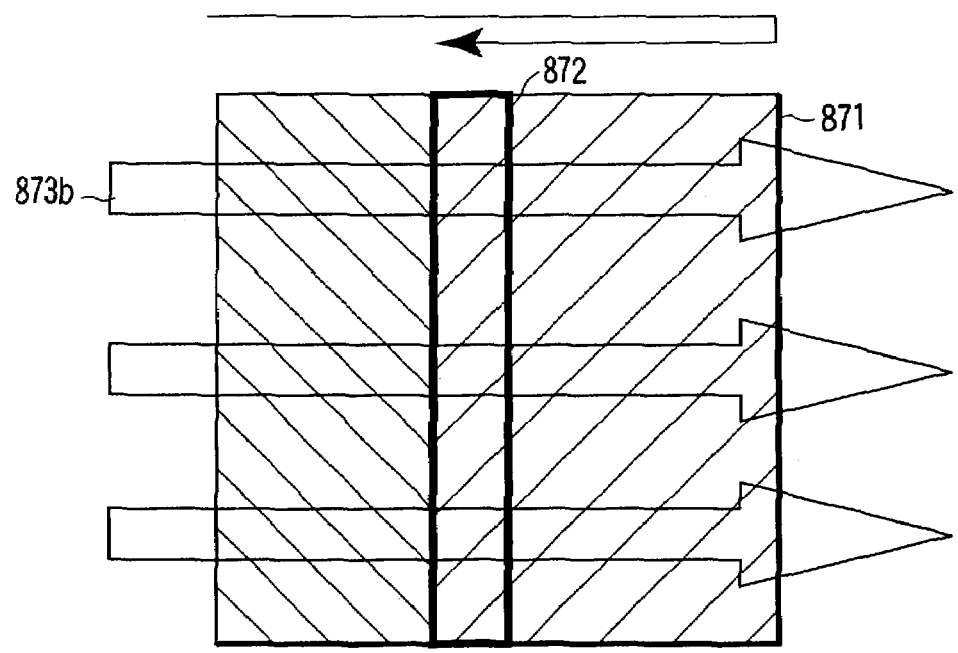

FIGS. 80A and 80B are plan views showing a relation between the processed region and solution flow. In a first scan, as shown in FIG. 80A, an exposure region 1872 relatively scans to the right from the left against the whole region to be ablated 1871. At this time, the direction of a solution flow 1873a is set to be opposite to a scan direction. When the scan direction and the solution flow direction are reversed, the bubble generated by the exposure moves toward a downstream side, and the next exposure is not influenced. In a second scan after the end of the whole region to be ablated is reached, as shown in FIG. 80B, the direction of a solution flow 1873b is set so as to change to a direction opposite to the direction at the first scan time. Here, the speed of the flowing liquid was set to 1 m/s.

A process for obtaining an optimum oscillation frequency of laser will be described hereinafter. Assuming the scan speed is v (µm/s), and the oscillation frequency of laser is f (1/s), a movement distance xper pulse is represented by x=v/f. When the movement distance x per pulse is smaller, the number of superposed exposures increases, and therefore the exposed energy amount increases. On the other hand, when the movement distance x increases, the exposed energy amount decreases.

Moreover, when the laser is repeatedly emitted to remove the processed film, ablation reaction is promoted by heat storage effect with the increase of the frequency f. The present inventors have noted v/f$^2$ obtained by dividing the movement distance x per pulse by the frequency f. That is, it has been considered that the irradiation reaction progresses with the decrease of v/f$^2$. Here, the scan speeds are set to 1000 µm/sec and 80 µm/sec, and the oscillation frequency f of the laser is changed. It is seen from FIG. 81 that a range of v/f$^2$ indicating a small total defect arean and satisfactory processing characteristic is not less than about 6.0×10$^{-5}$ (µm·sec) and not more than 1.0×10$^{-3}$ (µm·sec). In the region where v/f$^2$ is small, the irradiation reaction excessively progresses as described above, and therefore the photoresist film, which is a mask material, changes in properties and forms the defect. On the other hand, in the region where v/f$^2$ is large, conversely the ablation reaction is insufficient, and the photoresist film is insufficiently removed, which forms defects.

From the result of FIG. 81, a center of the satisfactory v/f$^2$ range was obtained, and a condition of v/f$^2$ was set to 3.0×10$^{-4}$ (µm·sec). When the scan speed v was set to 1000 µm/sec, oscillation frequency f=1825 Hz was obtained.

It is to be noted that on this condition the bubble generated by the previous irradiation was quickly transported toward the downstream side by the flowing liquid and did not exist at the next irradiation time. Therefore, a satisfactory processing can be performed without the bubble causing any processing defect.

On the above-described condition, after ending the processing of the photoresist film by the laser irradiation, the wafer was submerged in an etching solution for aluminum, and the photoresist film was used as a mask to selectively etch the aluminum film. Subsequently, the photoresist film, which was the mask material, was removed. When the processed state was observed by an optical microscope, satisfactory patterning was confirmed without any defect.

As described above, the movement distance x per pulse is divided by the frequency f to obtain v/f$^2$ as the above-described range, and it is possible to realize a satisfactory rough patterning without any defect.

It is to be noted that in the present embodiment the scan speed v is set to 1000 µm/sec, but the present invention is not limited to this. A combination of the scan speed v and oscillation frequency f, which satisfies an optimum value of v/f$^2$, may be obtained. From a viewpoint of reduction of treatment time, the scan speed is preferably high.

In the present embodiment, the slit width was set to 5 µm, but is not limited to this. A similar effect can be obtained with a slit range of 2 µm to 20 µm, and this was confirmed by experiment. From a viewpoint of the processed shape, a slit width in the range of 2 µm to 5 µm is preferable.

Moreover, in the present embodiment, the third higher harmonic wave of the Q-Switch YAG laser is used as the light source for the processing, but the light source is not limited to this, and the fourth higher harmonic wave (wavelength 266 nm) of the Q-Switch YAG laser, pulse laser such as the KrF excimer laser, and lamp light may also be used.

Moreover, in the present embodiment, the processing of the photoresist film on the aluminum film has been described, but the present invention is not limited to this, and can also be applied to another organic film.

Furthermore, the energy density per pulse was set to 0.5 J/cm²/pulse in the present embodiment, but is not limited to this. The energy density per pulse is set to a value at which satisfactory patterning is possible without any defect, and thereby a similar effect can be obtained.

38th Embodiment

In the present embodiment, an example will be described in which the optical processing apparatus including the apparatus constitution described in the 26th embodiment is used and applied to various types of processing required in the manufacturing process of the semiconductor device.

A semiconductor substrate (wafer) having a diameter of 300 nm was coated with a coat spun on carbon film by a spin coat process to form the film having a thickness of 300 nm. Next, the third higher harmonic wave (wavelength 355 nm) of the Q-Switch YAG laser was used to remove the region to be removed in the film. Here, the energy density per pulse was set to 0.35 J/cm²/pulse. The exposure was performed in the state of the flowing pure water.

For the exposure region, as shown in FIG. 82, a slit-shaped exposure region 1881 having a width a (μm) and length b (μm) was used. The conditions of the width a (μm) and length b (μm) were changed to change the size of the exposure region 1881, and particle amount per pulse was evaluated.

FIG. 83 shows a relation between total sum of areas of particles and total sum of the length (hereinafter referred to as total extension of the side) of the side of the slit-shaped exposure region represented by 2×(a+b).

As shown in FIG. 83, in the range where the total extension of the side is 180 μm or more, as the total extension of the side increases, the total sum of particle areas increases. Moreover, in the range where the total sum of the length of the side is 180 μm or less, as the total length of the side decreases, the total sum of particle areas remarkably decrease. That is, it has been clarified by experiment that the total extension of the side is preferably 180 μm or less in order to perform the processing with few particles.

From this result, the exposure region was set to have a width of 5 μm and length of 80 μm, and the processing was performed by the exposure. For the exposure region condition, since the total extension of the side is 170 μm, the above-described condition is satisfied.

The exposure region was relatively scanned against the substrate hold mechanism, and the substrate were relatively scanned against exposure light. The whole region to be ablated was set to 80 μm×100 μm, and the number of scans were set to two for the reciprocation. The scan speed v was set to 600 μm/sec, and the oscillation frequency f was set to 1414 Hz. Since the relation between the scan direction and flowing liquid is similar to that of the 37th embodiment, the detailed description is omitted here.

The ablation was performed with the exposure region whose shape a width of 40 μm and length of 80 μm on which the exposure region does not satisfy the above-described conditions. In this case, a large number of particles were generated.

On the other hand, when the ablation was performed with the exposure region satisfying the above-described conditions and having a width of 5 μm and length of 80 μm, it was possible to obtain remarkably satisfactory processing characteristics with few particles.

When the total sum of the lengths of the side of the slit-shaped exposure region was set to 180 μm or less, it was possible to realize a remarkably satisfactory processing with few particles.

It is to be noted that in the present embodiment the scan speed v was set to 600 μm/sec, but is not limited to this, and can appropriately be changed.

Moreover, in the present embodiment, the exposure region has the total sum of the length of the side of 170 μm, width of 5 μm, and length of 80 μm, but is not limited to this. The total length of the side with fewer particles is preferably 160 μm.

Furthermore, the third higher harmonic wave of the Q-Switch YAG laser is used as the light source for the processing, but the light source is not limited to this, and the fourth higher harmonic wave (wavelength 266 nm) of the Q-Switch YAG laser, pulse laser such as the KrF excimer laser, lamp light, or ion or electron beam may also be used.

Additionally, in the present embodiment, the processing of the spun on carbon film has been described, but the present invention is not limited to this, and can also be applied to another material.

Moreover, the energy density per pulse was set to 0.35 J/cm²/pulse in the present embodiment, but is not limited to this. The energy density per pulse is set to the value at which the satisfactory patterning is possible without any defect, and thereby a similar effect can be obtained.

Furthermore, in the present embodiment, a rectangular region (FIG. 84A) is used as the slit-shaped irradiation region, but the region is not limited to this. For example, the region may have shapes shown in FIGS. 84B to 84D. In this case, the total sum of lengths of sides in the present embodiment corresponds to a contour length.

It is to be noted that the method of the present embodiment can also be applied to the processing methods described in the 23rd to 25th embodiments. That is, the contour length of the exposure region (processing unit) is preferably set to 180 μm or less.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A processing method for selectively exposing a whole first region of a film formed on a substrate, comprising:

relatively scanning a first exposure light whose shape on the substrate is smaller than the whole first region against the whole first region to selectively expose the first region; and exposing a whole second region to be exposed inside the whole first region with a second exposure light to selectively expose the whole second region, wherein exposing with at least one of the first exposure light and the second exposure light is performed with the corresponding exposure region being immersed in a flowing liquid, and the liquid on a surface of the substrate flows in an antiparallel direction against the scan direction of the first exposure light when the first region is exposed with the first exposure light, and the liquid on the surface of the substrate flows in a parallel direction against the scan direction of the first exposure light and in an antiparallel direction against the scan direction of the second exposure light when the second region is exposed with the second exposure light.

2. The processing method according to claim 1, wherein a shape of the first exposure light on the substrate comprises a slit or dot shape.

3. The processing method according to claim 2, further comprising: periodically scanning a plurality of the first exposure light along a scan direction.

4. The processing method according to claim 1, further comprising: relatively scanning the first exposure light against the whole first region on the substrate from one end to another end of the first region.

5. The processing method according to claim 1, wherein the exposing comprises:
relatively scanning the first exposure light against the whole first region on the substrate to one end of the first region from a first start point set in the first region; and
relatively scanning the second exposure light against the whole second region on the substrate to another end of the second region from a second start point set between the first start point and one end.

6. The processing method according to claim 1, further comprising: relatively scanning the second exposure light, having an exposure shape on the substrate smaller than the whole second region, against the whole second region.

7. The processing method according to claim 6, wherein the exposure shape of the second exposure light on the substrate comprises a slit or dot shape.

8. The processing method according to claim 7, further comprising: periodically scanning a plurality of the second exposure light along a scan direction.

9. The processing method according to claim 6, further comprising: relatively scanning the second exposure light against the whole second region on the substrate from one end of the whole second region.

10. The processing method according to claim 6, further comprising: relatively scanning the second exposure light against the substrate from one end to another end of the whole second region; and
relatively scanning the second exposure light against the whole second region on the substrate to another end of the whole second region from a second start point set between the first start point and one end.

11. The processing method according to claim 10, further comprising: scanning the second exposure light in the whole second region to be exposed a plurality of times.

12. The processing method according to claim 6, further comprising: setting an area of the exposure shape of the second exposure light on the substrate to be smaller than that of the exposure shape in a middle portion, when the position of the second exposure light approaches the end of the whole second region to be exposed.

13. The processing method according to claim 6, further comprising:
reducing a scan speed of the second exposure light, when the position of the second exposure light approaches the end of the whole second region to be exposed.

14. The processing method according to claim 1, further comprising:
collectively exposing the whole second region to be exposed with the second exposure light one or more times.

15. The processing method according to claim 1, further comprising: setting a deviation of a focal position of the second exposure light to be smaller than that of the first exposure light, or setting an image forming magnification of the second exposure light on the substrate to be smaller than that of the first exposure light on the substrate.

16. The processing method according to claim 1, wherein the film to be exposed is formed above an alignment mark, and the whole first region to be exposed comprises a region above which the alignment mark is formed.

17. The processing method according to claim 16, wherein the film to be exposed is a stacked film of an anti-reflection film and resist film.

18. The processing method according to claim 16, further comprising:
processing the film;
exposing an alignment mark with a first energy ray, detecting position information of the alignment mark from a reflected first energy ray; and
exposing a resist film with a second energy ray to form a desired latent image pattern on the resist film based on the position information.

19. The processing method according to claim 1, wherein the film to be exposed comprises a polyimide film, organic insulating film, silicon nitride film, or silicon carbide film.

20. A processing method according to claim 1, further comprising:
passing the liquid through the whole first region to be exposed at a flow velocity V (μm/sec);
exposing the whole first region to be exposed through which the liquid flows with an energy ray having an oscillation frequency Z (1/sec) and a width W (μm) of a direction in which the liquid flows; and
controlling the flow velocity V, width W, and oscillation frequency Z so as to satisfy the following relation:

$$V \geq 6 \times \sqrt{\frac{W}{2}} \times Z,$$

thereby selectively removing or reducing the whole first region to be exposed.

21. A processing method according to claim 1, further comprising:
exposing the exposure region with an energy ray whose exposure shape on the substrate is smaller than the whole first region to be exposed on conditions of an oscillation frequency f(1/sec) and energy density per pulse, on which an organic film formed on the substrate can be removed; and
relatively scanning the exposure region against the whole first region to be exposed on the substrate at a speed v (μm/sec),
wherein the oscillation frequency f and speed v satisfy the following relation:

$$6.0 \times 10^{-5} \leq \frac{v}{f^2} \leq 1.0 \times 10^{-3},$$

thereby selectively removing or reducing the whole first region to be exposed of the organic film.

22. The processing method according to claim 21, wherein a length of the exposure shape in a relative movement direction of the exposure position of the energy ray is not less than 2 μm and not more than 20 μn.

* * * * *

UNITED STATES PATENT AND TRADEMARK OFFICE
CERTIFICATE OF CORRECTION

PATENT NO. : 7,288,466 B2
APPLICATION NO. : 10/436972
DATED : October 30, 2007
INVENTOR(S) : Takeishi et al.

Page 1 of 1

It is certified that error appears in the above-identified patent and that said Letters Patent is hereby corrected as shown below:

Claim 22, column 64, line 64, change "20 µn" to --20 µm--.

Signed and Sealed this

Eighth Day of April, 2008

JON W. DUDAS
*Director of the United States Patent and Trademark Office*